US012142815B2

(12) United States Patent
Jo et al.

(10) Patent No.: US 12,142,815 B2
(45) Date of Patent: Nov. 12, 2024

(54) ELECTRONIC DEVICE COMPRISING ANTENNA MODULE

(71) Applicant: Samsung Electronics Co., Ltd., Gyeonggi-do (KR)

(72) Inventors: Jaehoon Jo, Gyeonggi-do (KR);
Eunseok Hong, Gyeonggi-do (KR);
Dongyeon Kim, Gyeonggi-do (KR);
Sehyun Park, Gyeonggi-do (KR);
Jungje Bang, Gyeonggi-do (KR);
Myunghun Jeong, Gyeonggi-do (KR);
Jehun Jong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 415 days.

(21) Appl. No.: 17/528,720

(22) Filed: Nov. 17, 2021

(65) Prior Publication Data

US 2022/0077566 A1    Mar. 10, 2022

Related U.S. Application Data

(63) Continuation of application No. PCT/KR2020/006451, filed on May 15, 2020.

(30) Foreign Application Priority Data

May 17, 2019    (KR) .......................... 10-2019-0058108

(51) Int. Cl.
*H01Q 1/24*      (2006.01)
*H01Q 1/22*      (2006.01)
(Continued)

(52) U.S. Cl.
CPC ........... *H01Q 1/2283* (2013.01); *H01Q 1/243* (2013.01); *H04M 1/0247* (2013.01); *H05K 1/0243* (2013.01); *H05K 1/14* (2013.01)

(58) Field of Classification Search
CPC .... H01Q 1/2283; H01Q 1/243; H01Q 9/0407; H01Q 21/08; H01Q 1/38; H01Q 1/46;
(Continued)

(56) References Cited

U.S. PATENT DOCUMENTS 7,692,590 B2    4/2010  Floyd et al.
8,525,737 B2    9/2013  Rho et al.
(Continued)

FOREIGN PATENT DOCUMENTS

JP    2003-087022    3/2003
JP    2003-309483    10/2003
(Continued)

OTHER PUBLICATIONS

Korean Office Action dated May 10, 2023 issued in counterpart application No. 10-2019-0058108, 16 pages.

*Primary Examiner* — Jean B Jeanglaude
(74) *Attorney, Agent, or Firm* — The Farrell Law Firm, P.C.

(57) ABSTRACT

An electronic device is provided, which includes a housing; a first plate placed on the front side of the housing; a second plate placed on the rear side of the housing; and an antenna module arranged between the first plate and the second plate. The antenna module includes a first PCB; a second PCB having a material different from that of the first PCB and at least partially coupled to one surface of the first PCB in an overlap area; a first conductive line included in the first PCB; a second conductive line included in the second PCB; a first conductive pattern arranged on the second PCB and connected to the second conductive line; a first connection member for connecting the first conductive line and the second conductive line in the overlap area; and a second connection member for coupling the first PCB and the second PCB in the overlap area.

15 Claims, 41 Drawing Sheets

(51) Int. Cl.
*H04M 1/02* (2006.01)
*H05K 1/02* (2006.01)
*H05K 1/14* (2006.01)

(58) Field of Classification Search
CPC .. H01Q 13/206; H04M 1/0247; H04M 1/026; H04M 1/0277; H05K 1/0243; H05K 1/14; H05K 2201/10098; H05K 1/0221; H05K 1/0222; H05K 1/147
USPC .......................................................... 343/702
See application file for complete search history.

(56) References Cited

U.S. PATENT DOCUMENTS

| | | | |
|---|---|---|---|
| 9,825,357 | B2 | 11/2017 | Parsche |
| 11,152,686 | B2 | 10/2021 | Shin et al. |
| 2016/0055948 | A1 | 2/2016 | Yosui |
| 2017/0214121 | A1 | 7/2017 | Ganchrow et al. |
| 2018/0191072 | A1 | 7/2018 | Apostolos et al. |
| 2018/0227960 | A1 | 8/2018 | Belghoul et al. |
| 2018/0240762 | A1 | 8/2018 | Kamgaing et al. |
| 2018/0269561 | A1* | 9/2018 | Kim .......................... H01Q 1/48 |
| 2020/0163204 | A1 | 5/2020 | Kim et al. |
| 2021/0280964 | A1 | 9/2021 | Hong |

FOREIGN PATENT DOCUMENTS

| | | |
|---|---|---|
| KR | 1020100120661 | 11/2010 |
| KR | 1020110025547 | 3/2011 |
| KR | 10-1604759 | 3/2016 |
| KR | 1020160108225 | 9/2016 |
| KR | 1020190021770 | 3/2019 |
| KR | 1020200057962 | 5/2020 |
| KR | 1020200092122 | 8/2020 |

* cited by examiner

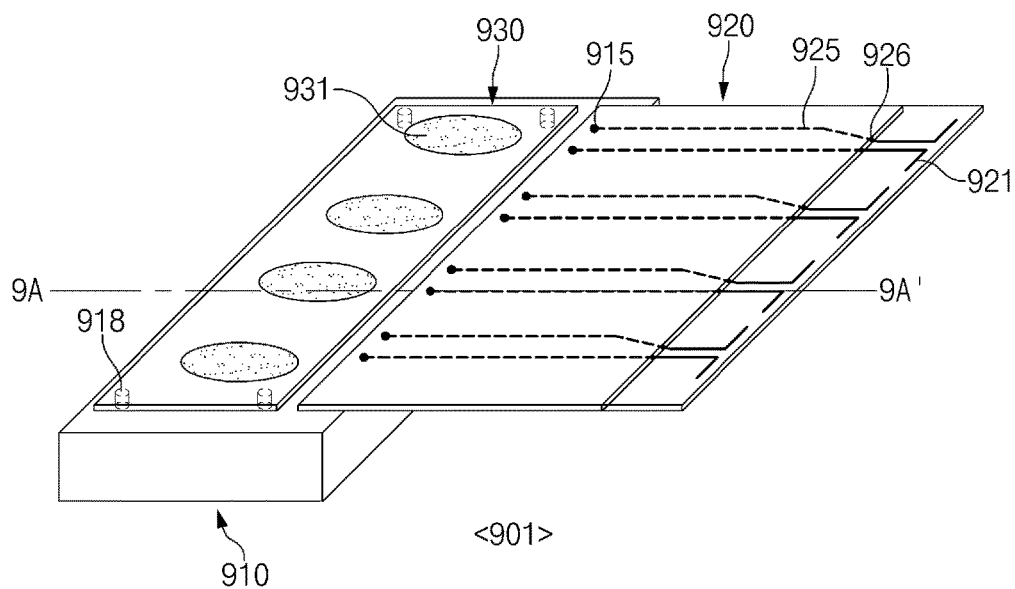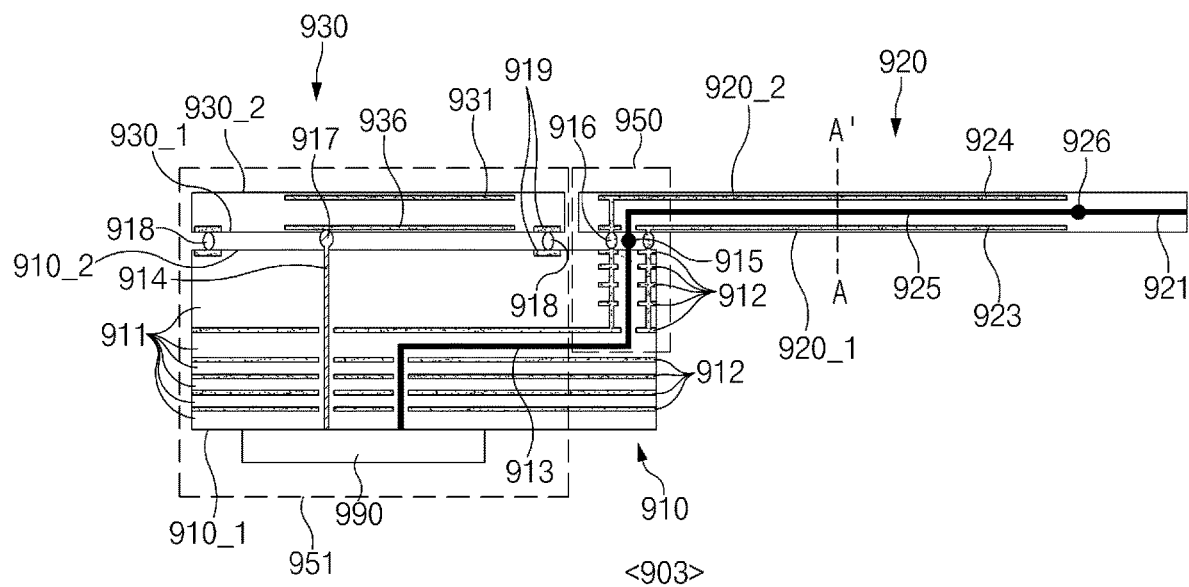
FIG.9A

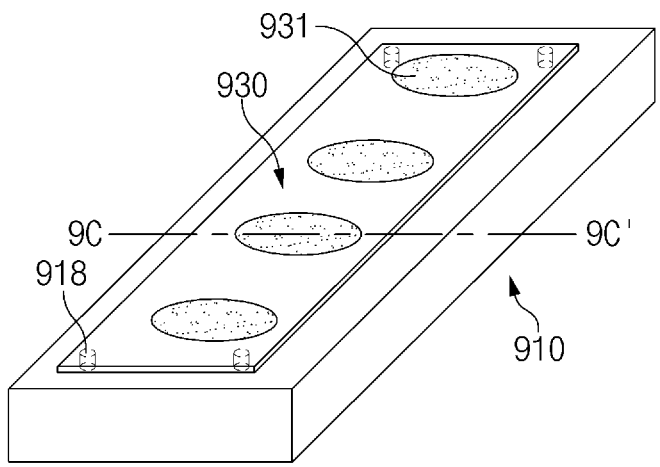
<905>
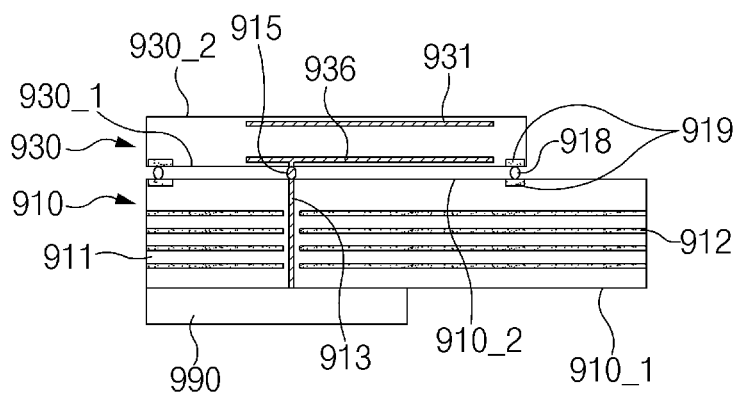
<907>
FIG.9C

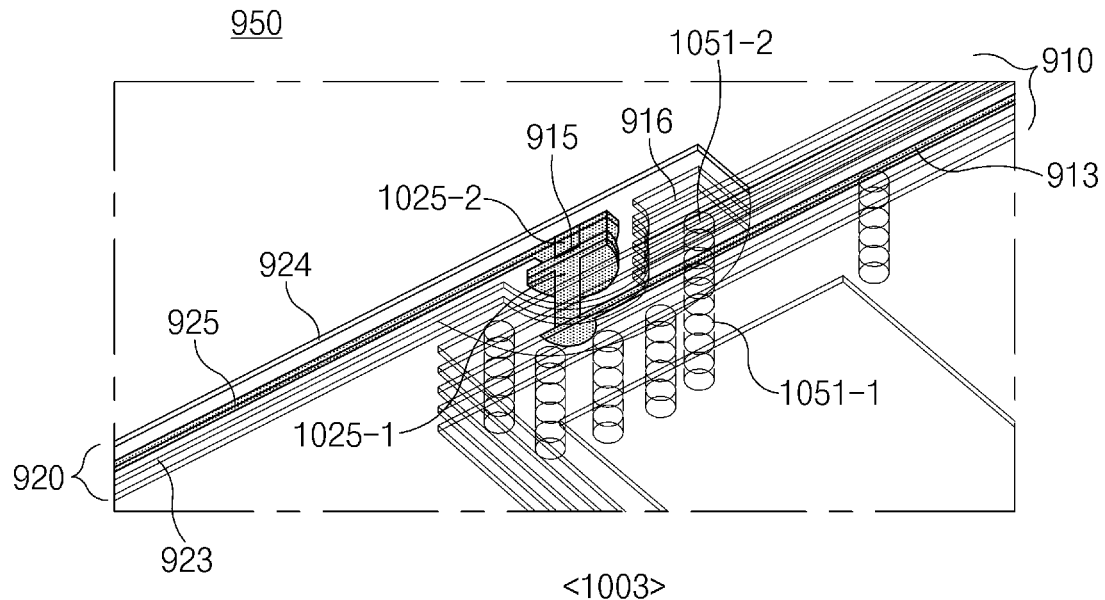
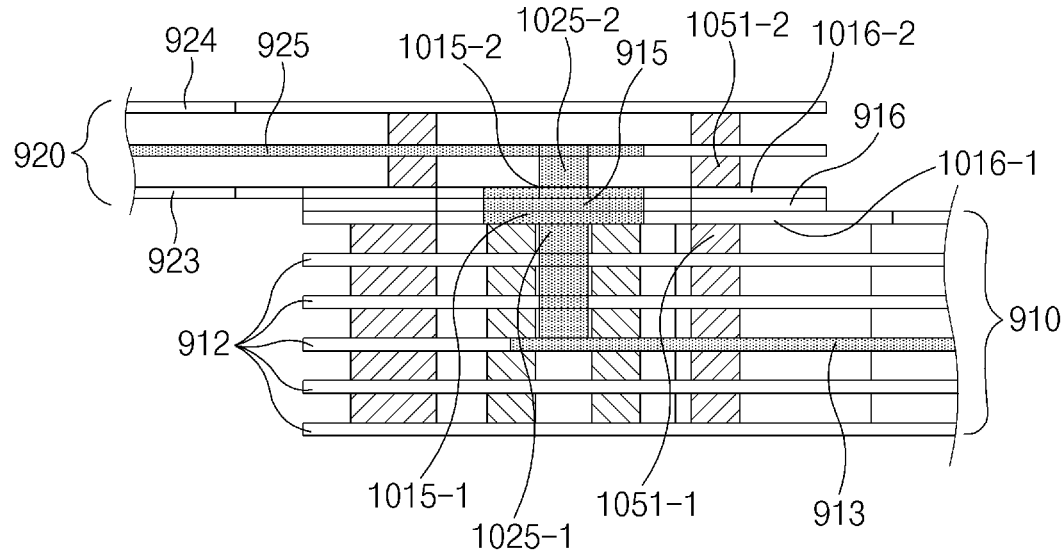
FIG. 10D

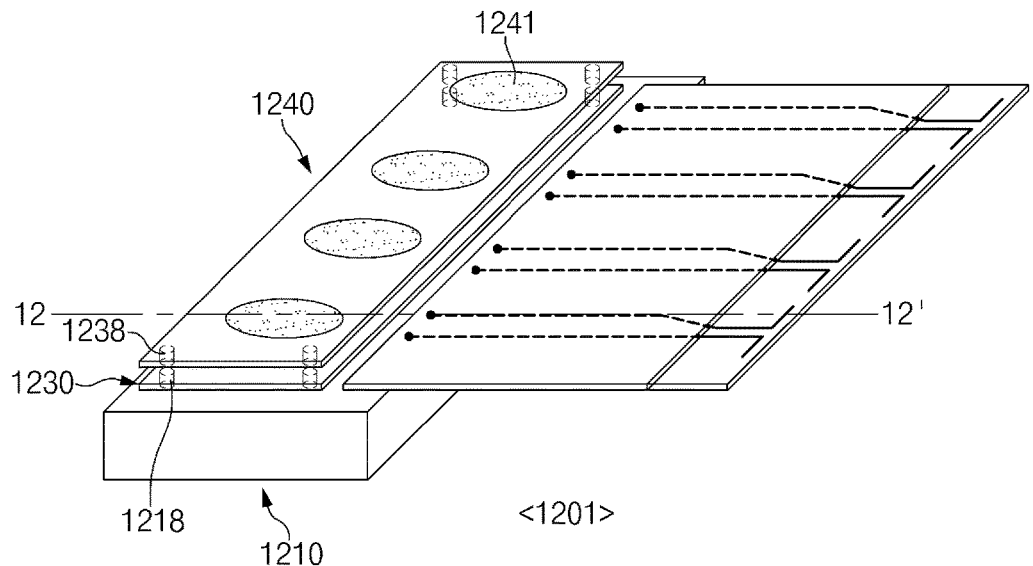
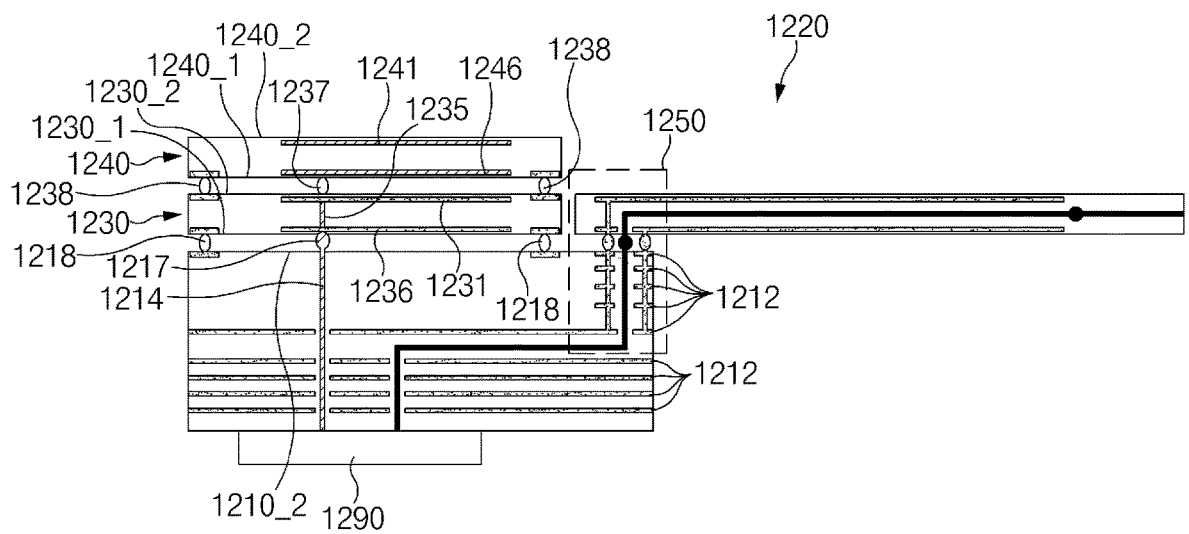
FIG.12

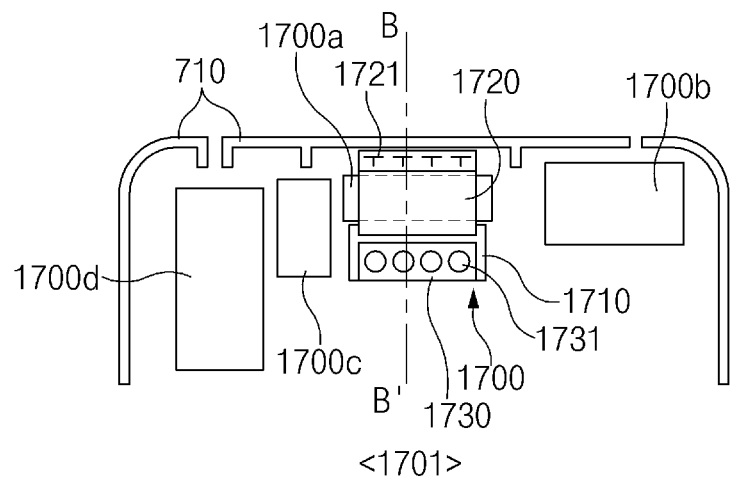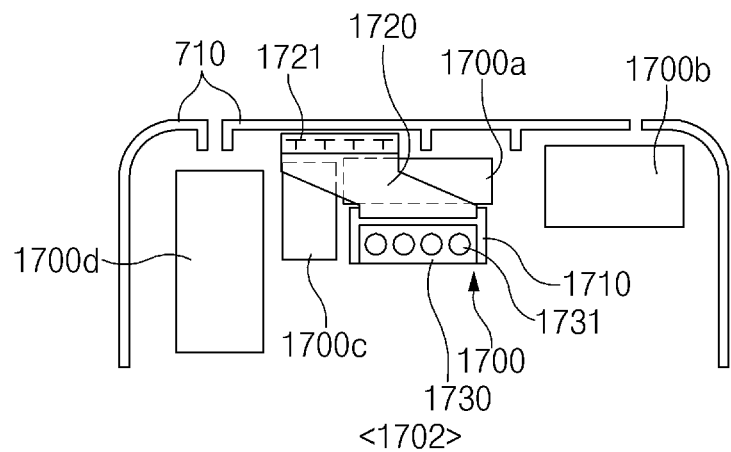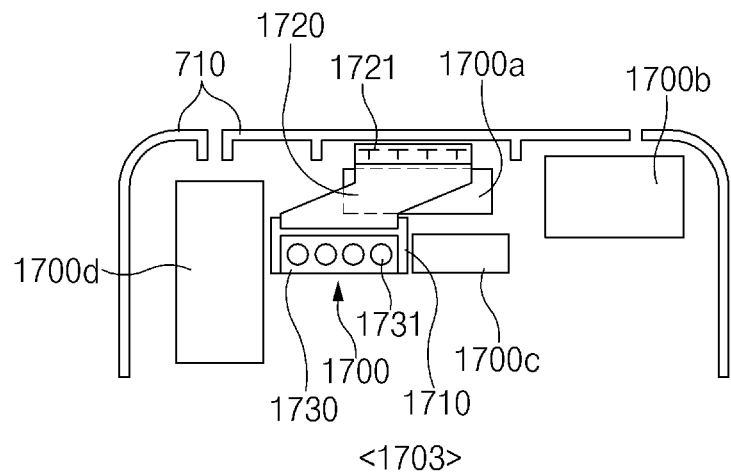
FIG. 17A

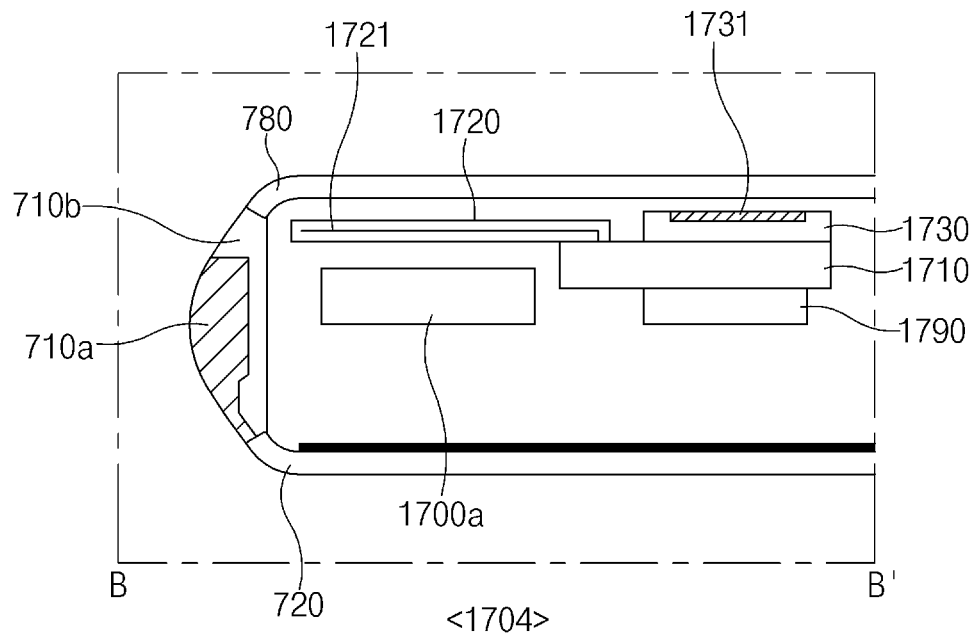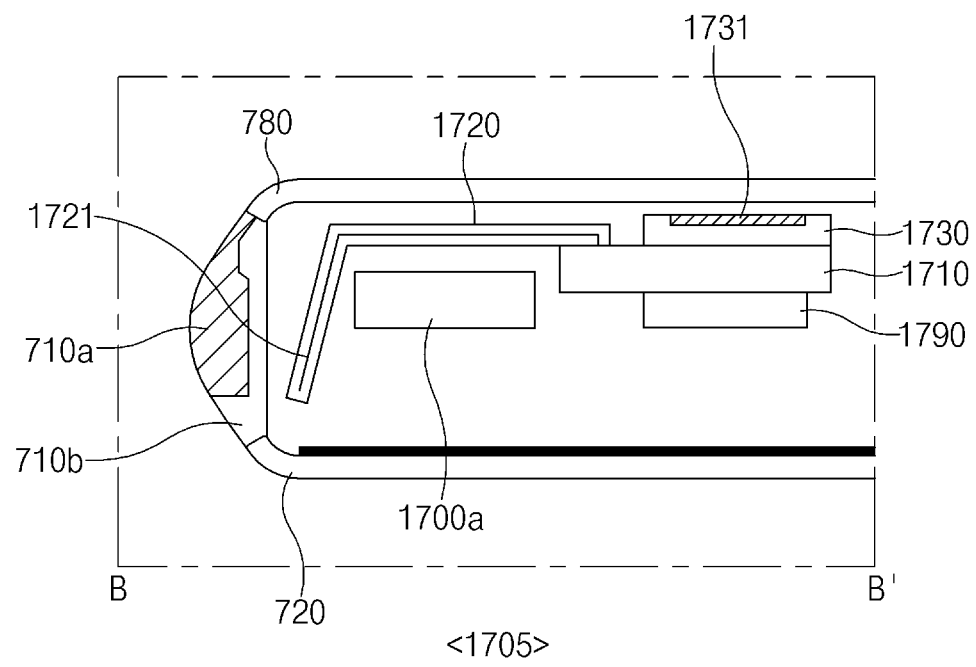
FIG.17B

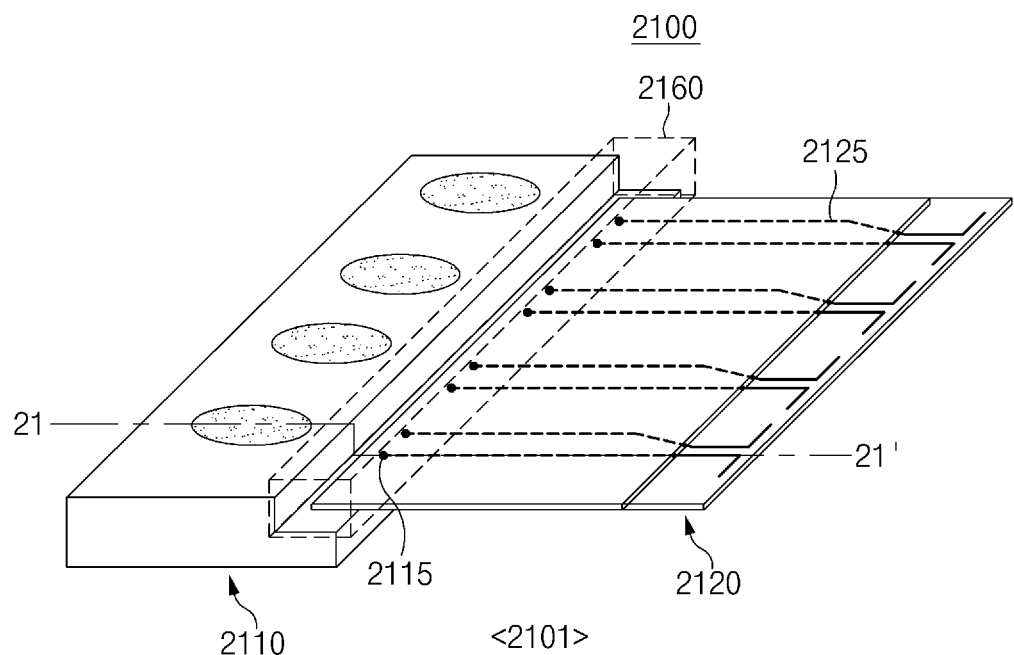
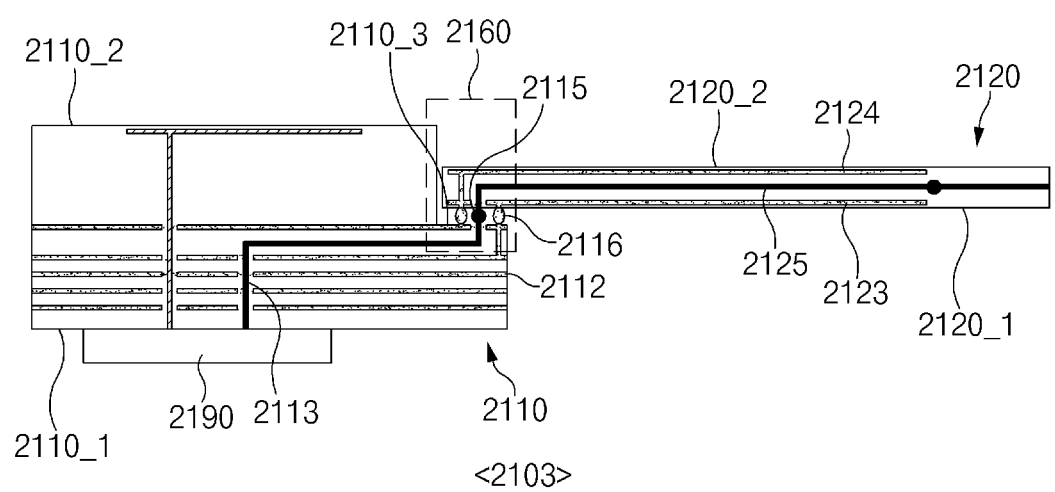
FIG.21

ELECTRONIC DEVICE COMPRISING ANTENNA MODULE

CROSS-REFERENCE TO RELATED APPLICATIONS

This application is a Bypass Continuation Application of International Application No. PCT/KR2020/006451, which was filed on May 15, 2020, and is based on and claims priority under 35 U.S.C. § 119 to Korean Patent Application No. 10-2019-0058108, which was filed in the Korean Intellectual Property Office on May 17, 2019, the entire disclosure of each of which is incorporated herein by reference.

BACKGROUND

1. Field

The disclosure relates generally to an electronic device including an antenna module, and more particularly, to an electronic device including an antenna module in which a rigid PCB (PCB) and a flexible PCB (FPCB) are coupled.

2. Description of the Related Art

With the sharp increase of mobile traffic, next-generation communication technology (e.g., 5th generation (5G) or wireless gigabit alliance (WiGig)) based on a high frequency band of 20 GHz or more is being developed. A signal in a high frequency band may include a millimeter wave having a frequency band ranging from 20 GHz to 300 GHz. Because a wavelength of the signal in the high frequency band is relatively short, an antenna and an electronic device that use the signal in the high frequency band may be miniaturized and/or more lightweight.

A short wavelength of a frequency signal in a high band may also allow relatively many antennas to be mounted in the same area of the electronic device. However, because the directivity of radio waves becomes stronger and the propagation path loss seriously increases, a propagation characteristic of such an antenna may be degraded.

In a conventional antenna module, an antenna radiator part and a logic part may be manufactured in one PCB. In this case, because a shape of the antenna module is fixed, it may be difficult to mount the antenna module in different shaped electronic devices. Also, even under the same mounting conditions, the design and manufacture of the antenna module may be individually required due to the use of multiple frequencies or various physical properties of the electronic devices. Consequently, the process of manufacturing the antenna module is often inefficient.

SUMMARY

An aspect of the disclosure is to provide an electronic device including an antenna module capable of providing a stable signal radiation characteristic under various mounting conditions, wherein the antenna module includes a rigid PCB and an FPCB that are coupled together.

An aspect of the disclosure is to provide an antenna module including a rigid PCB and an FPCB that are coupled to each other, such that the antenna module may be disposed at a location where an antenna signal radiation characteristic is capable of being optimized, by disposing some antennas at the FPCB.

In accordance with an aspect of the disclosure, an electronic device is provided, which includes a housing, a first plate positioned on a front surface of the housing, a second plate positioned on a back surface of the housing, and an antenna module disposed between the first plate and the second plate. The antenna module may include a first PCB, a second PCB having a material different from that of the first PCB, at least a portion of the second PCB being coupled to one surface of the first PCB in an overlapping region, a first conductive line included in the first PCB, a second conductive line included in the second PCB, a first conductive pattern disposed at the second PCB and connected with the second conductive line, a first connection member configured to connect the first conductive line and the second conductive line, in the overlapping region, and a second connection member configured to couple the first PCB and the second PCB, in the overlapping region.

In accordance with another aspect of the disclosure, an electronic device is provided, which includes a housing including a first plate, a second plate facing away from the first plate, and a side member surrounding a space between the first plate and the second plate, and an antenna module disposed within the housing. The antenna module may include a first PCB, a second PCB having a material different from that of the first PCB, at least a portion of the second PCB being coupled to one surface of the first PCB in a first overlapping region, and a third PCB, at least a portion of which is coupled to the one surface of the first PCB in a second overlapping region. The first PCB may include a first conductive line connected with the second PCB, and a second conductive line connected with the third PCB. A first conductive pattern disposed at the second PCB may be connected with the first conductive line through a first connection member disposed in the first overlapping region. A second conductive pattern disposed at the third PCB may be connected with the second conductive line through a second connection member disposed in the second overlapping region. The first PCB and the second PCB may be coupled by at least one third connection member disposed to surround a periphery of the first connection member. The first PCB and the third PCB may be coupled by at least one fourth connection member disposed in the second overlapping region.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9A illustrates an antenna module including a coupling structure of a first PCB and a second PCB according to an embodiment;

FIG. 9C illustrates an antenna module including a coupling structure of a first PCB and a third PCB according to an embodiment;

FIG. 10D illustrates a peripheral part of the connection member of FIG. 9A, according to an embodiment;

FIG. 12 illustrates an antenna module including a coupling structure of a first PCB and a second PCB according to an embodiment;

FIG. 17A illustrates an antenna module according disposed in an electronic device according to an embodiment;

FIG. 17B illustrates a cross-section view taken along line 17a-17a' in FIG. 17A, according to an embodiment;

FIG. 21 illustrates an antenna module including a coupling structure of a first PCB and a second PCB according to an embodiment;

DETAILED DESCRIPTION

Hereinafter, various embodiments of the disclosure are described with reference to the accompanying drawings. Those of ordinary skill in the art will recognize that modification, equivalent, and/or alternative on the various embodiments described herein can be variously made without departing from the scope and spirit of the disclosure.

Figure 1:
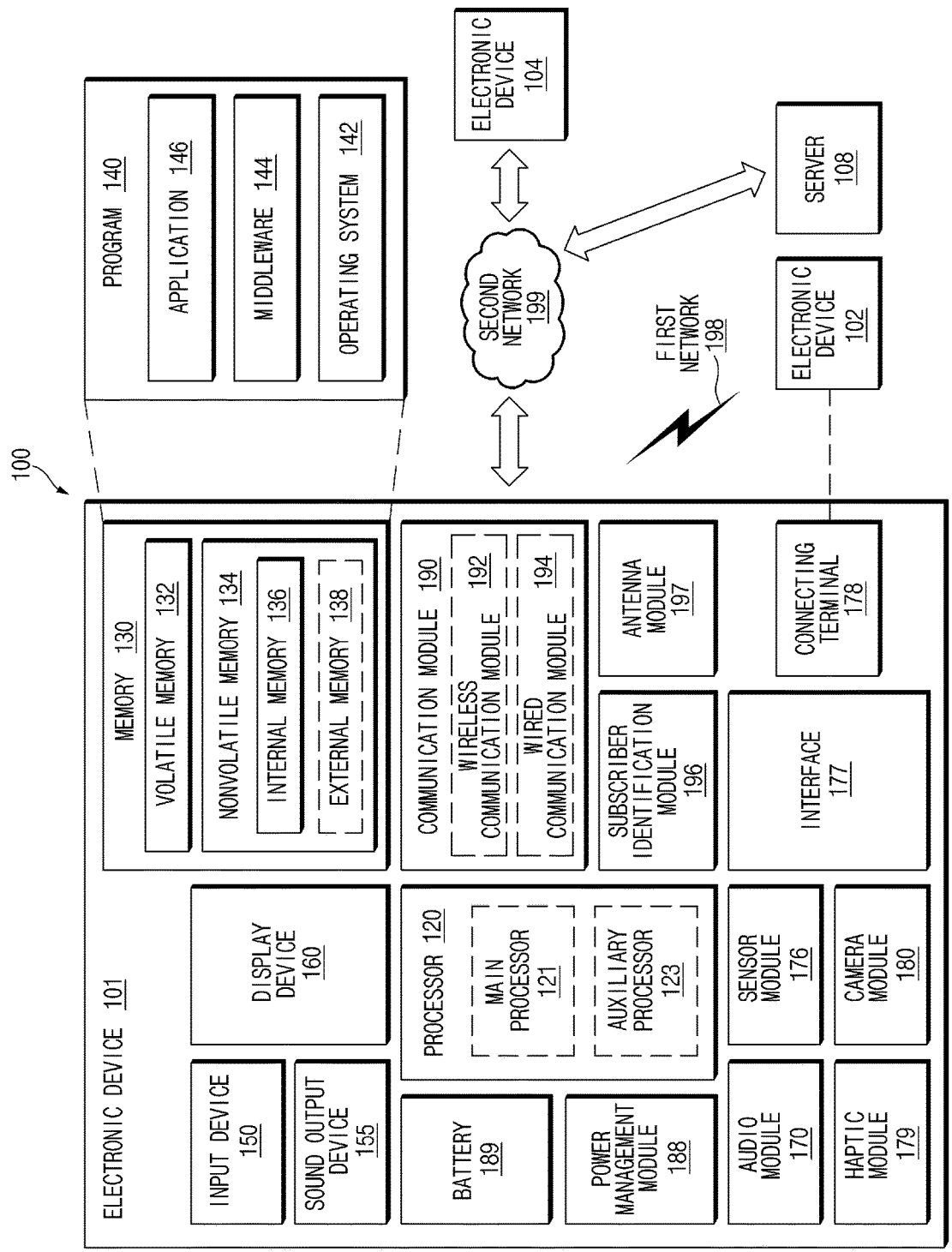
FIG. 1 illustrates an electronic device in a network environment according to an embodiment.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102) (e.g., speaker of headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or IR data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, when the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
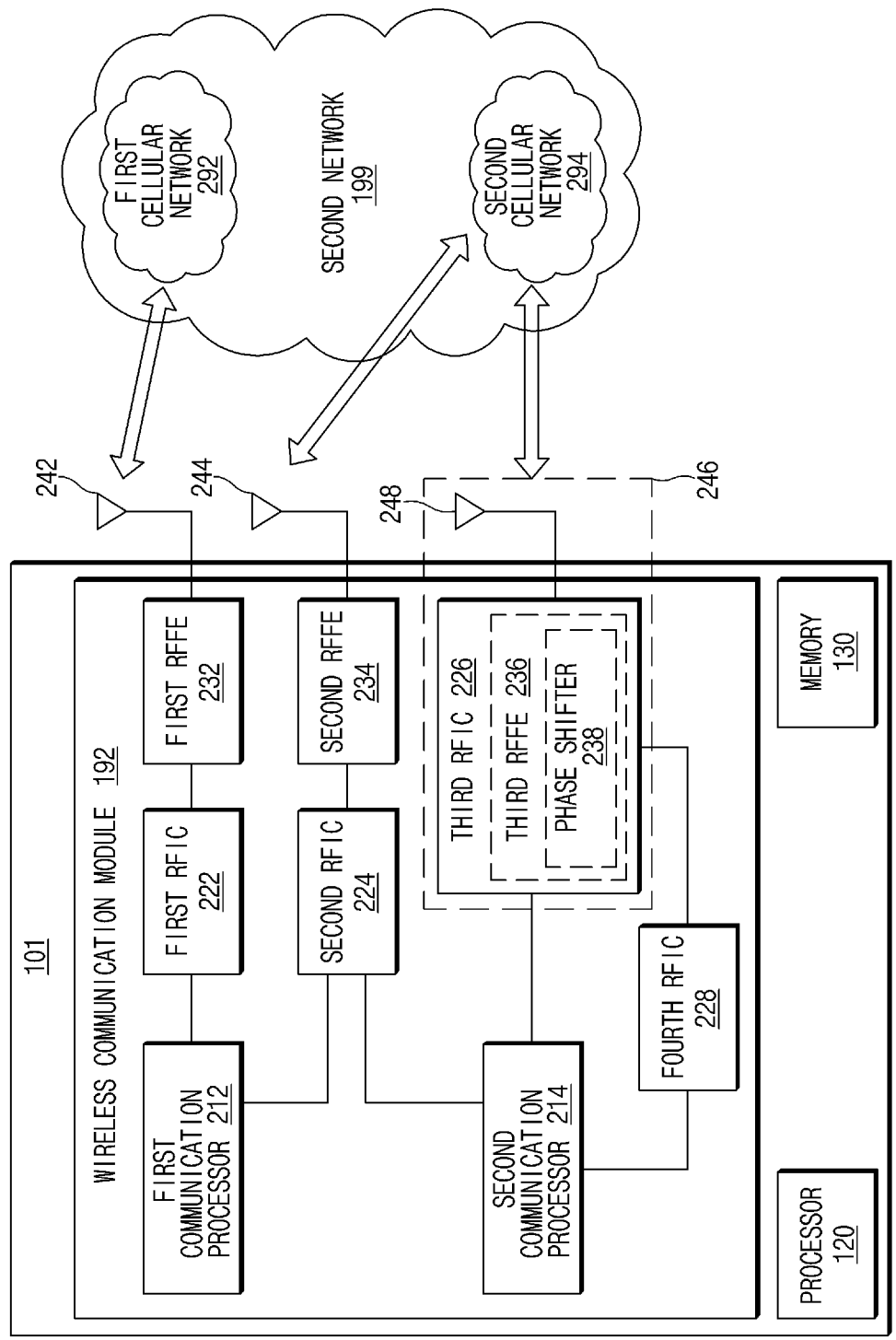
FIG. 2 illustrates an electronic device supporting legacy network communication and 5G network communication, according to an embodiment.

FIG. 2 illustrates an electronic device supporting legacy network communication and 5G network communication, according to an embodiment.

Referring to FIG. 2, the electronic device 101 includes a first CP 212, a second CP 214, a first RFIC 222, a second RFIC 224, a third RFIC 226, a fourth RFIC 228, a first radio frequency front end (RFFE) 232, a second RFFE 234, a first antenna module 242, a second antenna module 244, an antenna 248, a processor 120, and a memory 130. The network 199 includes a first cellular network 292 and a second cellular network 294. Alternatively, the electronic device 101 may include at least one additional component, and the network 199 may also include at least another network. Additionally, the first CP 212, the second CP 214, the first RFIC 222, the second RFIC 224, the fourth RFIC 228, the first RFFE 232, and the second RFFE 234 form at least a part of a wireless communication module 192. Alternatively, the fourth RFIC 228 may be omitted or may be included as a part of the third RFIC 226.

The first CP 212 may establish a communication channel for a band to be used for wireless communication with the first cellular network 292 and may support legacy network communication through the established communication channel. The first network may be a legacy network including a $2^{nd}$ generation (2G), $3^{rd}$ generation (3G), 4th generation (4G), or long term evolution (LTE) network. The second CP 214 may support the establishment of a communication channel corresponding to a specified band (e.g., about 6 GHz to about 60 GHz) among bands to be used for wireless communication with the second cellular network 294 and may support 5G network communication via the established communication channel. The second cellular network 294 may be a 5G network defined in the 3GPP.

The first CP 212 or the second CP 214 may establish a communication channel for a specified band (e.g., about 6 GHz or lower) of the bands to be used for wireless communication with the second cellular network 294 and may support 5G network communication through the established communication channel. The first CP 212 and the second CP 214 may be implemented in a single chip or a single package. Additionally, the first CP 212 or the second CP 214 may be implemented in a single chip or a single package together with the processor 120, the auxiliary processor 123, or the communication module 190.

When transmitting a signal, the first RFIC 222 may convert a baseband signal generated by the first CP 212 into a radio frequency (RF) signal of about 700 MHz to about 3 GHz that is used in the first cellular network 292. When receiving a signal, an RF signal may be obtained from the first cellular network 292 (e.g., a legacy network) through first antenna module 242 and may be pre-processed through the first RFFE 232. The first RFIC 222 may convert the pre-processed RF signal into a baseband signal to be processed by the first CP 212.

When transmitting a signal, the second RFIC 224 may convert a baseband signal generated by the first CP 212 or the second CP 214 into an RF signal (hereinafter referred to as a "5G Sub6 RF signal") in a Sub6 band (e.g., about 6 GHz or lower) used in the second cellular network 294 (e.g., a 5G network). When receiving a signal, the 5G Sub6 RF signal may be obtained from the second cellular network 294 through the second antenna module 244 and may be pre-processed through the second RFFE 234. The second RFIC 224 may convert the pre-processed 5G Sub6 RF signal into a baseband signal to be processed by the first CP 212 or the second CP 214.

The third RFIC 226 may convert a baseband signal generated by the second CP 214 into an RF signal (hereinafter referred to as a "5G Above6 RF signal") in a 5G Above6 band (e.g., about 6 GHz to about 60 GHz) to be used in the second cellular network 294 (e.g., a 5G network). When receiving a signal, the 5G Above6 RF signal may be obtained from the second cellular network 294 through the antenna 248 and may be pre-processed through a third RFFE 236. The third RFFE 236 may perform pre-processing of the signal by using a phase shifter 238. The third RFIC 226 may convert the pre-processed 5G Above6 RF signal into a baseband signal to be processed by the second CP 214. The third RFFE 236 may be implemented as a part of the third RFIC 226.

The electronic device 101 includes the fourth RFIC 228 independently of the third RFIC 226 or as at least a part of the third RFIC 226. In this case, the fourth RFIC 228 may convert a baseband signal generated by the second CP 214 into an RF signal in an intermediate frequency (IF) band (hereinafter referred to as an "IF signal") (e.g., ranging from about 9 GHz to about 11 GHz) and may provide the IF signal to the third RFIC 226. The third RFIC 226 may convert the IF signal into the 5G Above6 RF signal. When receiving a signal, the 5G Above6 RF signal may be received from the second cellular network 294 through the antenna 248 and may be converted into an IF signal by the third RFIC 226. The fourth RFIC 228 may convert the IF signal into a baseband signal to be processed by the second CP 214.

The first RFIC 222 and the second RFIC 224 may be implemented with a part of a single package or a single chip. The first RFFE 232 and the second RFFE 234 may be implemented as a part of a single package or a single chip. Alternatively, at least one of the first antenna module 242 or the second antenna module 244 may be omitted or may be combined with any other antenna module to process RF signals in a plurality of bands.

The third RFIC 226 and the antenna 248 may be disposed at the same substrate to form a third antenna module 246. For example, the wireless communication module 192 or the processor 120 may be disposed on a first substrate (e.g., a main PCB). The third RFIC 226 may be disposed in a partial region (e.g., on a lower surface) of a second substrate (e.g., a sub PCB) independent of the first substrate, and the antenna 248 may be disposed in another partial region (e.g., on an upper surface) of the second substrate. As such, the third antenna module 246 may be formed. The antenna 248 may include an antenna array to be used for beamforming.

As the third RFIC 226 and the antenna 248 are disposed at the same substrate, it may be possible to decrease a length of a transmission line between the third RFIC 226 and the antenna 248. For example, the decrease in the transmission line may prevent a signal in a high frequency band (e.g., about 6 GHz to about 60 GHz) used for the 5G network communication from being lost (or attenuated) due to the transmission line. As such, the electronic device 101 improves the quality or speed of communication with the second cellular network 294.

The second cellular network 294 may be used independently of the first cellular network 292 (e.g., a legacy network) (e.g., this scheme being called "stand-alone (SA)") or may be used while being connected with the first cellular network 292 (e.g., this scheme being called "non-SA (NSA)"). For example, only an access network (e.g., a 5G radio access network (RAN) or a next generation RAN (NG RAN)) may be present in the 5G network, and a core network (e.g., a next generation core (NGC)) may be absent from the 5G network. In this case, the electronic device 101 may access the access network of the 5G network and may then access an external network (e.g., the Internet) under control of a core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in a memory 130 and may be accessed by another component (e.g., the processor 120, the first CP 212, or the second CP 214).

Figure 3:
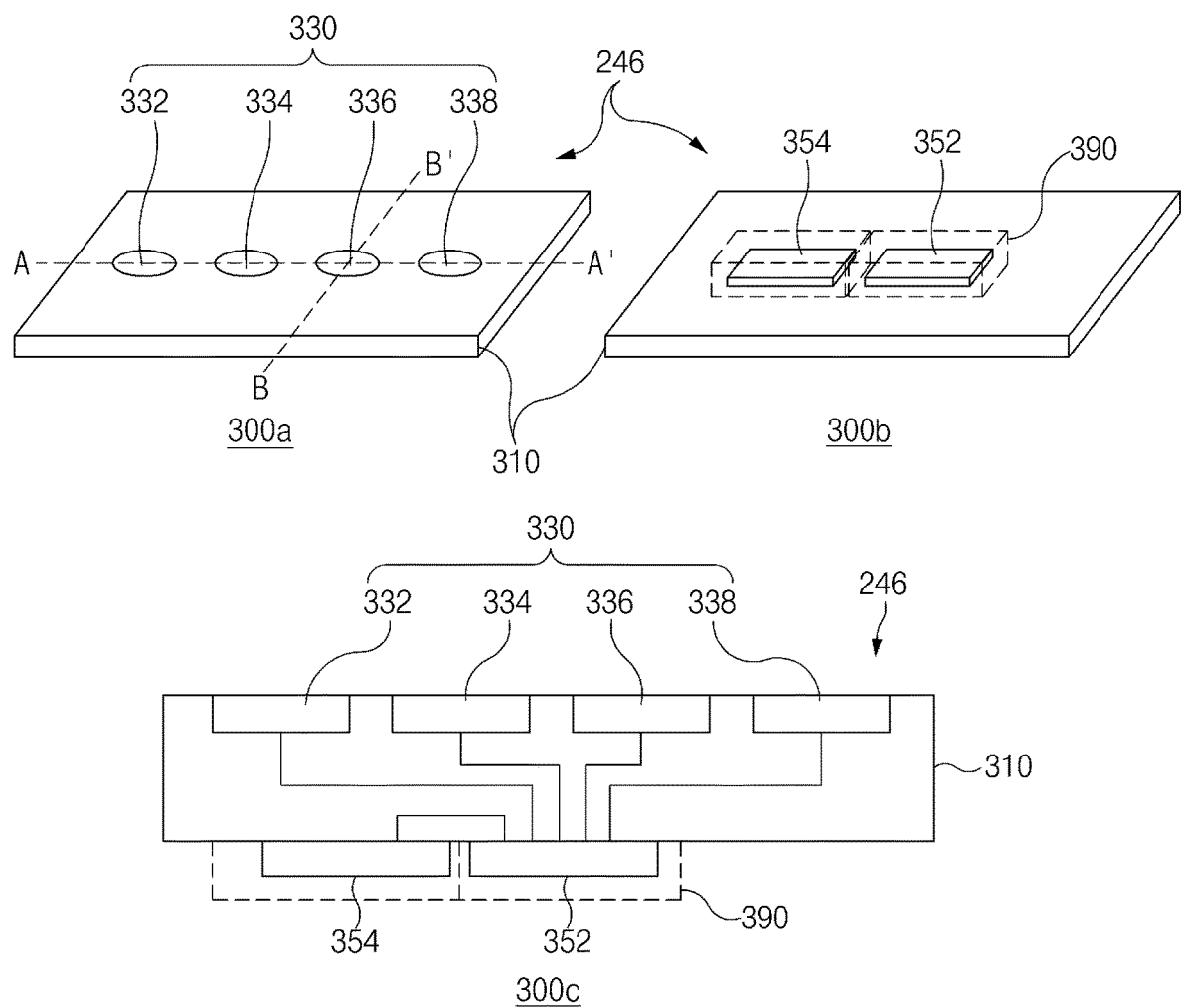
FIG. 3 illustrates a third antenna module described of FIG. 2, according to an embodiment.

FIG. 3 illustrates the third antenna module 246 of FIG. 2, according to an embodiment. In FIG. 3, reference numeral 300a indicates a perspective view of the third antenna module 246 when viewed from one side, 300b indicates a perspective view of the third antenna module 246 when viewed from another side, and reference numeral 300c indicates a cross-sectional view of the third antenna module 246 taken along a line A-A'.

Referring to FIG. 3, the third antenna module 246 includes a PCB 310, an antenna array 330, an RFIC 352, a PMIC 354, and a module interface. Selectively, the third antenna module 246 may further include a shielding member 390. Alternatively, at least one of the above components may be omitted, or at least two of the components may be integrally formed.

The PCB 310 may include a plurality of conductive layers and a plurality of non-conductive layers, and the conductive layers and the non-conductive layers may be alternately stacked. The PCB 310 may provide an electrical connection between the PCB 310 and/or various electronic components disposed thereon by using wires and conductive vias formed in the conductive layers.

The antenna array 330 includes a plurality of antenna elements 332, 334, 336, and 338 disposed to form a directional beam. The antenna elements 332, 334, 336, and 338 may be formed on a first surface of the PCB 310 as illustrated, or may be formed within the PCB 310. The antenna array 330 may include a plurality of antenna arrays (e.g., a dipole antenna array and/or a patch antenna array), of which shapes or kinds are identical or different.

The RFIC 352 may be disposed on another region (e.g., a second surface facing away from the first surface) of the PCB 310 to be spaced from the antenna array. The RFIC 352 may be configured to process a signal in a selected frequency band, which is transmitted/received through the antenna array 330. When transmitting a signal, the RFIC 352 may convert a baseband signal obtained from a CP into an RF signal in a specified band. When receiving a signal, the RFIC 352 may convert an RF signal received through the antenna array 330 into a baseband signal and may provide the baseband signal to the CP.

When transmitting a signal, the RFIC 352 may up-convert an IF signal (e.g., about 9 GHz to about 11 GHz) obtained from an IF integrated circuit (IFIC) into an RF signal. When receiving a signal, the RFIC 352 may down-convert an RF signal obtained through the antenna array 330 into an IF signal and may provide the IF signal to the IFIC.

The PMIC 354 may be disposed in another region (e.g., on the second surface) of the PCB 310, which is spaced from the antenna array. The PMIC may be supplied with a voltage from a main PCB and may provide a power for various components (e.g., the RFIC 352) above the third antenna module 246.

The shielding member 390 may be disposed at a portion (e.g., on the second surface) of the PCB 310 such that at least one of the RFIC 352 or the PMIC 354 is electromagnetically shielded. The shielding member 390 may include a shield can.

Although not illustrated, in various embodiments, the third antenna module 246 may be electrically connected with another PCB (e.g., a main circuit board) through the module interface. The module interface may include a connection member, e.g., a coaxial cable connector, a board to board connector, an interposer, or an FPCB. The RFIC 352 and/or the PMIC 354 of the antenna module may be electrically connected with the PCB 310 through the connection member.

Figure 4:
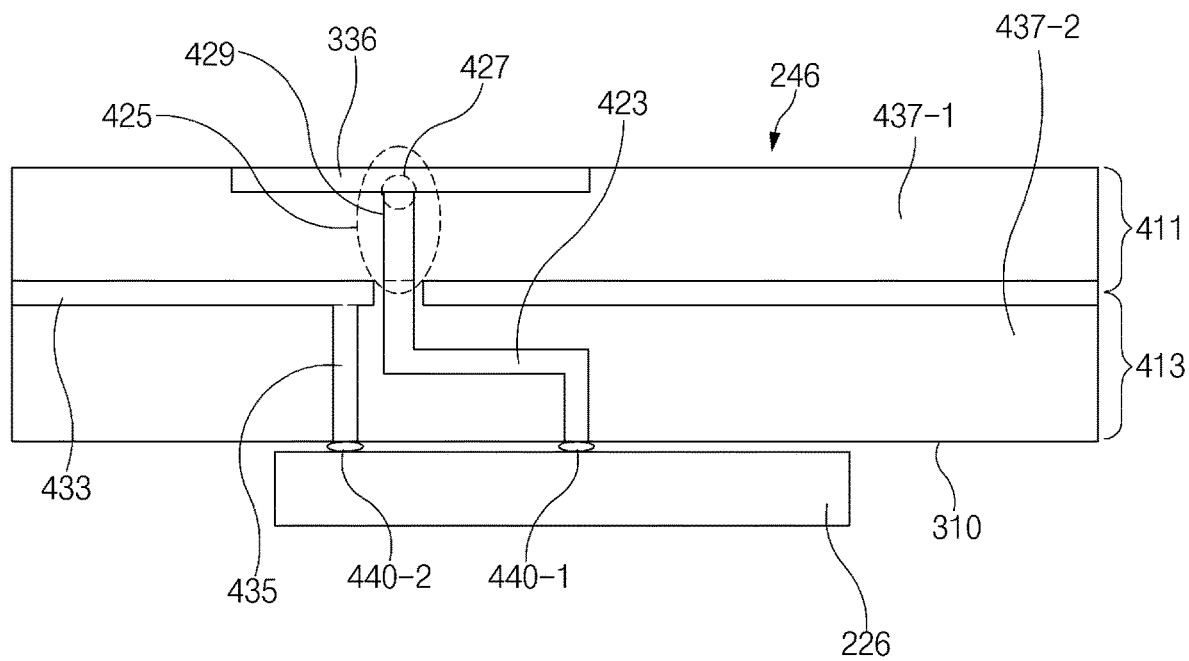
FIG. 4 illustrates a cross section of the third antenna module of FIG. 3, taken along line B-B' of 300*a*, according to an embodiment.

FIG. 4 illustrates a cross section of the third antenna module 246 taken along line B-B' of FIG. 3, according to an embodiment.

Referring to FIG. 4, the PCB 310 includes an antenna layer 411 and a network layer 413.

The antenna layer 411 includes at least one dielectric layer 437-1, and an antenna element 336 and/or a feeding part 425 formed on an outer surface of the dielectric layer 437-1 or therein. The feeding part 425 includes a feeding point 427 and/or a feeding line 429.

The network layer 413 includes at least one dielectric layer 437-2 and at least one ground layer 433, at least one conductive via 435, a transmission line 423, and/or a signal line 429 formed on an outer surface of the dielectric layer 437-2 or therein.

The third RFIC 226 of FIG. 3 may be electrically connected with the network layer 413, for example, through first and second connection parts (e.g., solder bumps) 440-1 and 440-2. Various connection structures (e.g., soldering or a ball grid array (BGA)) may also be used.

The third RFIC 226 may be electrically connected with the antenna element 336 through the first connection part 440-1, the transmission line 423, and the feeding part 425. The third RFIC 226 may be electrically connected with the ground layer 433 through the second connection part 440-2 and the conductive via 435. Although not illustrated, the third RFIC 226 may also be electrically connected with the above module interface through the signal line 429.

Figure 5:
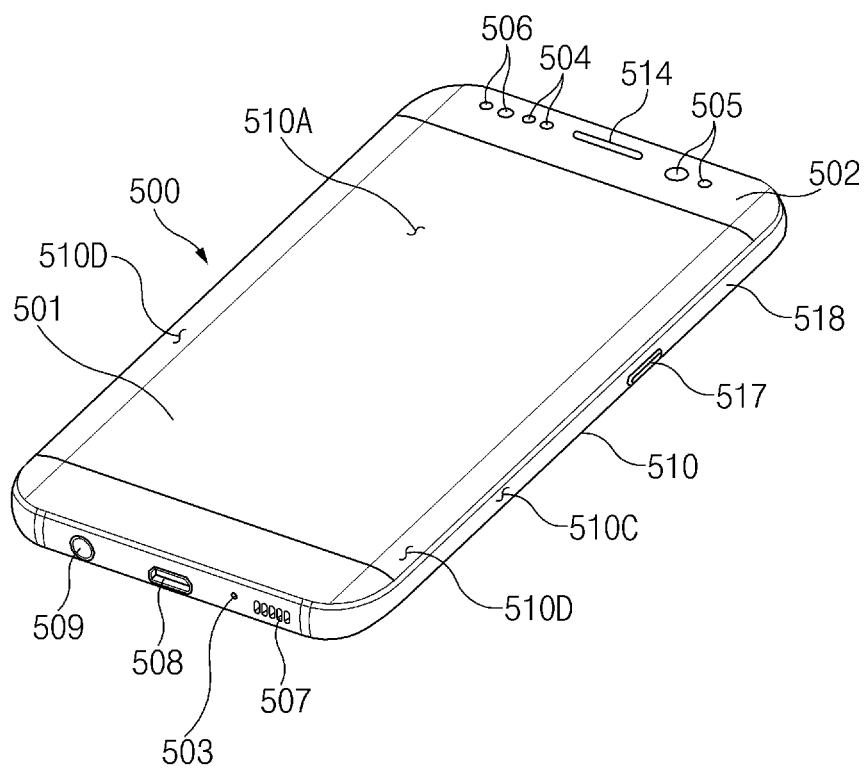
FIG. 5 illustrates a mobile electronic device according to an embodiment.
Figure 6:
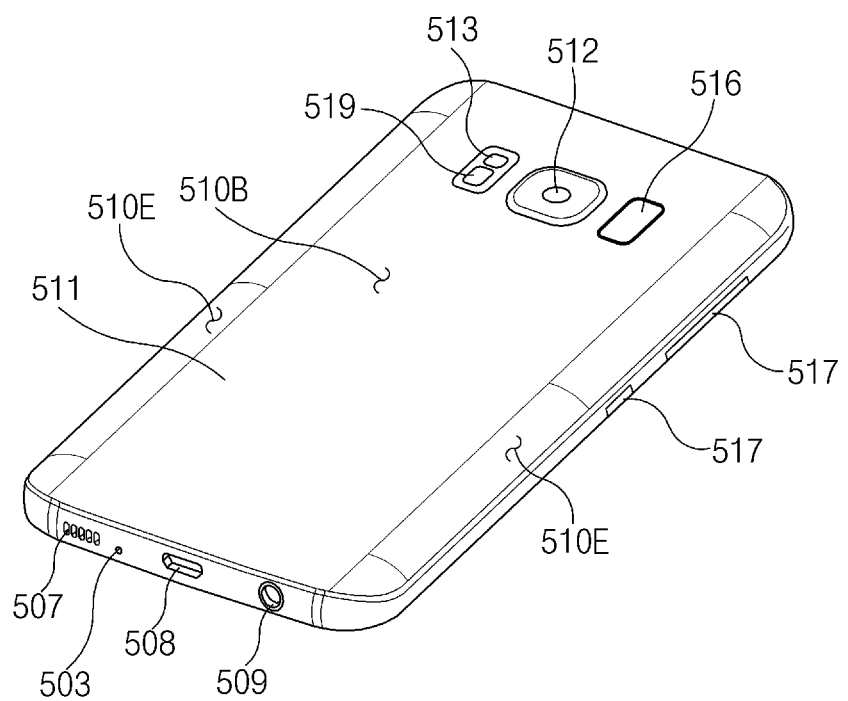
FIG. 6 illustrates a rear perspective view of the electronic device of FIG. 5, according to an embodiment.

FIG. 5 illustrates a mobile electronic device according to an embodiment. FIG. 6 illustrates a rear perspective view of the electronic device of FIG. 5, according to an embodiment.

Referring to FIGS. 5 and 6, an electronic device 500 includes a housing 510 including a first surface (or a front surface) 510A, a second surface (or a back surface) 510B, and a side surface 510C surrounding a space between the first surface 510A and the second surface 510B. The housing may be referred to as a "structure" that forms a part of the first surface 510A, the second surface 510B, and the side surface 510C of FIG. 5. The first surface 510A may be implemented with a front plate 502 (e.g., a glass plate including various coating layers, or a polymer plate), at least a portion of which is substantially transparent. The second surface 510B may be formed by a back plate 511 that is substantially opaque. The back plate 511 may be formed of a coated or colored glass, a ceramic, a polymer, a metal (e.g., aluminum, stainless steel (STS), or magnesium), or a combination of at least two of the materials. The side surface 510C may be coupled to the front plate 502 and the back plate 511, and may be formed by a side bezel structure (or a "side member") 518 including a metal and/or a polymer. The back plate 511 and the side bezel structure 518 may be integrally formed and may include the same material (e.g., a metal material such as aluminum).

The front plate 502 includes two first regions 510D, which are bent toward the back plate 511 from the first surface 510A so as to be seamlessly extended, at opposite long edges of the front plate 502.

As illustrated in FIG. 6, the back plate 511 includes two second regions 510E, which are bent toward the front plate 502 from the second surface 510B so as to be seamlessly extended, at opposite long edges thereof.

Alternatively, the front plate 502 (or the back plate 511) may include only one of the first regions 510D (or the second regions 510E), that is, some of the first regions 510D or the second regions 510E may not be included.

When viewed from one side of the electronic device 500, the side bezel structure 518 may have a first thickness (or width) on one side where the first regions 510D or the second regions 510E are not included, and may have a second thickness on one side where the first regions 510D or the second regions 510E are included. The second thickness may be smaller than the first thickness.

The electronic device 500 includes a display 501, an audio module (503, 507, or 514), a sensor module (504, 516, or 519), a camera module (505, 512, or 513), key input devices 517, a light-emitting device 506, and a connector hole (508 or 509). Alternatively, the electronic device 500 may omit at least one of the components (e.g., the key input devices 517 or the light-emitting device 506) or may further include any other component.

The display 501 may be exposed through a considerable portion of the front plate 502. At least a portion of the display 501 may be exposed through the front plate 502 the first surface 510A and the first regions 510D of the side surface 510C. A corner of the display 501 may be formed to be mostly identical to a shape of an outer portion of the front plate 502 adjacent thereto. To increase the area where the display 501 is exposed, a distance between an outer portion of the display 501 and an outer portion of the front plate 502 may be formed mostly identically.

A recess or an opening may be defined in a portion of a screen display region of the display 501, and at least one or more of the audio module 514, the sensor module 504, the camera module 505, and the light-emitting device 506 may be provided to be aligned with the recess or the opening. At least one or more of the audio module 514, the sensor module 504, the camera module 505, the fingerprint sensor 516, and the light-emitting device 506 may be provided on a back surface of the display 501, which corresponds to the screen display region.

The display 501 may be coupled to a touch sensing circuit, a pressure sensor capable of measuring the intensity (or pressure) of a touch, and/or a digitizer capable of detecting a magnetic stylus pen or may be disposed adjacent thereto. In an embodiment, at least a part of the sensor module (504 and/or 519) and/or at least a part of the key input devices 517 may be disposed in the first regions 510D and/or the second regions 510E.

The audio modules (503, 507, and 514) may include a microphone hole 503 and speaker holes 507 and 514. A microphone for obtaining external sound may be disposed within the microphone hole 503. A plurality of microphones may be disposed to detect a direction of sound. The speaker holes 507 and 514 may include an external speaker hole 507 and a receiver hole 514 for a call. The speaker holes 507 and 514 and the microphone hole 503 may be implemented with one hole, or a speaker (e.g., a piezoelectric speaker) may be included without the speaker holes 507 and 514.

The sensor modules 504, 516, and 519 may generate an electrical signal or a data value that corresponds to an internal operation state of the electronic device 500 or corresponds to an external environment state. The sensor modules 504, 516, and 519 may include a first sensor module 504 (e.g., a proximity sensor) and/or a second sensor module (e.g., a fingerprint sensor) disposed on the first surface 510A of the housing 510, and/or the third sensor module 519 (e.g., a hear rate monitor (HRM) sensor) and/or the fourth sensor module 516 (e.g., a fingerprint sensor) disposed on the second surface 510B of the housing 510. The fingerprint sensor may be disposed on the second surface 510B as well as the first surface 510A (e.g., the display 501) of the housing 510. The electronic device 500 may further include a sensor module including at least one of a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or the illumination sensor 504.

The camera modules 505, 512, and 513 may include a first camera device 505 disposed on the first surface 510A of the electronic device 500, and a second camera module 512 and/or a flash 513 disposed on the second surface 510B. The camera devices 505 and 512 may include one or more lenses, an image sensor, and/or an ISP. The flash 513 may include a light-emitting diode (LED) or a xenon lamp. Two or more lenses (e.g., an IR camera, wide-angle lenses, and telephoto lenses) and image sensors may be disposed on one surface of the electronic device 500.

The key input devices 517 may be disposed on the side surface 510C of the housing 510. Alternatively, the electronic device 500 may not include all or part of the above-described key input devices 517 and the key input functionality may be implemented on the display 501 in the form of a soft key. A key input device 517 may include the sensor module 516 disposed on the second surface 510B of the housing 510.

The light-emitting device 506 may be disposed on the first surface 510A of the housing 510. The light-emitting device 506 may provide status information of the electronic device 500 in the form of light, and/or the light-emitting device 506 may provide a light source that operates in conjunction with an operation of the camera module 505. The light-emitting device 506 may include an LED, an IR LED, a xenon lamp, etc.

The connector holes 508 and 509 may include a first connector hole 508 that is capable of accommodating a connector (e.g., a USB connector) for transmitting/receiving a power and/or data with an external electronic device, and/or a second connector hole (e.g., an earphone jack) 509 that is capable of accommodating a connector for transmitting/receiving an audio signal with the external electronic device.

Figure 7:
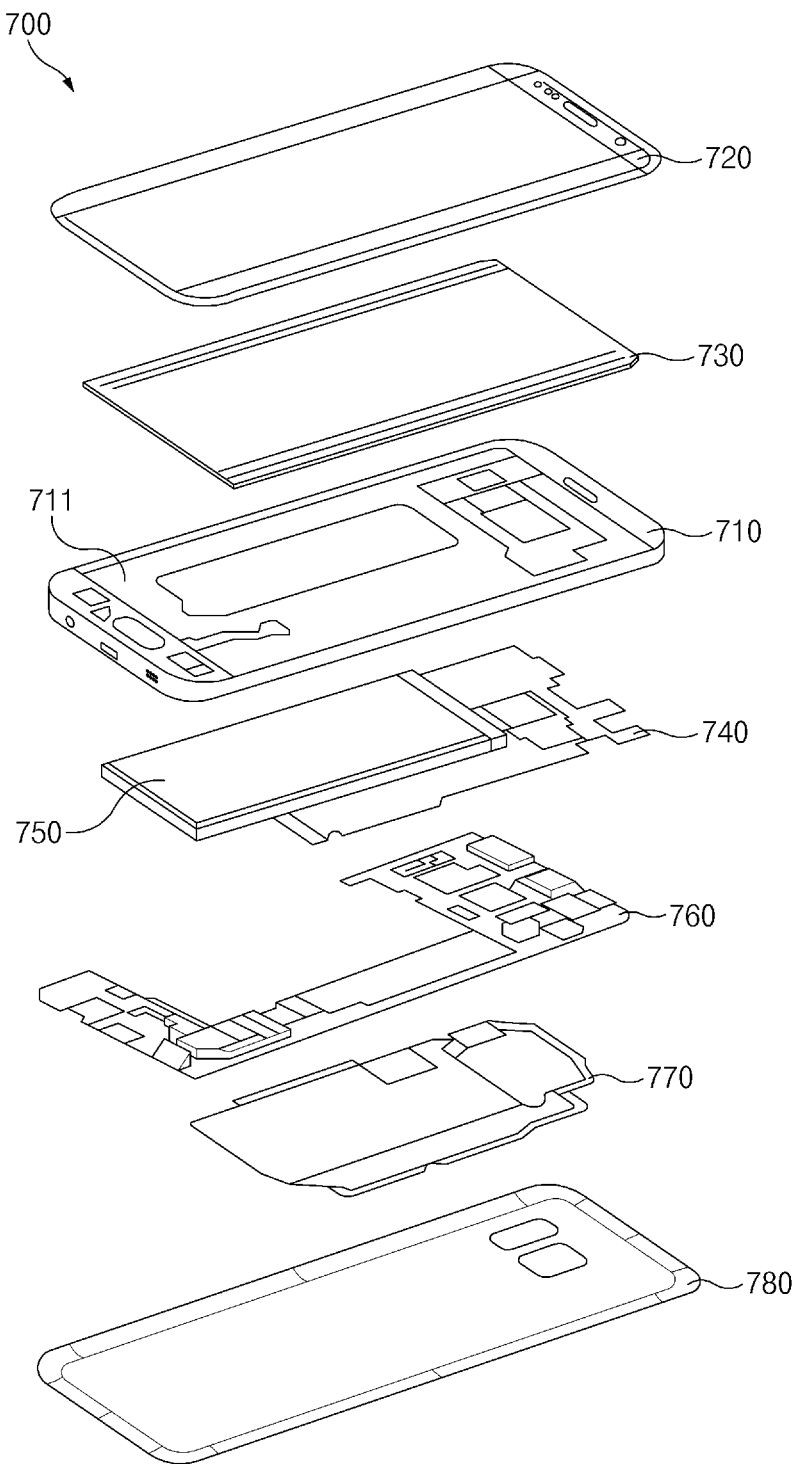
FIG. 7 is an exploded view of an electronic device according to an embodiment.

FIG. 7 is an exploded view of an electronic device according to an embodiment.

Referring to FIG. 7, an electronic device 700 includes a side member 710, a first support member 711 (e.g., a bracket), a front plate 720, a display 730, a PCB 740, a battery 750, a second support member 760 (e.g., a rear case), an antenna 770, and a back plate 780. Alternatively, the electronic device 700 may omit at least one of the illustrated components (e.g., the first support member 711 or the second support member 760) or may further include any other component. At least one of the components of the electronic device 700 may be identical or similar to at least one of the components of the electronic device 500 of FIG. 5 or 6, and thus, additional description will be omitted to avoid redundancy.

The first support member 711 may be disposed within the electronic device 700, may be connected with the side member 710, or may be integrally formed with the side member 710. The first support member 711 may be formed of a metal material and/or a nonmetal material (e.g., polymer).

The display 730 may be coupled to one surface of the first support member 711, and the PCB 740 may be coupled to an opposite surface of the first support member 711. A processor, a memory, and/or an interface may be mounted on the PCB 740. The processor may include one or more of a CPU, an AP, a graphic processing device, an ISP, a sensor hub processor, or a CP.

The memory may include volatile memory and/or non-volatile memory.

The interface may include an HDMI, a USB interface, an SD card interface, and/or an audio interface. The interface may electrically or physically connect the electronic device 700 with an external electronic device and may include a USB connector, an SD card/multimedia card (MMC) connector, or an audio connector.

The battery 750 supplies power to at least one component of the electronic device 700 and may include a primary cell incapable of being recharged, a secondary cell rechargeable, and/or a fuel cell. At least a portion of the battery 750 may be disposed on substantially the same plane as the PCB 740. The battery 750 may be integrally disposed within the electronic device 700 or may be disposed to be removable from the electronic device 700.

The antenna 770 may be interposed between the back plate 780 and the battery 750. The antenna 770 may include a near field communication (NFC) antenna, an antenna for wireless charging, and/or a magnetic secure transmission (MST) antenna. The antenna 770 may perform short range communication with an external device or may wirelessly transmit/receive power for charging. An antenna structure may be formed by a part of the side member 710 and/or the first support member 711, or by a combination thereof.

Figure 8:
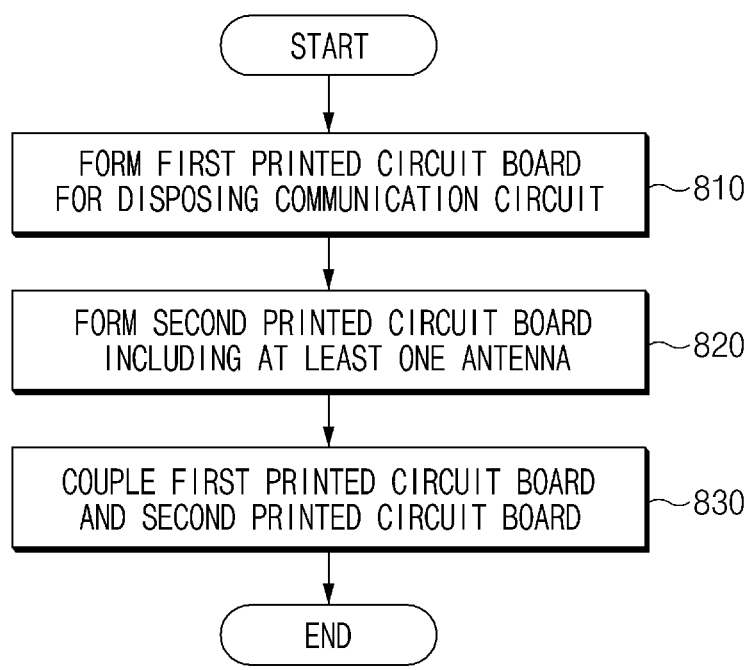
FIG. 8 is a flowchart illustrating a method of manufacturing an antenna module according to an embodiment.

FIG. 8 is a flowchart illustrating a method of manufacturing an antenna module according to an embodiment.

Referring to FIG. 8, in step 810, a first PCB for disposing a communication circuit may be formed. The communication circuit may be disposed on one surface of the first PCB. The communication circuit may include an RFIC.

In step 820, a second PCB including at least one antenna may be formed. In the second PCB, at least a portion of at least one conductive layer may be implemented as an antenna.

In step 830, the first PCB and the second PCB may be connected through a conductive material such as solder. The first PCB may include a first surface and a second surface facing an opposite direction of the first surface. The second PCB may include a third surface and a fourth surface facing an opposite direction of the third surface. A portion of the second surface of the first PCB and a portion of the third surface of the second PCB may be coupled together. The conductive material such as solder may be disposed at an overlapping portion between the second surface and the third surface and may electrically connect the first PCB and the second PCB. The communication circuit may be disposed on the first surface of the first PCB.

After step 820 is performed, step 810 may be performed, or steps 810 and 820 may be performed concurrently. For example, one of the first PCB and the second PCB may be first formed, the other thereof may then be formed, and the first and second PCBs may be coupled together, or the first PCB and the second PCB may be formed and coupled together.

FIG. 9A illustrates an antenna module including a coupling structure of a first PCB and a second PCB according to an embodiment. In FIG. 9A, reference numeral 901 indicates a perspective view of the antenna module 900, and reference numeral 903 indicates a cross-sectional view of the antenna module 900 taken along line 9A-9A'.

Referring to FIG. 9A, an antenna module 900 includes the first PCB 910 and the second PCB 920. The antenna module 900 may be provided in a PCB design manner.

The first PCB 910 (e.g., a rigid PCB) includes at least one insulating layer (or dielectric layer) 911, at least one conductive layer 912, a conductive line 913, and a conductive line 914. The conductive line 913 or the conductive line 914 may be disposed to penetrate some of the at least one insulating layer (or dielectric layer) 911 and the at least one conductive layer 912.

The insulating layer (or dielectric layer) 911 and the conductive layer 912 may be alternately stacked. For example, an operation in which a specific insulating layer (or dielectric layer) 911 is formed, a conductive layer 912 is formed on the specific insulating layer (or dielectric layer) 911, and an insulating layer (or dielectric layer) 911 is again formed on the conductive layer 912 may be repeated as much as the specified number of times. The number of insulating layers (or dielectric layers) 911 and the number of conductive layers 912 may vary.

The second PCB 920 (e.g., an FPCB) may be formed of a material different from that of the first PCB 910. The second PCB 920 includes at least one conductive pattern 921 (e.g., a dipole antenna), at least one feeding part 926, at least one conductive layer 923 or 924, and at least one conductive line 925. The second PCB 920 may be disposed to protrude from the first PCB 910.

At least a portion of the first PCB 910 and at least a portion (e.g., a first overlapping region) of the second PCB 920 may be connected. For example, the first PCB 910 may include the first surface 910_1 and the second surface 910_2 facing away from the first surface 910_1. The second PCB 920 may include the third surface 920_1 and the fourth surface 920_2 facing away from the third surface 920_1. A portion of the second surface 910_2 of the first PCB 910 and a portion of the third surface 920_1 of the second PCB 920 may be coupled together.

In a coupling portion 950, the conductive line 925 may be connected with the conductive line 913 through a connection member 915 (e.g., a solder ball). The conductive layers 923 and 924 may be connected with at least one (e.g., a ground region) of the conductive layers 912 through a connection member 916 (e.g., a solder ball). The conductive layers 923 and 924 may form an electrical shield associated with the conductive line 925. Some of the connection members 916 may not be connected with the ground region and may be formed for coupling of the first PCB 910 and the second PCB 920.

A communication circuit 990 may transmit a communication signal by using the conductive pattern 921. The communication circuit 990 may transmit/receive the communication signal through conductive lines (or feeding lines) 913, 915, 925, and 921.

At least a portion of the first PCB 910 and at least a portion (e.g., a second overlapping region) of a third PCB 930 may be connected. For example, the third PCB 930 may include a fifth surface 930_1 and a sixth surface 930_2 facing away from the fifth surface 930_1. A portion of the second surface 910_2 of the first PCB 910 and a portion of the fifth surface 930_1 of the third PCB 930 may be coupled together. The first PCB 910 and the third PCB 930 may be coupled through at least one connection member 918. At least one dummy pattern 919 that is coupled to the connection member 918 may be disposed on the second surface 910_2 of the first PCB 910 and the fifth surface 930_1 of the third PCB 930. Some of the connection members 918 may be connected with the ground region (e.g., some of the conductive layers 912), or some of the connection members 918 may not be connected with any feeding part or ground region and may be used only for coupling of the first PCB 910 and the third PCB 930 (e.g., used as an adhesive member for adhesion of the first PCB 910 to the third PCB 930).

At least a portion of the third PCB 930 may be formed of the same material as the first PCB 910 (e.g., formed as a rigid PCB). At least a portion of the third PCB 930 may be formed of the same material as the second PCB 920 (e.g., formed as an FPCB).

The third PCB 930 includes a conductive pattern 931 (e.g., a patch antenna) and a conductive pattern 936. The conductive pattern 936 may be connected with the conductive line 914 through a connection member 917. The conductive pattern 936 and the connection member 917 may be connected through an additional conductive line. The conductive pattern 936 may transmit a communication signal from the communication circuit 990 to the conductive pattern 931. The conductive pattern 936 may transmit a communication signal to the conductive pattern 931 through the coupling. Alternatively, the conductive pattern 936 may be directly connected with the conductive pattern 931 through a conductive line and may transmit a communication signal to the conductive pattern 931.

The communication circuit 990 may transmit a communication signal to the conductive pattern 931. The communication circuit 990 may transmit/receive a communication signal through conductive lines (or feeding lines) 914, 917, 936, and 931.

The communication circuit 990 may be disposed on the first surface 910_1 of the first PCB 910. The communication circuit 990 may be connected with the conductive line 913 and the conductive line 914.

Figure 9B:
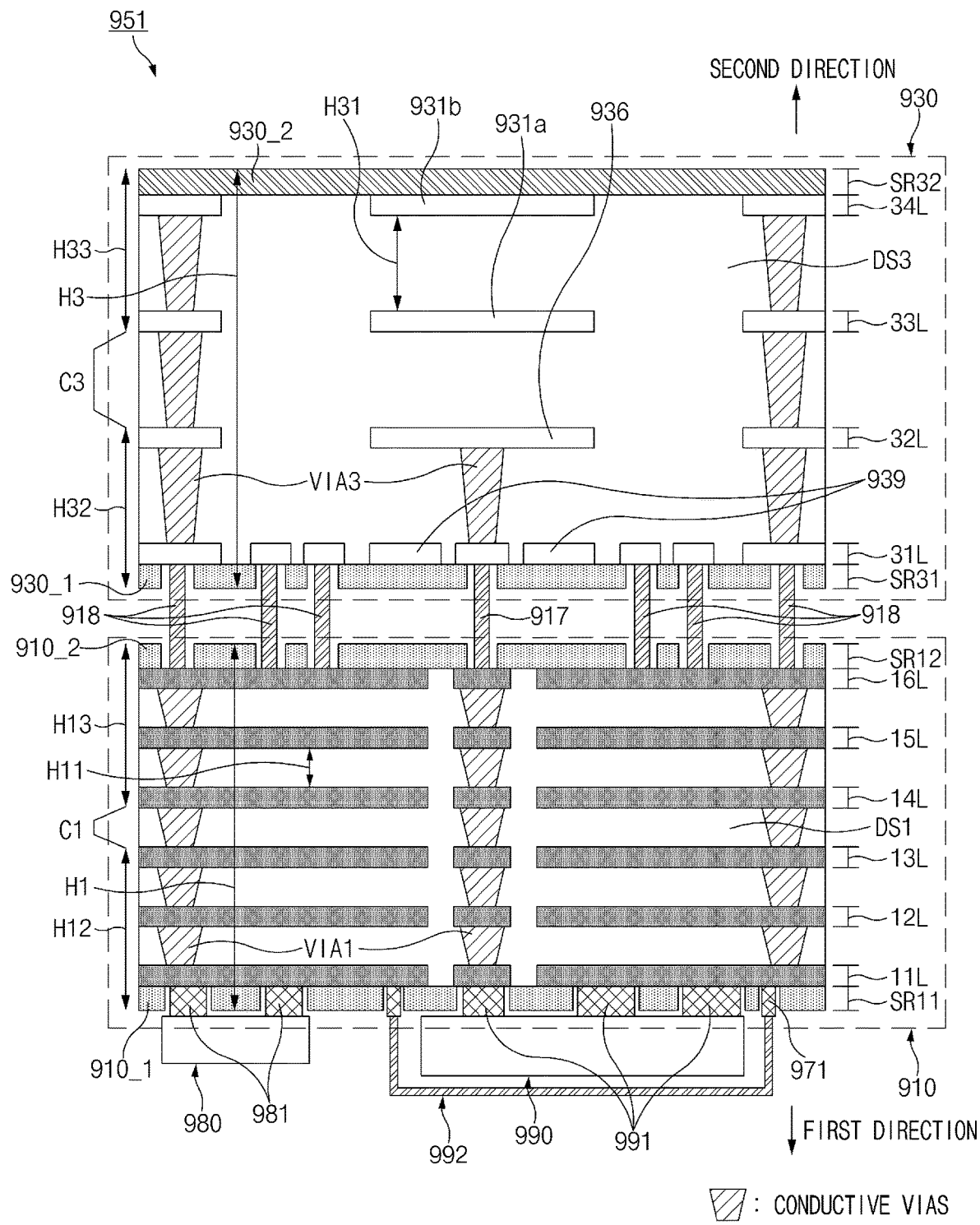
FIG. 9B illustrates a coupling portion of the first PCB and the third PCB of FIG. 9A, according to an embodiment.

FIG. 9B illustrates the coupling portion 951 of the first PCB 910 and the third PCB 930 of FIG. 9A, according to an embodiment.

Referring to FIG. 9B, the first PCB 910 includes conductive layers 11L, 12L, 13L, 14L, 15L, and 16L. A first insulating material (e.g., prepreg) DS1 may be disposed between the conductive layers 11L, 12L, 13L, 14L, 15L, and 16L.

The first PCB 910 may have a structure in which conductive layers of the same number are disposed on opposite sides of a center substrate C1. For example, the first PCB 910 in which conductive layers of the same number are stacked on opposite sides of the center substrate C1 may be formed by a manufacturing method in which an operation of respectively stacking a pair of, i.e., two conductive layers on opposite sides is performed many times. The manufacturing method may prevent a PCB from being damaged (e.g., wrapping or tearing) due to an environment such as a temperature or a pressure applied when manufacturing the PCB.

A distance H11 between the conductive layers 11L, 12L, 13L, 14L, 15L, and 16L may be substantially uniform, and the first PCB 910 may have substantially the same heights (or thicknesses) H12 and H13 on opposite side of the center substrate C1. The first PCB 910 includes a conductive via VIA1 having a connection line for electrically connecting the conductive layers 11L, 12L, 13L, 14L, 15L, and 16L disposed in different layers. The number of conductive layers included in the first PCB 910 is not limited to the example illustrated in FIG. 9B and may vary.

The first PCB 910 includes insulating layers SR11 and SR12 that are formed by applying an insulating material (e.g., a solder mask insulating ink) on the conductive layer 11L and/or the conductive layer 16L. A region of the conductive layer 11L, which is covered by the insulating layer SR11, and a region of the conductive layer 16L, which is covered by the insulating layer SR12, may not be exposed to the outside, and thus, oxidation may be prevented.

A region of the conductive layer 11L, which is not covered by the insulating layer SR11, may be utilized as a terminal (or a land) for coupling parts, such as the communication circuit 990 or a connector 980, to the first PCB 910. The insulating layer SR11 may prevent bridge occurrence of a solder when connecting parts, such as the communication circuit 990 or the connector 980, to the first PCB 910 through a connection member such as a solder.

A region of the conductive layer 16L, which is not covered by the insulating layer SR12, may be utilized as a terminal (or a land) for electrically connecting the first PCB 910 and the third PCB 930 through the connection members 917 and 918 (e.g., conductive materials). The insulating layer SR12 may prevent bridge occurrence of a solder when connecting the first PCB 910 and the third PCB 930 through a connection member such as a solder.

The third PCB 930 includes conductive layers 31L, 32L, 33L, and 34L. A third insulating material (e.g., prepreg or polyimide) DS3 may be disposed between the conductive layers 31L, 32L, 33L, and 34L.

The third PCB 930 may have a structure in which conductive layers of the same number are disposed on opposite sides of a center substrate C3. For example, the third PCB 930 in which conductive layers of the same number are stacked on opposite sides of the center substrate C3 may be formed by a manufacturing method in which an operation of respectively stacking a pair of, i.e., two conductive layers on opposite sides is performed many times. The manufacturing method may prevent a PCB from being damaged (e.g., wrapping or tearing) due to an environment such as a temperature or a pressure applied when manufacturing the PCB.

A distance H31 between the conductive layers 31L, 32L, 33L, and 34L may be substantially uniform, and the third PCB 930 may have substantially the same heights (or thicknesses) H32 and H33 on opposite side of the center substrate C3.

The third PCB 930 includes a conductive via VIA3 electrically connecting at least some of the conductive layers 31L, 32L, 33L, and 34L. The conductive via VIA3 may include a conductive hole dug for the purpose of disposing a connection line for electrically connecting the conductive layers 31L, 32L, 33L, and 34L disposed in different layers. The number of conductive layers included in the third PCB 930 is not limited to the example illustrated in FIG. 9B and may vary.

The third PCB 930 includes insulating layers SR31 and SR32 that are formed by applying an insulating material, such as a solder mask insulating ink of an epoxy component, on the conductive layer 31L and/or the conductive layer 34L. A region of the conductive layer 31L, which is covered by the insulating layer SR31, and a region of the conductive layer 34L, which is covered by the insulating layer SR32, may not be exposed to the outside, and thus, oxidation may be prevented.

A region of the conductive layer 31L, which is not covered by the insulating layer SR31, may be utilized as a terminal (or a land) that is electrically connected with the third PCB 930 through the connection members 917 and 918 (e.g., conductive materials). The insulating layer SR31 may prevent bridge occurrence of a solder when connecting the first PCB 910 and the third PCB 930 through a connection member such as a solder.

The first PCB 910 or the third PCB 930 may be formed by using a copper clad laminate (CCL) (e.g., the conductive layer 912, the conductive layers 11L, 12L, 13L, 14L, 15L, and 16L, or the conductive layers 31L, 32L, 33L, and 34L). The CCL may be a composite CCL made by compounding two or more kinds of reinforcing substrates. The composite CCL may include composite epoxy material (CEM)-1 (e.g., a composite type of laminate material bonded with a flame retardant epoxy resin) or CEM-3 defined by the National Electrical Manufacturers Association (NEMA). The CEM-1 may include a center substrate (or core) made of paper impregnated with an epoxy resin, or an outer substrate made of woven glass fiber impregnated with an epoxy resin, and a copper foil coupled to the outer substrate. The CEM-3 may include a center substrate made of non-woven glass fiber (e.g., glass non-woven fabric) impregnated with an epoxy resin, an outer substrate made of woven glass fiber impregnated with an epoxy resin, or a copper foil coupled to the outer substrate. The glass fiber or paper may improve the ability of machining, heat resistance, or dimensional stability. The CCL may be flame retardant (FR)-6 including a center substrate made of non-woven glass fiber (e.g., glass non-woven fabric) impregnated with a polyester resin, an outer substrate made of glass fiber impregnated with a resin, or a copper foil coupled to the outer substrate.

The CEM-3 may be designed to replace FR-4 or FR-5. Because the CEM-3 has a relatively few amount of glass fiber compared to the FR-4 or FR-5, the mechanical strength of the CEM-3 may be relatively low. When the CEM-3 is designed to replace the FR-4 or FR-5, the above mechanical strength may be taken into account. When punching processing is required, the CEM-3 that is more advantageous for the punching processing may be applied to manufacture of a PCB instead of the FR-4.

The CCL may be a high-frequency CCL made of a material capable of coping with high-speed signal transmission. For example, in a PCB, because a propagation speed of signal is inversely proportional to a dielectric constant of a material, the propagation speed of signal may be improved by using a material with a low dielectric constant.

The CCL may be formed by disposing film prepreg of an insulating material on a plate formed of a metal, such as aluminum or iron, and then coupling a copper foil to the film prepreg.

The CCL may include a flexible CCL (FCCL) for an FPCB. The FCCL may be of a form in which a soluble polyester film or a polyimide film is combined with a copper foil by using an adhesive (e.g., an acrylic adhesive).

The first PCB 910 and the third PCB 930 may be manufactured based on different CCLs, or may be manufactured based on the same CCL.

The first PCB 910 may be manufactured by using a plurality of CCLs that are different from each other.

The third PCB 930 may be manufactured by using a plurality of CCLs that are different from each other.

The number of conductive layers included in the third PCB 930 may be different from the number of conductive layers included in the first PCB 910. For example, the number (e.g., 4) of conductive layers included in the third PCB 930 may be less than the number (e.g., 6) of conductive layers included in the first PCB 910. However, the number of conductive layers included in the third PCB 930 may also be equal to the number of conductive layers included in the first PCB 910 or may be greater than the number of conductive layers included in the first PCB 910.

The first insulating material DS1 and the third insulating material DS3 may include different materials, or the first insulating material DS1 may be identical to the third insulating material DS3. The first insulating material DS1 may vary depending on a CCL as a basis of forming the first PCB 910, and an insulating material included therein. The third insulating material DS3 may vary depending on a CCL as a basis of forming the third PCB 930, and an insulating material included therein.

The distance H11 between the conductive layers 11L, 12L, 13L, 14L, 15L, and 16L of the first PCB 910 and the distance H31 between the conductive layers 31L, 32L, 33L, and 34L of the third PCB 930 may be different from each other. For example, the distance H11 may be smaller than the distance H31. However, the distance H11 may also be substantially equal to the distance H31 or greater than the distance H31.

The thickness H1 of the first PCB 910 and the thickness H3 of the third PCB 930 may be different. For example, the thickness H1 of the first PCB 910 may be smaller than the thickness H3 of the third PCB 930. However, the thickness H1 of the first PCB 910 may also be substantially equal to the thickness H3 of the third PCB 930 or greater than the thickness H3 of the third PCB 930.

The connection members 917 and 918 (e.g., conductive materials), such as solder, may be disposed between the second surface 910_2 and the fifth surface 930_1 and may electrically connect the first PCB 910 and the third PCB 930.

The communication circuit 990 may be disposed on or coupled to the first surface 910_1 of the first PCB 910 through a conductive material 991 such as solder and may be electrically connected with the first PCB 910.

At least some of the conductive layers 31L, 32L, 33L, and 34L included in the third PCB 930 may be utilized as conductive patterns (e.g., a patch antenna).

For example, the conductive layers 33L and 34L may include conductive patterns 931a and 931b that are electrically connected with the communication circuit 990. The conductive patterns 931a and 931b may be supplied with a power from the communication circuit 990 and may transmit or receive a wireless signal. The connection member 917 of the connection members 917 and 918 (e.g., conductive materials) connecting the first PCB 910 and the third PCB 930 may be utilized as a conductive path for transferring a signal or a power between a portion (e.g., the conductive pattern 936) of the conductive layer 32L and the communication circuit 990.

The conductive layer 31L includes a dummy pattern 939. The dummy pattern 939 may be in an electrical floating state of being electrically separated from any other component. The dummy pattern 939 may be electromagnetically coupled with the conductive pattern 936 of the conductive layer 32L to adjust a radiation characteristic. The dummy pattern 939 may shift a resonant frequency to a specified frequency or may shift the resonant frequency as much as a given frequency. The dummy pattern 939 may reduce electromagnetic noises to improve the performance of antenna.

When viewed from above the sixth surface 930_2, the dummy pattern 939 may at least partially overlap the conductive pattern 936 of the conductive layer 32L. The dummy pattern 939 may prevent a PCB from being warped due to heat of a high temperature by providing a uniform thermal expansion coefficient when manufacturing the third PCB 930.

At least some of the conductive layers 11L, 12L, 13L, 14L, 15L, and 16L or 31L, 32L, 33L, and 34L included in the first PCB 910 or the third PCB 930 may include a ground plane. The ground plane may shield electromagnetic noises associated with the flow of signal or power in the first PCB 910 or the third PCB 930. The ground plane may dissipate heat generated by the antenna module 900 or transferred to the antenna module 900 from the outside. At least one ground plane included in the third PCB 930 may be electrically connected with at least one ground plane included in the first PCB 910 through the conductive materials 918.

At least some of the conductive layers 11L, 12L, 13L, 14L, 15L, and 16L of the first PCB 910 may include at least one first ground plane (e.g., one of the conductive layers 11L, 12L, 13L, 14L, 15L, and 16L) associated with a radiation characteristic of the conductive patterns 931a and 931b included in the third PCB 930. The radiation characteristic of the antenna module 900 may be determined based on a distance by which the conductive patterns 931a and 931b included in the third PCB 930 is spaced from a first ground plane. The radiation characteristic of the antenna module 900 may be determined based on a shape (e.g., a width, a length, or a thickness) of the first ground plane. The radiation characteristic of the antenna module 900 may be determined based on an insulating material (e.g., a dielectric constant) between the conductive patterns 931a and 931b included in the third PCB 930 and the first ground plane.

At least some of the conductive layers 31L, 32L, 33L, and 34L of the third PCB 930 may include at least one third ground plane (e.g., one of the conductive layers 31L, 32L, 33L, and 34L) associated with the radiation characteristic of the conductive patterns 931a and 931b included in the third PCB 930. For example, the radiation characteristic of the antenna module 900 may be determined based on a distance by which the conductive patterns 931a and 931b included in the third PCB 930 is spaced from the third ground plane. The radiation characteristic of the antenna module 900 may be determined based on a shape (e.g., a width, a length, or a thickness) of the third ground plane. The radiation characteristic of the antenna module 900 may be determined based on an insulating material (e.g., a dielectric constant) between the conductive patterns 931a and 931b included in the third PCB 930 and the third ground plane.

As a ground plane associated with the radiation characteristic of the conductive patterns 931a and 931b included in the third PCB 930, one of the first ground plane of the first PCB 910 and the third ground plane of the third PCB 930 may be omitted.

The connector 980 may be disposed on or coupled to the first surface 910_1 of the first PCB 910 through a conductive material 981 such as solder and may be electrically connected with the first PCB 910. The connector 980 may be electrically connected with the communication circuit 990 or various other components disposed on the first PCB 910 through at least one conductive layer included in the first PCB 910.

A power management circuit may be disposed on or coupled to the first surface 910_1 of the first PCB 910 through a conductive material such as solder and may be electrically connected with the first PCB 910. The power management circuit may be electrically connected with the communication circuit 990, the connector 980, or various other components (e.g., passive elements) disposed on the first PCB 910 through at least one conductive layer included in the first PCB 910.

The antenna module 900 includes a conductive cover 992 that is coupled to the first PCB 910 through a conductive material 971. The conductive cover 992 may cover at least a portion of the communication circuit 990 and may be electrically connected with the ground plane of the first PCB 910. The conductive cover 992 may reduce the introduction of electromagnetic noises of the outside or electromagnetic noises of the antenna module 900 to the communication circuit 990. The conductive cover 992 may be referred to as a "shielding member" or "shield can."

FIG. 9C illustrates an antenna module including a coupling structure of a first PCB and a third PCB according to an embodiment. In FIG. 9C, reference numeral 905 indicates a perspective view of the antenna module 900C, and reference numeral 907 indicates a cross-sectional view of the antenna module 900C taken along line 9C-9C'.

Referring to FIG. 9C, an antenna module 900C includes the first PCB 910 and the third PCB 930. The antenna module 900C may be provided in a PCB design manner.

The first PCB 910 (e.g., a rigid PCB) includes at least one insulating layer (or dielectric layer) 911, at least one conductive layer 912, and a conductive line 913. The conductive line 913 may be disposed to penetrate some of the at least one insulating layer (or dielectric layer) 911 and the at least one conductive layer 912. A configuration of the first PCB 910 of FIG. 9C may be the same as or similar to the configuration of the first PCB 910 of FIG. 9A, and thus, additional description will be omitted to avoid redundancy.

At least a portion of the first PCB 910 and at least a portion of the third PCB 930 may be coupled to overlap each other. For example, the first PCB 910 may include the first surface 910_1 and the second surface 910_2 facing away from the first surface 910_1. The third PCB 930 may include the fifth surface 930_1 and the sixth surface 930_2 facing away from the fifth surface 930_1. A portion of the second surface 910_2 of the first PCB 910 and a portion of the fifth surface 930_1 of the third PCB 930 may be coupled to overlap each other. At least one dummy pattern 919 that is coupled to the connection member 918 may be disposed on the second surface 910_2 of the first PCB 910 and the fifth surface 930_1 of the third PCB 930.

Some of the connection members 918 may be connected with the ground region (e.g., some of the conductive layers 912), or some of the connection members 918 may not be connected with any feeding part or ground region and may be used only for coupling of the first PCB 910 and the third PCB 930 (e.g., used as an adhesive member for adhesion of the first PCB 910 to the third PCB 930).

The third PCB 930 includes at least one conductive pattern 931 (e.g., a patch antenna) and at least one conductive pattern 936. The conductive pattern 936 may be connected with the conductive line 913 through the connection member 915. The conductive pattern 936 and the connection member 915 may be connected through an additional conductive line. The conductive pattern 936 may transmit a communication signal from the communication circuit 990 to the conductive pattern 931. The conductive pattern 936 may transmit a communication signal to the conductive pattern 931 through the coupling.

Alternatively, the conductive pattern 936 may be connected with the conductive pattern 931 through a conductive line and may transmit a communication signal to the conductive pattern 931. The communication circuit 990 may be disposed on the first surface 910_1 of the first PCB 910.

At least a portion of the third PCB 930 may be formed of the same material as the first PCB 910 (e.g., formed as a rigid PCB). At least a portion of the third PCB 930 may be formed of a material (e.g., formed as an FPCB) different from that of the first PCB 910.

Figure 10A:
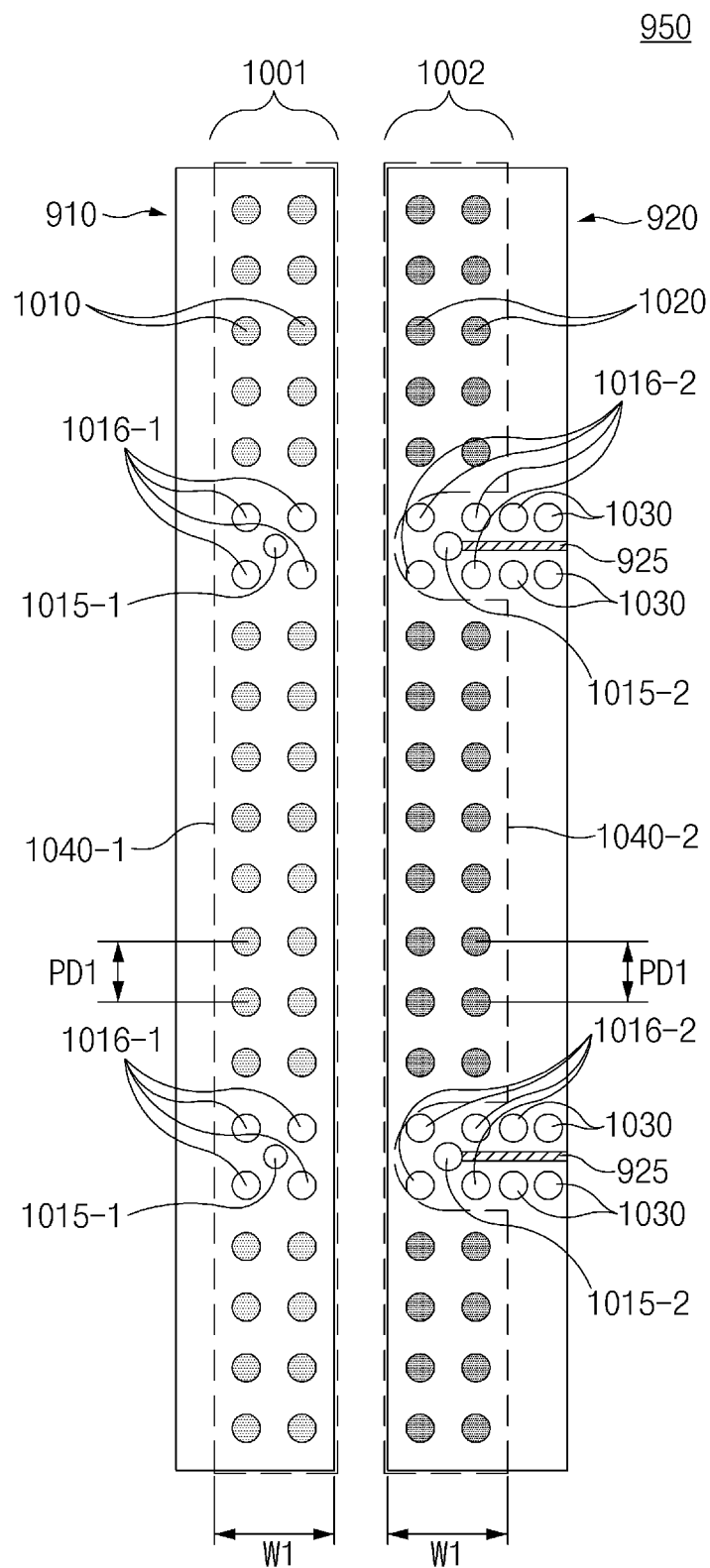
FIG. 10A illustrates the coupling portion of FIG. 9A, according to an embodiment.

FIG. 10A illustrates the coupling portion 950 of FIG. 9A, according to an embodiment.

Referring to FIG. 10A, although spaced from each other in drawing, a first overlapping portion 1001 of the first PCB 910 and a second overlapping portion 1002 of the second PCB 920 may belong to a region (e.g., the coupling portion 950 or the first overlapping region) in which they overlap each other. The first overlapping portion 1001 and the second overlapping portion 1002 may have a width of a specific magnitude (e.g., a first magnitude W1 or about 1 mm).

The first overlapping portion 1001 includes a first insulating region 1040-1, and the second overlapping portion 1002 includes a second insulating region 1040-2. A first signal pad 1015-1, a first guide pad 1016-1, and a first dummy pad 1010 may be formed in the first insulating region 1040-1. A second signal pad 1015-2, a second guide pad 1016-2, and a second dummy pad 1020 may be formed in the second insulating region 1040-2.

The first signal pad 1015-1 and the second signal pad 1015-2 may be electrically connected through the connection member 915. The first signal pad 1015-1 may be connected with the conductive line 913 and the second signal pad 1015-2 may be connected with the conductive line 925. The conductive pattern 921 may be fed through the conductive line 913, the first signal pad 1015-1, the connection member 915, the second signal pad 1015-2, the conductive line 925, and the feeding part 926. A size of the second signal pad 1015-2 may be larger than or equal to a size of the first signal pad 1015-1. When viewed from above the fourth surface 920_2, the first signal pad 1015-1 and the second signal pad 1015-2 may be disposed at a location where they at least partially overlap each other.

The first guide pad 1016-1 and the second guide pad 1016-2 may be coupled through the connection member 916. The first guide pad 1016-1 may be connected with at least one (e.g., a ground region) of the conductive layers 912, and the second guide pad 1016-2 may be connected with the conductive layers 923 and 924. A size of the second guide pad 1016-2 may be larger than or equal to a size of the first guide pad 1016-1. When viewed from above the fourth surface 920_2, the first guide pad 1016-1 and the second guide pad 1016-2 may be disposed at a location where they at least partially overlap each other.

The first dummy pad 1010 and the second dummy pad 1020 may be coupled through a dummy connection member. For example, the first PCB 910 and the second PCB 920 may maintain the connection through the coupling of the first dummy pad 1010 and the second dummy pad 1020. When viewed from above the fourth surface 920_2, the first dummy pad 1010 and the second dummy pad 1020 may be disposed at a location where they at least partially overlap each other.

The first dummy pad 1010 and the second dummy pad 1020 may be formed every specific distance (e.g., first pad distance PD1 or about 0.25 mm). The connection member 915, the connection member 916, or the dummy connection member may be formed through an adhesive self-align (ASA) process.

The ASA process is a bonding process for electrical connection between lines or patterns of heterogeneous substrates (e.g., between the first signal pad 1015-1 and the second signal pad 1015-2, between the first guide pad 1016-1 and the second guide pad 1016-2, or between the first dummy pad 1010 and the second dummy pad 1020). The ASA process may include at least three operations.

In the first operation, a resin in which a conductive component (e.g., lead (Pb)) is contained may be applied to a surface for bonding.

In the second operation, conductive lines or patterns for bonding may be matched (or aligned).

In the third operation, when the matched conductive lines or patterns are heated at a given temperature, the applied resin may be melted and bonded between the conductive lines or patterns of the heterogeneous substrates, and the conductive lines or patterns of the heterogeneous substrates may be connected to each other.

Conductive lines or patterns (e.g., spaces between the first signal pad 1015-1 and the second signal pad 1015-2, between the first guide pad 1016-1 and the second guide pad 1016-2, between the first dummy pad 1010 and the second dummy pad 1020) of an mm Wave antenna may be formed with a fine distance due to a high frequency band. The applied resin may include a self-assembly paste that includes a conductive component and has a melting point of a specific temperature (e.g., about 200° C. to 250° C.) at which the FPCB is not damaged by heat. At the specific temperature, the conductive component of the self-assembly paste may be collected at a portion in which a conductive pattern is present, a non-conductive component of the self-assembly paste may be collected at a portion from which a conductive pattern is absent, and the conductive component and the non-conductive component may be isolated from each other.

A guide via 1030 may be connected between the conductive layers 923 and 924. The guide via 1030 may form an electrical shield associated with the conductive line 925, together with the conductive layers 923 and 924.

Figure 10B:
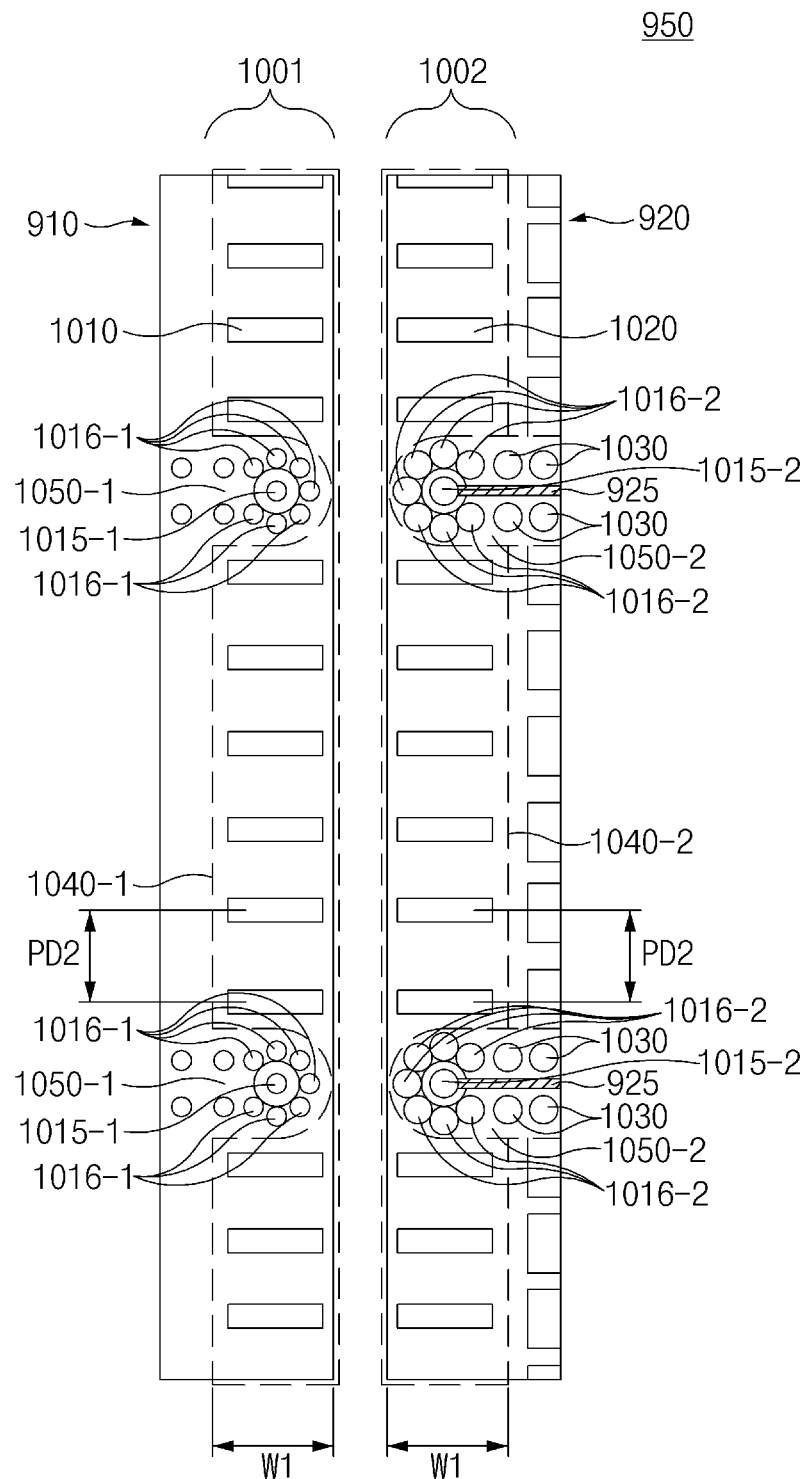
FIG. 10B illustrates the coupling portion of FIG. 9A, according to an embodiment.

FIG. 10B illustrates the coupling portion 950 of FIG. 9A, according to an embodiment.

Referring to FIG. 10B, although spaced from each other in drawing, the first overlapping portion 1001 of the first PCB 910 and the second overlapping portion 1002 of the second PCB 920 may belong to a region (e.g., the coupling portion 950) in which they overlap each other. At least one of the components of the coupling portion 950 of FIG. 10A may be identical or similar to at least one of the components of the coupling portion 950 of FIG. 10B, and thus, additional description will be omitted to avoid redundancy.

The first overlapping portion 1001 includes the first insulating region 1040-1 and a first metal region 1050-1. The second overlapping portion 1002 includes the second insulating region 1040-2 and a second metal region 1050-2. The first signal pad 1015-1 and the first guide pad 1016-1 may be formed in the first metal region 1050-1. The first dummy pad 1010 may be formed in the first insulating region 1040-1. The second signal pad 1015-2 and the second guide pad 1016-2 may be formed in the second metal region 1050-2. The second dummy pad 1020 may be formed in the second insulating region 1040-2. The first dummy pad 1010 or the second dummy pad 1020 may be disposed every specific distance (e.g., every second pad distance PD2).

The first dummy pad 1010 and the second dummy pad 1020 may be formed in the shape of a quadrangle having a specific size (e.g., about 0.2 mm in width and about 0.8 mm in height).

Figure 10C:
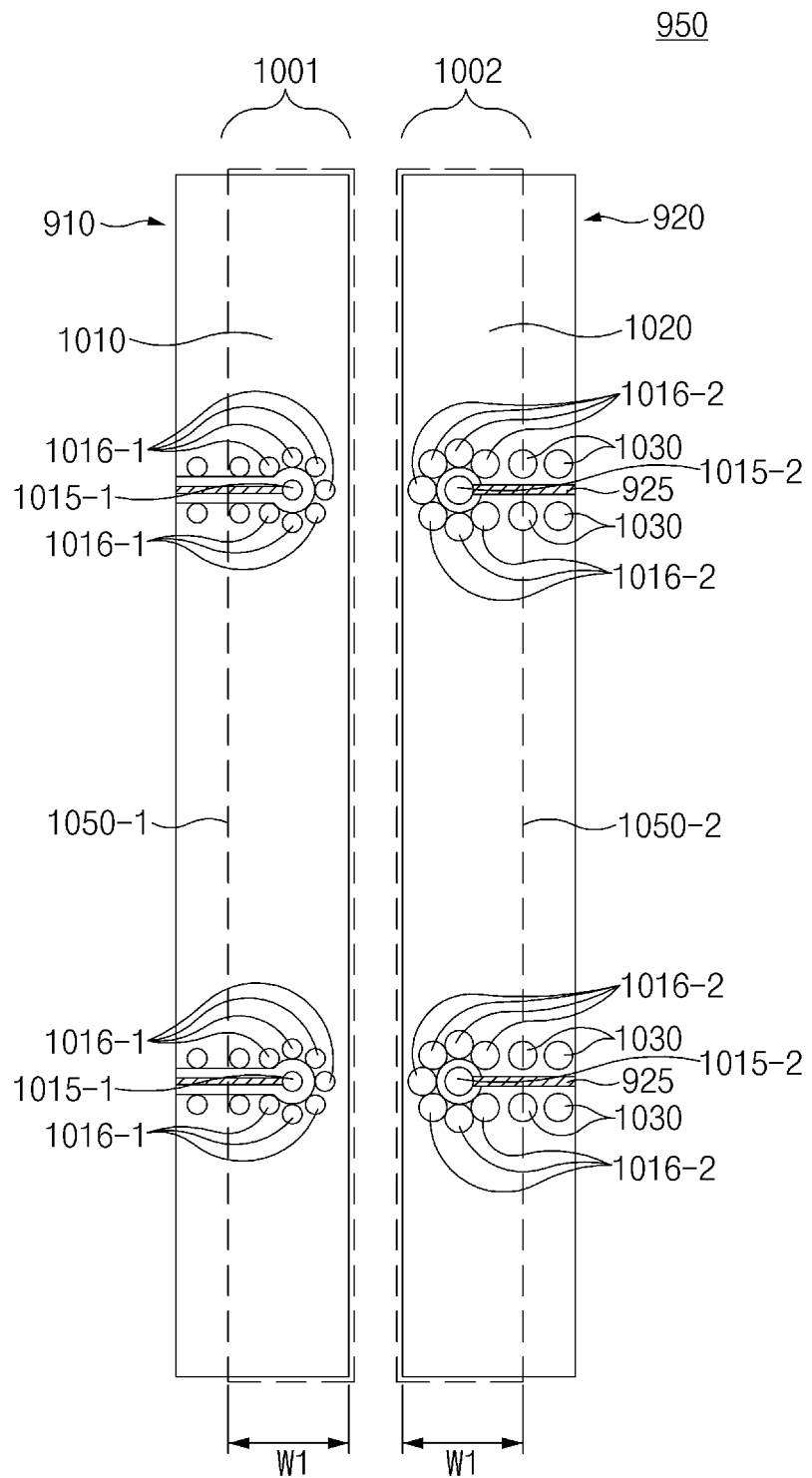
FIG. 10C illustrates the coupling portion of FIG. 9A, according to an embodiment.

FIG. 10C illustrates the coupling portion 950 of FIG. 9A, according to an embodiment.

Referring to FIG. 10C, although spaced from each other in drawing, the first overlapping portion 1001 of the first PCB 910 and the second overlapping portion 1002 of the second PCB 920 may belong to a region (e.g., the coupling portion 950) in which they overlap each other. At least one of the components of the coupling portion 950 of FIG. 10A may be identical or similar to at least one of the components of the coupling portion 950 of FIG. 10C, and thus, additional description will be omitted to avoid redundancy.

The first overlapping portion 1001 includes the first metal region 1050-1. The second overlapping portion 1002 includes the second metal region 1050-2. The first signal pad 1015-1, the first guide pad 1016-1, and/or the first dummy pad 1010 may be formed in the first metal region 1050-1. The second signal pad 1015-2, the second guide pad 1016-2, and/or the second dummy pad 1020 may be formed in the second metal region 1050-2.

The first dummy pad 1010 and the second dummy pad 1020 may be formed in the shape of a surface similar in size to the first metal region 1050-1 or the second metal region 1050-2.

FIG. 10D illustrates a peripheral part of the connection member 915 of FIG. 9A, according to an embodiment. In FIG. 10D, reference numeral 1003 indicates a perspective view of the coupling portion 950, and reference numeral 1004 indicates a cross-sectional view of the coupling portion 950.

Referring to FIG. 10D, the first signal pad 1015-1 and the second signal pad 1015-2 may be coupled through the connection member 915. The first signal pad 1015-1 may be connected with the conductive line 913 through a first signal via 1025-1. The second signal pad 1015-2 may be connected with the conductive line 925 through a second signal vie 1025-2. The first guide pad 1016-1 and the second guide pad 1016-2 may be coupled through the connection member 916. The first guide pad 1016-1 may be connected with at least one (e.g., a ground region) of the conductive layers 912 through a first guide via 1051-1. The second guide pad 1016-2 may be connected with the conductive layers 923 and 924 through a second guide via 1051-2.

Figure 11A:
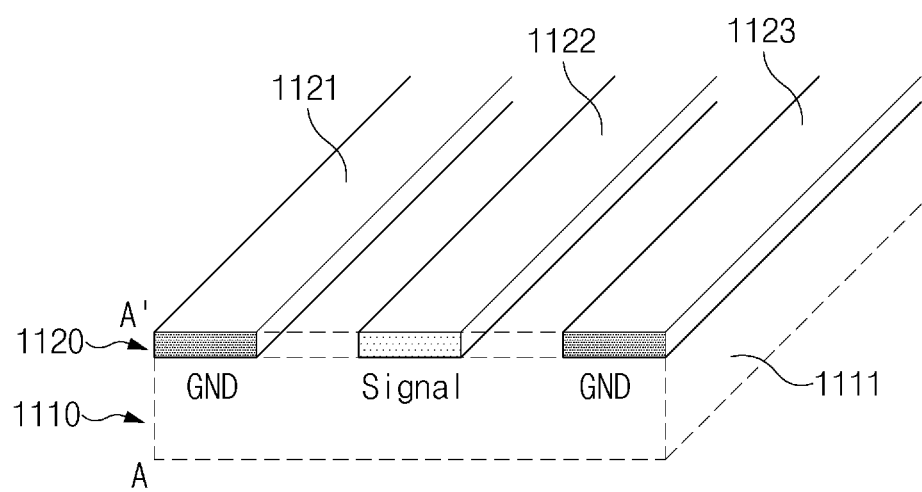
FIG. 11A illustrates the signal line of the second PCB of FIG. 9A, according to an embodiment.

FIG. 11A illustrates a cross-sectional view taken along line 9B-9B' of a signal line of the second PCB 920 of FIG. 9A, according to an embodiment.

Referring to FIGS. 9A and 11A, the second PCB 920 includes one conductive layer 1120. An insulating layer (or dielectric layer) 1110 may include an insulator (or dielectric) 1111. The conductive layer 1120 includes conductive lines 1121, 1122, and 1123. The conductive lines 1121, 1122, and 1123 may be stacked on the insulator (or dielectric) 1111. The first conductive line 1121 and the third conductive line 1123 that are ground lines may be connected with a ground region of the conductive layers 912 of the first PCB 910 through the connection member 916. The second conductive line 1122 is a signal line that may be connected with the conductive line 913 through the connection member 915. The second conductive line 1122 may be disposed between the first conductive line 1121 and the third conductive line 1123.

The first conductive line 1121, the second conductive line 1122, and the third conductive line 1123 may be implemented with a co-planar waveguide (CPW). The first conductive line 1121 and the third conductive line 1123 may form an electrical shield associated with the second conductive line 1122.

Figure 11B:
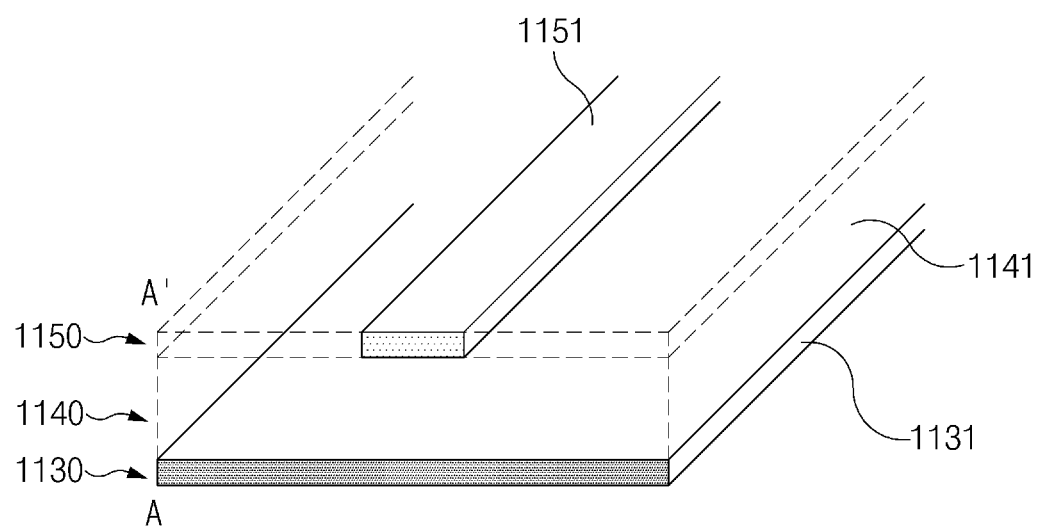
FIG. 11B illustrates the signal line of the second PCB of FIG. 9A, according to an embodiment.

FIG. 11B illustrates a cross-sectional view taken along line 9B-9B' of a signal line of the second PCB 920 of FIG. 9A, according to an embodiment.

Referring to FIG. 11B, the second PCB 920 includes a plurality of conductive layers 1130 and 1150. More specifically, a first conductive layer 1130 includes a first conductor 1131. A first insulating layer (or dielectric layer) 1140 includes a first insulator (or dielectric) 1141. A second conductive layer 1150 includes a second conductor 1151. The first insulating layer (or dielectric layer) 1140 may be stacked between the first conductive layer 1130 and the second conductive layer 1150. The second conductive layer 1150 may be stacked on the first insulating layer (or dielectric layer) 1140.

The first conductor 1131 may be connected with a ground region of the conductive layers 912 of the first PCB 910 through the connection member 916. The second conductor 1151 is a signal line that may be connected with the conductive line 913 through the connection member 915. The second conductor 1151 may be implemented with a micro strip line. The first conductor 1131 may form an electrical shield associated with the second conductor 1151.

Figure 11C:
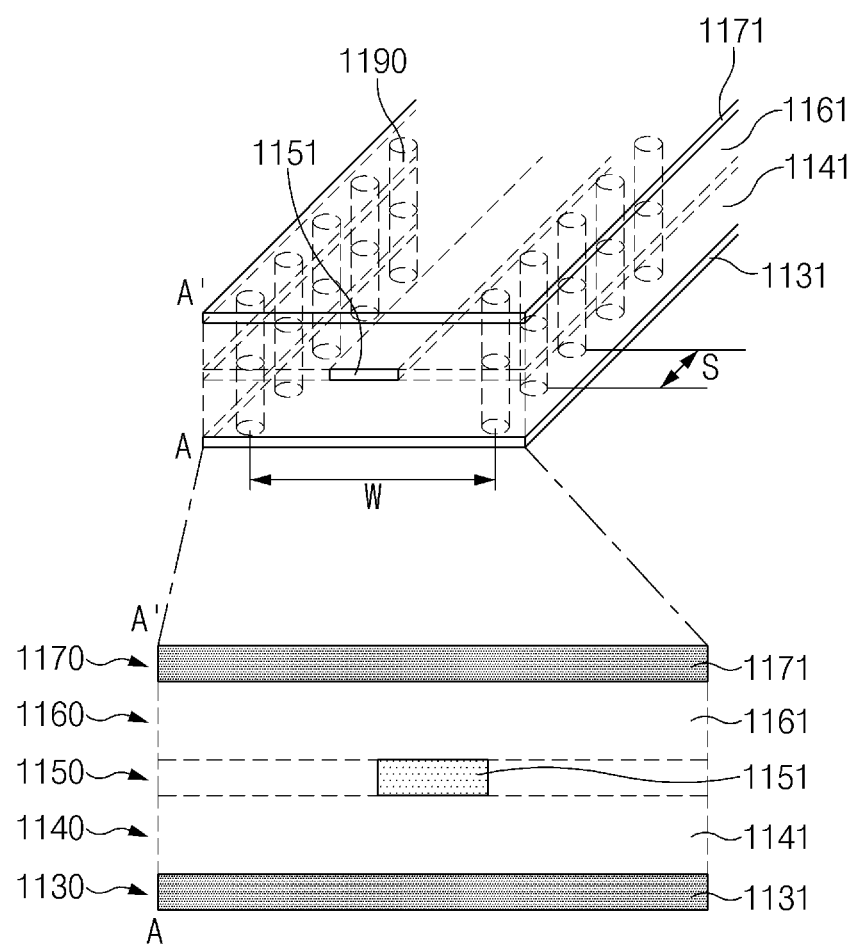
FIG. 11C illustrates the signal line of the second PCB of FIG. 9A, according to an embodiment.

FIG. 11C illustrates a cross-sectional view taken along line 9B-9B' of a signal line of the second PCB 920 of FIG. 9A, according to an embodiment.

Referring to FIG. 11C, the second PCB 920 includes a plurality of conductive layers 1130, 1150, and 1170. The first conductive layer 1130 includes the first conductor 1131. The first insulating layer (or dielectric layer) 1140 includes the first insulator (or dielectric) 1141. The second conductive layer 1150 includes the second conductor 1151. A second insulating layer (or dielectric layer) 1160 includes a second insulator (or dielectric) 1161. A third conductive layer 1170 includes a third conductor 1171.

The first insulating layer (or dielectric layer) 1140 may be stacked between the first conductive layer 1130 and the second conductive layer 1150. The second conductive layer 1150 may be stacked between the first insulating layer (or dielectric layer) 1140 and the second insulating layer (or dielectric layer) 1160. The second insulating layer (or dielectric layer) 1160 may be stacked between the second conductive layer 1150 and the third conductive layer 1170. The first insulating layer (or dielectric layer) 1140, the second insulating layer (or dielectric layer) 1160, or the second conductive layer 1150 may be stacked between the third conductive layer 1170 and the first conductive layer 1130.

The first conductor 1131 or the third conductor 1171 may be connected with a ground region of the conductive layers 912 of the first PCB 910 through the connection member 916. The second conductor 1151 that is a signal line may be connected with the conductive line 913 through the connection member 915. The second conductor 1151 may be implemented with a strip line. The first conductor 1131 and the third conductor 1171 may form an electrical shield associated with the second conductor 1151.

At least one guide via 1190 may be disposed between the first conductor 1131 and the third conductor 1171. The guide vias 1190 may be disposed in a direction parallel to the second conductor 1151 every specific distance "S". The guide vias 1190 may be disposed on opposite sides of the second conductor 1151 so as to be spaced from each other as much as a second specific distance "W". The guide vias 1190 may electrically connect the first conductor 1131 and the third conductor 1171. The guide vias 1190 may form an electrical shield associated with the second conductor 1151.

FIG. 12 illustrates an antenna module including a coupling structure of a first PCB and a second PCB according to an embodiment. In FIG. 12, reference numeral 1201 indicates a perspective view of the antenna module 1200, and reference numeral 1203 indicates a cross-sectional view of the antenna module 1200 taken along line 12-12'.

Referring to FIG. 12, an antenna module 1200 includes a first PCB 1210 and a second PCB 1220. The antenna module 1200 may be provided in a PCB design manner. At least one of components of FIG. 12 (e.g., the first PCB 1210 or the second PCB 1220) may be identical or similar to at least one of the components of FIG. 9A (e.g., the first PCB 910 or the second PCB 920), and thus, additional description will be omitted to avoid redundancy.

The antenna module 1200 includes a third PCB 1230 and a fourth PCB 1240. The third PCB 1230 includes a fifth surface 1230_1 and a sixth surface 1230_2 facing away from the fifth surface 1230_1. The fourth PCB 1240 includes a seventh surface 1240_1 and an eighth surface 1240_2 facing away from the seventh surface 1240_1.

At least a portion of the first PCB 1210 and at least a portion (e.g., a second overlapping region) of the third PCB 1230 may be connected. For example, a portion of a second surface 1210_2 of the first PCB 1210 and a portion of the fifth surface 1230_1 of the third PCB 1230 may be coupled together. The first PCB 1210 and the third PCB 1230 may be coupled through at least one connection member 1218. At least one dummy pattern that is coupled to the connection member 1218 may be disposed on the second surface 1210_2 of the first PCB 1210 and the fifth surface 1230_1 of the third PCB 1230.

Some of the connection members 1218 may be connected with a ground region (e.g., some of conductive layers 1212), or some of the connection members 1218 may not be connected with any feeding part or ground region and may be used only for coupling of the first PCB 1210 and the third PCB 1230 (e.g., used as an adhesive member for adhesion of the first PCB 1210 to the third PCB 1230).

At least a portion of the third PCB 1230 and at least a portion (e.g., a third overlapping region) of the fourth PCB 1240 may be connected. For example, a portion of the sixth surface 1230_2 of the third PCB 1230 and a portion of the seventh surface 1240_1 of the fourth PCB 1240 may be coupled together. The third PCB 1230 and the fourth PCB 1240 may be coupled through at least one connection member 1238. At least one dummy pattern that is coupled to the connection member 1238 may be disposed on the sixth surface 1230_2 of the third PCB 1230 and the seventh surface 1240_1 of the fourth PCB 1240.

Some of the connection members 1238 may be connected with a ground region (e.g., some of the conductive layers 1212), or some of the connection members 1238 may not be connected with any feeding part or ground region and may be used only for coupling of the third PCB 1230 and the fourth PCB 1240 (e.g., used as an adhesive member for adhesion the third PCB 1230 to the fourth PCB 1240).

At least a portion of the third PCB 1230 may be formed of the same material as the first PCB 1210 (e.g., formed as a rigid PCB). At least a portion of the fourth PCB 1240 may be formed of a material different from that of the third PCB 1230 (e.g., an FPCB).

The third PCB 1230 may include at least one conductive layer 1231 or 1236. The conductive pattern 1236 may be connected with a conductive line 1214 through a connection member 1217. The conductive pattern 1231 may be connected with the conductive pattern 1236 through a conductive line 1235.

The fourth PCB 1240 includes a conductive pattern 1241 (e.g., a patch antenna) and a conductive pattern 1246. The conductive pattern 1246 may be connected with a conductive line 1231 through a connection member 1237. The conductive pattern 1246 and the connection member 1237 may be connected through an additional conductive line. The conductive pattern 1246 may transmit a communication signal from a communication circuit 1290 to the conductive pattern 1241. The conductive pattern 1246 may transmit a communication signal to the conductive pattern 1241 through the coupling. Alternatively, the conductive pattern 1246 may be connected with the conductive pattern 1241 through a conductive line and may transmit a communication signal to the conductive pattern 1241.

The conductive pattern 1231 of the third PCB 1230 may operate as an antenna element. The conductive pattern 1231 may be connected with the conductive pattern 1236 through the conductive line 1235 and may be connected with the conductive line 1214. The conductive pattern 1241 may perform a role of a director when the adjacent conductive pattern 1246 operates as an antenna. Alternatively, the conductive pattern 1231 of the third PCB 1230 may operate as a patch antenna. The conductive pattern 1231 may operate as a dual band patch antenna together with the conductive pattern 1241.

Figure 13:
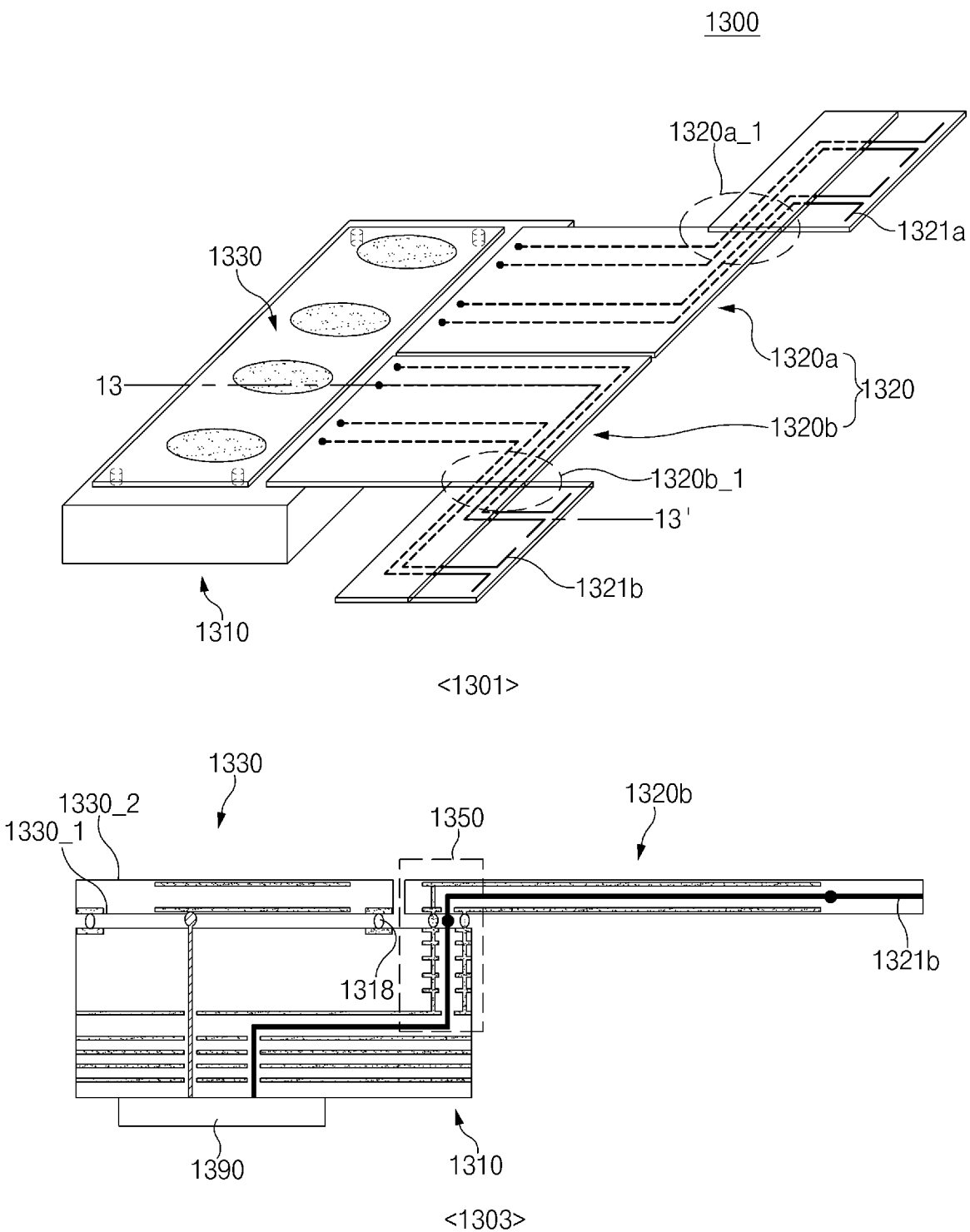
FIG. 13 illustrates an antenna module including a coupling structure of a first PCB and a second PCB according to an embodiment.

FIG. 13 illustrates an antenna module including a coupling structure of a first PCB and a second PCB according to an embodiment. In FIG. 13, reference numeral 1301 indicates a perspective view of the antenna module 1300, and reference numeral 1303 indicates a cross-sectional view of the antenna module 1300 taken along line 13-13'.

Referring to FIG. 13, an antenna module 1300 includes a first PCB 1310, a second PCB 1320, and a third PCB 1330. The antenna module 1300 may be provided in a PCB design manner. At least one of components of FIG. 13 (e.g., the first PCB 1310, the second PCB 1320, or the third PCB 1330) may be identical or similar to at least one of the components of FIG. 9A (e.g., the first PCB 910, the second PCB 920, or the third PCB 930), and thus, additional description will be omitted to avoid redundancy.

The second PCB 1320 includes sub circuit boards 1320a and 1320b. The sub circuit boards 1320a and 1320b may extend from the first PCB 1310 in different directions. Each of the sub circuit boards 1320a and 1320b may include at least one bent portion 1320a_1 or 1320b_1. A conductive pattern 1321a of the first sub circuit board 1320a may be disposed to be spaced from a conductive pattern 1321b of the second sub circuit board 1320b as much as a specific distance. When the antenna module 1300 is disposed in an electronic device, at least one electronic part of the electronic device (e.g., an audio module) may be disposed between the conductive pattern 1321a and the conductive pattern 1321b. The conductive pattern 1321a and the conductive pattern 1321b may form beams of different shapes depending on a ground condition. The sub circuit boards 1320a and 1320b may be implemented with independent circuit boards or may be formed to be partially coupled together.

Figure 14:
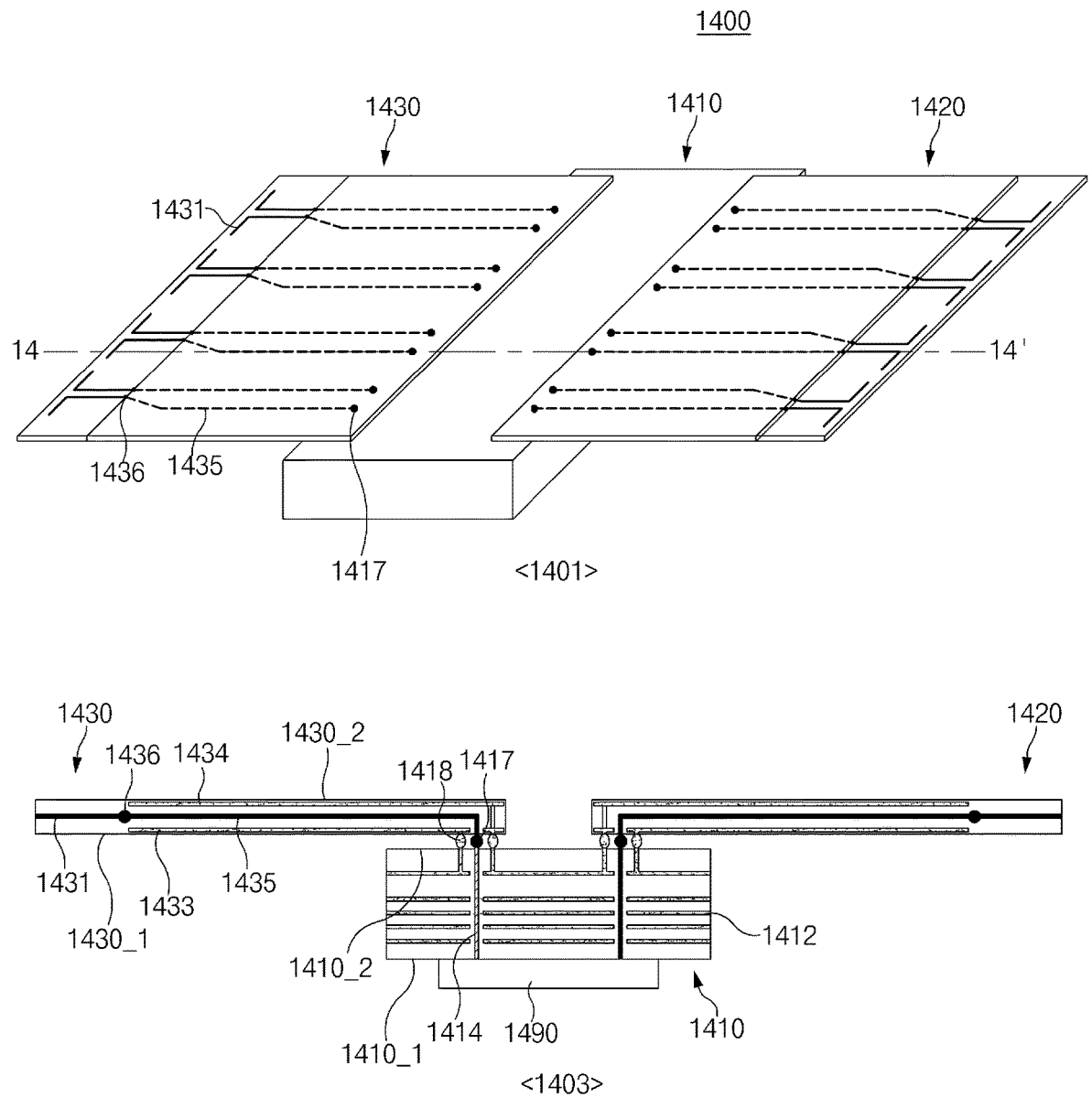
FIG. 14 illustrates an antenna module including a coupling structure of a first PCB and a second PCB according to an embodiment.

FIG. 14 illustrates an antenna module including a coupling structure of a first PCB and a second PCB according to an embodiment. In FIG. 14, reference numeral 1401 indicates a perspective view of the antenna module 1400, and reference numeral 1403 indicates a cross-sectional view of the antenna module 1400 taken along line 14-14".

Referring to FIG. 14, an antenna module 1400 include a first PCB 1410, a second PCB 1420, and a third PCB 1430. The antenna module 1400 may be provided in a PCB design manner. At least one of components of FIG. 14 (e.g., the first PCB 1410 or the second PCB 1420) may be identical or similar to at least one of the components of FIG. 9A (e.g., the first PCB 910 or the second PCB 920), and thus, additional description will be omitted to avoid redundancy.

The third PCB 1430 (e.g., an FPCB) may be formed of substantially the same material as the second PCB 1420. The third PCB 1430 includes at least one conductive pattern 1431 (e.g., a dipole antenna), conductive layers 1433 and 1434, and at least one conductive line 1435.

At least a portion of the first PCB 1410 and at least a portion of the third PCB 1430 may be connected. For example, the first PCB 1410 may include a first surface 1410_1 (e.g., the first surface 910_1) and a second surface 1410_2 (e.g., the second surface 910_2) facing away from the first surface 1410_1. The third PCB 1430 may include a fifth surface 1430_1 and a sixth surface 1430_2 facing away from the fifth surface 1430_1. A portion of the second surface 1410_2 of the first PCB 1410 and a portion of the fifth surface 1430_1 of the third PCB 1430 may be coupled together.

In a coupling portion, the conductive line 1435 may be connected with a conductive line 1414 through a connection member 1417 (e.g., a solder ball). The conductive layers 1433 and 1434 may be connected with at least one (e.g., a ground region) of conductive layers 1412 through a connection member 1418 (e.g., a solder ball). The conductive layers 1433 and 1434 may form an electrical shield associated with the conductive line 1435. Some of the connection members 1418 may not be connected with the ground region and may be formed for coupling of the first PCB 1410 to the third PCB 1430.

The conductive pattern 1431 may be electrically connected with a feeding part 1436. The feeding part 1436 may be connected with the conductive line 1435. The feeding part 1436 may transmit a communication signal from a communication circuit 1490 to the conductive pattern 1431.

The second PCB 1420 may be disposed to protrude from the first PCB 1410. The third PCB 1430 may be disposed to protrude from the first PCB 1410 in a direction different from that of the second PCB 1420.

Figure 15:
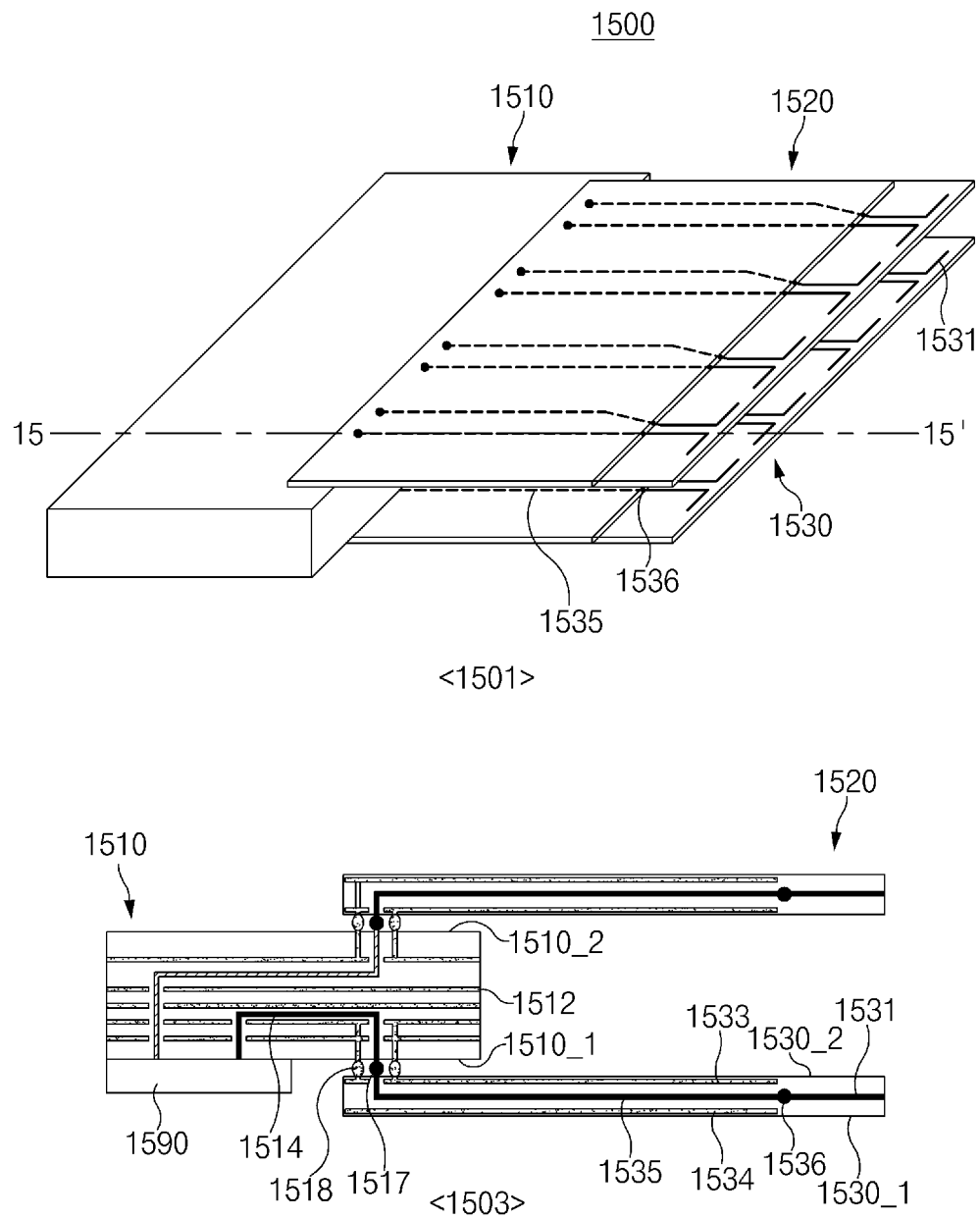
FIG. 15 illustrates an antenna module including a coupling structure of a first PCB and a second PCB according to an embodiment.

FIG. 15 illustrates an antenna module including a coupling structure of a first PCB and a second PCB according to an embodiment. In FIG. 15, reference numeral 1501 indicates a perspective view of the antenna module 1500, and reference numeral 1503 indicates a cross-sectional view of the antenna module 1500 taken along line 15-15'.

Referring to FIG. 15, an antenna module includes a first PCB 1510, a second PCB 1520, and a third PCB 1530. The antenna module 1500 may be provided in a PCB design manner. At least one of components of FIG. 15 (e.g., the first PCB 1510 or the second PCB 1520) may be identical or similar to at least one of the components of FIG. 9A (e.g., the first PCB 910 or the second PCB 920), and thus, additional description will be omitted to avoid redundancy.

At least a portion of the first PCB 1510 and at least a portion of the third PCB 1530 may be connected. For example, the first PCB 1510 may include a first surface 1510_1 (e.g., the first surface 910_1) and a second surface 1510_2 (e.g., the second surface 910_2) facing away from the first surface 1510_1. The third PCB 1530 may include a fifth surface 1530_1 and a sixth surface 1530_2 facing away from the fifth surface 1530_1. A portion of the second surface 1510_2 of the first PCB 1510 and a portion of the sixth surface 1530_2 of the third PCB 1530 may be coupled together.

In a coupling portion, a conductive line 1535 may be connected with a conductive line 1514 through a connection member 1517 (e.g., a solder ball). Conductive layers 1533 and 1534 may be connected with at least one (e.g., a ground region) of conductive layers 1512 through a connection member 1518 (e.g., a solder ball). The conductive layers 1533 and 1534 may form an electrical shield associated with the conductive line 1535. Some of the connection members 1518 may not be connected with the ground region and may be formed for coupling of the first PCB 1510 to the third PCB 1530.

A conductive pattern 1531 may be electrically connected with a feeding part 1536. The feeding part 1536 may be connected with the conductive line 1535. The feeding part 1536 may transmit a communication signal from a communication circuit 1590 to the conductive pattern 1531.

The second PCB 1520 may be disposed to protrude from the second surface 1510_2 of the first PCB 1510. The third PCB 1530 may be disposed to protrude from the first surface 1510_1 of the first PCB 1510.

Figure 16:
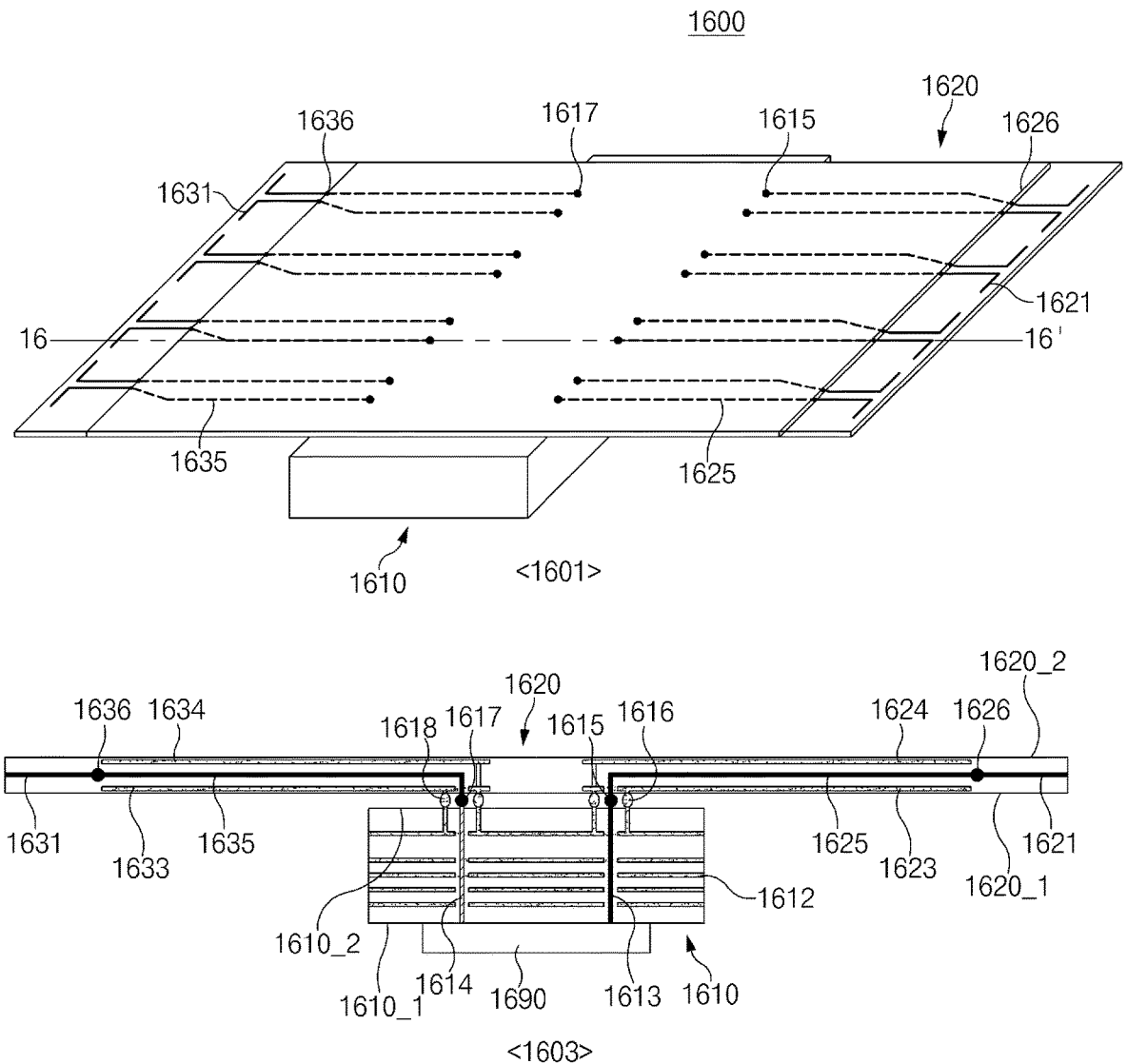
FIG. 16 illustrates an antenna module including a coupling structure of a first PCB and a second PCB according to an embodiment.

FIG. 16 illustrates an antenna module including a coupling structure of a first PCB and a second PCB according to an embodiment. In FIG. 16, reference numeral 1601 indicates a perspective view of the antenna module 1600, and reference numeral 1603 indicates a cross-sectional view of the antenna module 1600 taken along line 16-16'.

Referring to FIG. 16, an antenna module 1600 includes a first PCB and a second PCB 1620. The antenna module 1600 may be provided in a PCB design manner. At least one of components of FIG. 16 (e.g., the first PCB 1610) may be identical or similar to at least one of the components of FIG. 9A (e.g., the first PCB 910), and thus, additional description will be omitted to avoid redundancy.

The second PCB 1620 may be disposed to protrude from the first PCB 1610 in opposite directions. The second PCB 1620 includes a first conductive pattern 1621 and a second conductive pattern 1631. The first conductive pattern 1621 may be disposed at one protruding end of the second PCB 1620. The second conductive pattern 1631 may be disposed at an opposite protruding end of the second PCB 1620.

The first conductive pattern 1621 and the second conductive pattern 1631 may be formed of substantially the same conductive pattern (e.g., a dipole antenna).

At least a portion of the first PCB 1610 and at least a portion of the second PCB 1620 may be connected. For example, the first PCB 1610 may include a first surface 1610_1 (e.g., the first surface 910_1) and a second surface 1610_2 (e.g., the second surface 910_2) facing away from the first surface 1610_1. The second PCB 1620 may include a third surface 1620_1 and a fourth surface 1620_2 facing away from the third surface 1620_1. A portion of the second surface 1610_2 of the first PCB 1610 and a portion of the third surface 1620_1 of the second PCB 1620 may be coupled together.

In a coupling portion, a conductive line 1613 may be connected with a conductive line 1625 through a connection member 1615 (e.g., a solder ball). The conductive line 1625 may be connected with a feeding part 1626, and the feeding part 1626 may be connected with the conductive pattern 1621. Conductive layers 1623 and 1624 may be connected with at least one (e.g., a ground region) of conductive layers 1612 through a connection member 1616 (e.g., a solder ball). The conductive layers 1623 and 1624 may form an electrical shield associated with the conductive line 1625.

As another example, a conductive line 1614 may be connected with a conductive line 1635 through a connection member 1617 (e.g., a solder ball). The conductive line 1635 may be connected with a feeding part 1636, and the feeding part 1636 may be connected with a conductive pattern 1631. Conductive layers 1633 and 1634 may be connected with at least one (e.g., a ground region) of the conductive layers 1612 through a connection member 1618 (e.g., a solder ball). The conductive layers 1633 and 1634 may form an electrical shield associated with the conductive line 1635.

FIG. 17A illustrates an antenna module disposed in an electronic device according to an embodiment. FIG. 17B illustrates a cross-section view taken along line 17a-17a' in FIG. 17A according to an embodiment.

Referring to FIGS. 17A and 17B, an electronic device includes electronic parts 1700a, 1700b, 1700c, and 1700d within a housing that includes the front plate 720 (or a first plate), a back plate 780 (or a second plate), and a side member 710. Although FIGS. 17A and 17B illustrate electronic parts 1700a, 1700b, 1700c, and 1700d, the electronic device may include fewer or more electronic parts.

An antenna module 1700 is disposed between the electronic parts 1700a, 1700b, 1700c, and 1700d. The antenna module 1700 includes a first PCB 1710 and a second PCB 1720 coupled together.

In view 1701, the antenna module 1700 is disposed to at least partially overlap the electronic part 1700a. The second PCB 1720 of the antenna module 1700 may be formed of an FPCB and may have a small thickness and/or flexibility. The second PCB 1720 is disposed adjacent to the side member 710 across the electronic part 1700a. At least one conductive pattern 1721 included in the second PCB 1720 may be spaced from the first PCB 1710 and may be disposed adjacent to the side member 710.

In views 1702 or 1703, the conductive pattern 1721 is disposed at various locations regardless of a location of the first PCB 1710. For example, the conductive pattern 1721 may be disposed at various locations depending on a shape of the second PCB 1720. The second PCB 1720 may be disposed to cross the electronic parts 1700a and 1700c. The second PCB 1720 may be formed to include at least one bent portion.

In view 1704, the second PCB 1720 is disposed parallel to the back plate 780. For example, the second PCB 1720 may be disposed between the back plate 780 and the electronic part 1700a. The conductive pattern 1721 may be disposed close to a region where the back plate 780 and the side member 710 are connected. An injection-molding portion 710b of the side member 710 may be disposed between the back plate 780 and a metal portion 710a of the side member 710. Accordingly, beamforming by the conductive pattern 1721 may be made through the injection-molding portion 710b.

In view 1705, the second PCB 1720 may be bent and disposed along a shape of the side member 710. The second PCB 1720 may be bent and disposed along a shape of the electronic part 1700a. For example, the second PCB 1720 may be disposed between the back plate 780 and the electronic part 1700a. The conductive pattern 1721 may be disposed close to a region where the front plate 720 and the side member 710 are connected. The injection-molding portion 710b of the side member 710 may be disposed between the front plate 720 and the metal portion 710a of the side member 710. Accordingly, beamforming by the conductive pattern 1721 may be made through the injection-molding portion 710b.

Figure 18:
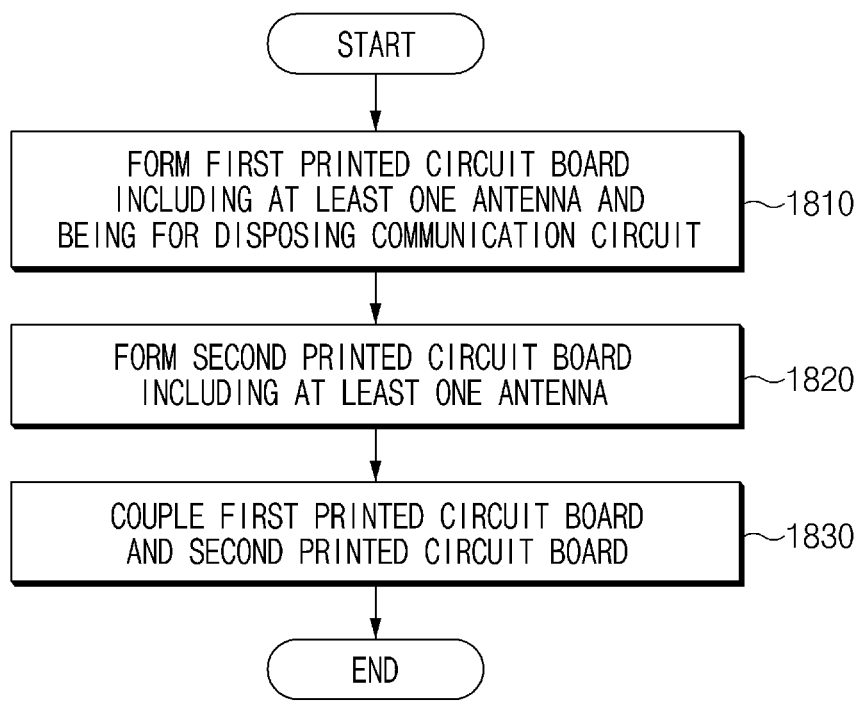
FIG. 18 is a flowchart illustrating a method of manufacturing an antenna module according to an embodiments.

FIG. 18 is a flowchart illustrating a method of manufacturing an antenna module according to an embodiment.

Referring to FIG. 18, in step 1810, a first PCB that includes at least one antenna and is for disposing a communication circuit is formed. The communication circuit may be disposed on one surface of the first PCB. The communication circuit may include an RFIC.

In step 1820, a second PCB including at least one antenna is formed. The second PCB may implement at least a portion of at least one conductive layer with an antenna.

In step 1830, the first PCB and the second PCB are connected through a conductive material, such as solder. For example, the first PCB may include a first surface and a second surface facing an opposite direction of the first surface. The second PCB may include a third surface and a fourth surface facing an opposite directed of the third surface. A portion of the second surface of the first PCB and a portion of the third surface of the second PCB may be coupled together. The conductive material such as solder may be disposed at an overlapping portion between the second surface and the third surface and may electrically connect the first PCB and the second PCB. The communication circuit may be disposed on the first surface of the first PCB.

Figure 19:
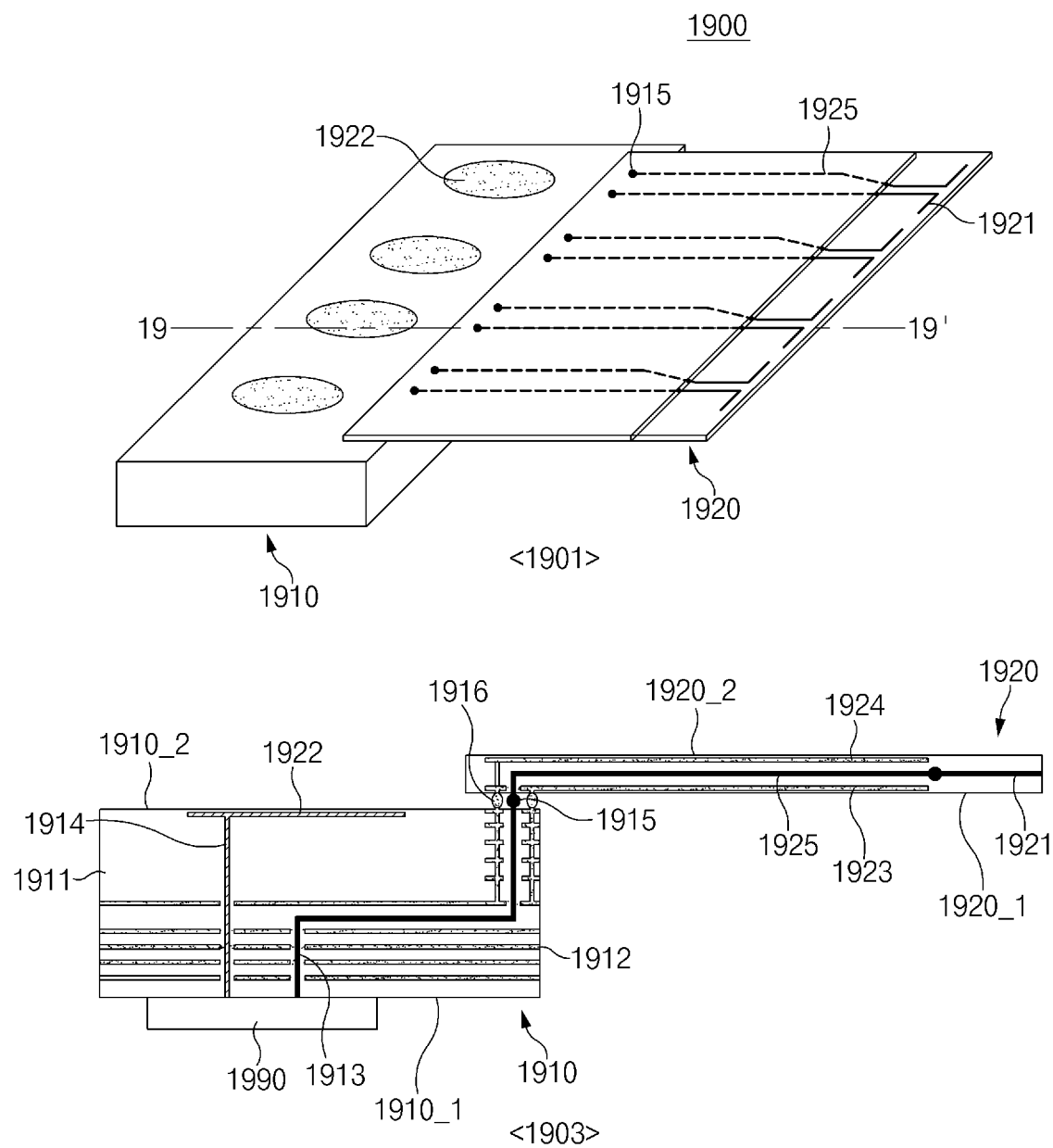
FIG. 19 illustrates an antenna module including a coupling structure of a first PCB and a second PCB according to an embodiment.

FIG. 19 illustrates an antenna module including a coupling structure of a first PCB and a second PCB according to an embodiment. In FIG. 19, reference numeral 1901 indicates a perspective view of the antenna module 1900, and reference numeral 1903 indicates a cross-sectional view of the antenna module 1900 taken along line 19-19'.

Referring to FIG. 19, an antenna module 1900 includes the first PCB 1910 and the second PCB 1920. The antenna module 1900 may be provided in a PCB design manner.

The first PCB 1910 (e.g., a rigid PCB) includes at least one insulating layer (or dielectric layer) 1911, at least one conductive layer 1912, a conductive line 1913, a conductive line 1914, and at least one conductive pattern 1922 (e.g., a patch antenna). The conductive pattern 1922 may be connected with the conductive line 1914. The conductive line 1913 or the conductive line 1914 may be disposed to penetrate some of the at least one insulating layer (or dielectric layer) 1911 and the at least one conductive layer 1912.

The insulating layer (or dielectric layer) 1911 and the conductive layer 1912 may be alternately stacked. For example, an operation in which a specific insulating layer (or dielectric layer) 1911 is formed, a conductive layer 1912 is formed on the specific insulating layer (or dielectric layer) 1911, and an insulating layer (or dielectric layer) 1911 is again formed on the conductive layer 1912 may be repeated. The number of insulating layers (or dielectric layers) 1911 and the number of conductive layers 1912 may be different.

The second PCB 1920 (e.g., an FPCB) may be formed of a material different from that of the first PCB 1910. The second PCB 1920 includes at least one conductive pattern 1921 (e.g., a dipole antenna), conductive layers 1923 and 1924, and at least one conductive line 1925. The second PCB 1920 may be disposed to protrude from the first PCB 1910.

At least a portion of the first PCB 1910 and at least a portion of the second PCB 1920 may be connected. For example, the first PCB 1910 may include the first surface 1910_1 and the second surface 1910_2 facing away from the first surface 1910_1. The second PCB 1920 may include the third surface 1920_1 and the fourth surface 1920_2 facing away from the third surface 1920_1. A portion of the second surface 1910_2 of the first PCB 1910 and a portion of the third surface 1920_1 of the second PCB 1920 may be coupled together.

In a coupling portion, the conductive line 1925 may be connected with the conductive line 1913 through a connection member 1915 (e.g., a solder ball). The conductive layers 1923 and 1924 may be connected with at least one (e.g., a ground region) of the conductive layers 1912 through a connection member 1916 (e.g., a solder ball). The conductive layers 1923 and 1924 may form an electrical shield associated with the conductive line 1925. Some of the connection members 1916 may not be connected with the ground region and may be formed for coupling of the first PCB 1910 and the second PCB 1920.

The communication circuit 1990 may be disposed on the first surface 1910_1 of the first PCB 1910. The communication circuit 1990 may be connected with the conductive line 1913 and/or the conductive line 1914. The communication circuit 1990 may transmit a communication signal to the conductive pattern 1921 through the conductive line 1913. Alternatively, the communication circuit 1990 may transmit a communication signal to the conductive pattern 1922 through the conductive line 1914.

Figure 20:
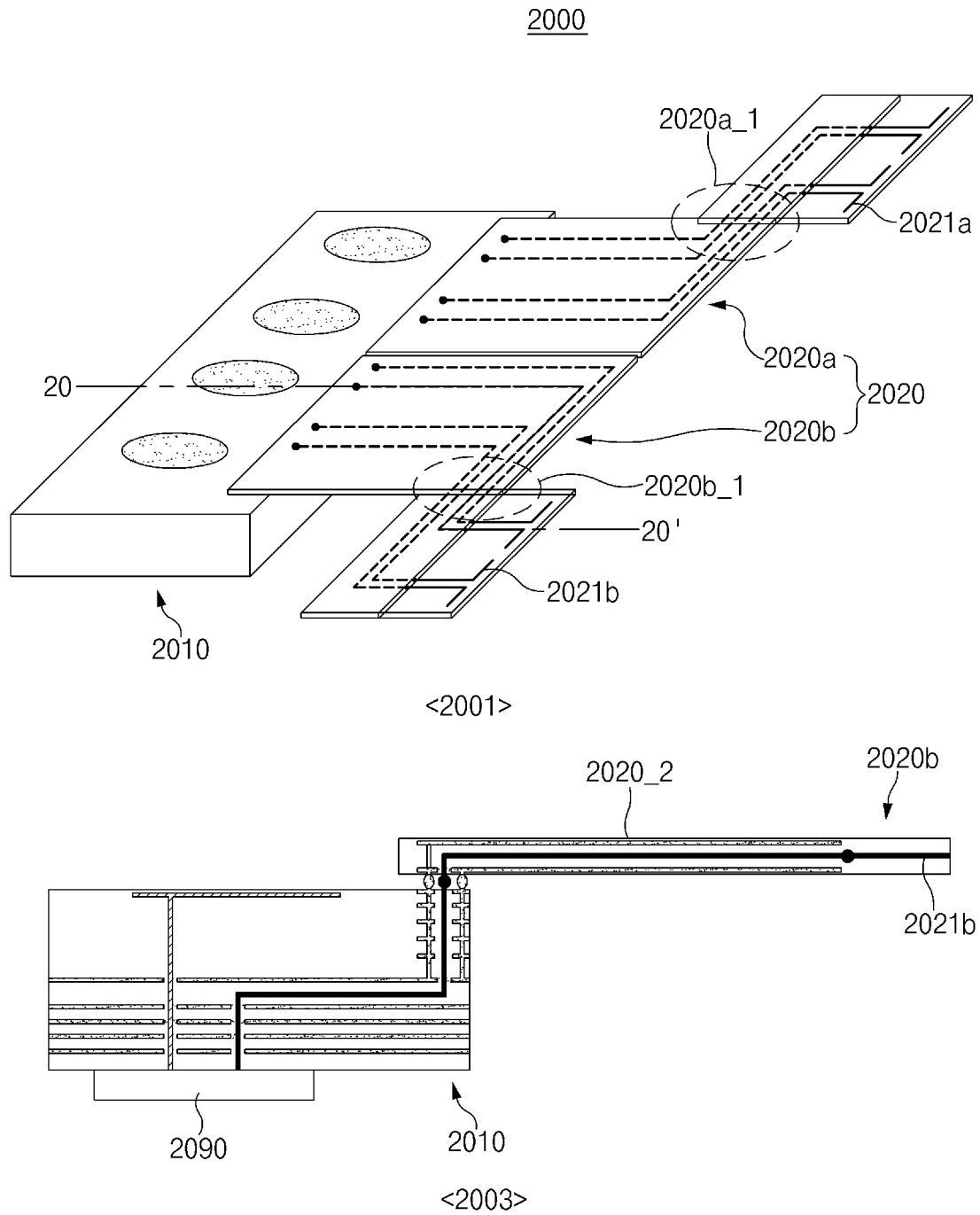
FIG. 20 illustrates an antenna module including a coupling structure of a first PCB and a second PCB according to an embodiment.

FIG. 20 illustrates an antenna module including a coupling structure of a first PCB and a second PCB according to an embodiment. In FIG. 20, reference numeral 2001 indicates a perspective view of the antenna module 2000, and reference numeral 2003 indicates a cross-sectional view of the antenna module 2000 taken along line 20-20'.

Referring to FIG. 20, an antenna module 2000 includes a first PCB 2010 and a second PCB 2020. The antenna module 2000 may be provided in a PCB design manner.

At least one of components of FIG. 20 (e.g., the first PCB 2010 or the second PCB 2020) may be identical or similar to at least one of the components of FIG. 19 (e.g., the first PCB 1910 or the second PCB 1920), and thus, additional description will be omitted to avoid redundancy.

The second PCB 2020 includes sub circuit boards 2020a and 2020b. The sub circuit boards 2020a and 2020b may extend from the first PCB 2010 in different directions. Each of the sub circuit boards 2020a and 2020b may include at least one bent portion 2020a_1 or 2020b_1. A conductive pattern 2021a of the first sub circuit board 2020a may be disposed to be spaced from a conductive pattern 2021b of the second sub circuit board 2020b as much as a specific distance.

When the antenna module 2000 is disposed in an electronic device, at least one electronic part of the electronic device (e.g., an audio module) may be disposed between the conductive pattern 2021a and the conductive pattern 2021b. The conductive pattern 2021a and the conductive pattern 2021b may form beams of different shapes depending on a ground condition. The sub circuit boards 2020a and 2020b may be implemented with independent circuit boards or may be formed to be partially coupled together.

FIG. 21 illustrates an antenna module including a coupling structure of a first PCB and a second PCB according to an embodiment. In FIG. 21, reference numeral 2101 indicates a perspective view of the antenna module 2100, and reference numeral 2103 indicates a cross-sectional view of the antenna module 2100 taken along line 21-21'.

Referring to FIG. 21, an antenna module 2100 includes a first PCB 2110 and a second PCB 2120. The antenna module 2100 may be provided in a PCB design manner. At least one of components of FIG. 21 (e.g., the first PCB 2110 or the second PCB 2120) may be identical or similar to at least one of the components of FIG. 19 (e.g., the first PCB 1910 or the second PCB 1920), and thus, additional description will be omitted to avoid redundancy.

At least a portion of the first PCB 2110 and at least a portion of the second PCB 2120 may be connected. For example, the first PCB 2110 may include a first surface 2110_1 and a second surface 2110_2 facing away from the first surface 2110_1. The first PCB 2110 may include a step 2160 at a portion of the second surface 2110_2. The step 2160 may include a third surface 2110_3 facing away from the first surface 2110_1. The second PCB 2120 may include a fourth surface 2120_1 and a fifth surface 2120_2 facing away from the fourth surface 2120_1. A portion of the third surface 2110_3 of the first PCB 2110 and a portion of the fourth surface 2120_1 of the second PCB 2120 may be coupled together.

In a coupling portion, a conductive line 2125 may be connected with a conductive line 2113 through a connection member 2115 (e.g., a solder ball). Conductive layers 2123 and 2124 may be connected with at least one (e.g., a ground region) of conductive layers 2112 through a connection member 2116 (e.g., a solder ball). The conductive layers 2123 and 2124 may form an electrical shield associated with the conductive line 2125. Some of the connection members 2116 may not be connected with the ground region and may be formed for coupling of the first PCB 2110 and the second PCB 2120.

Figure 22:
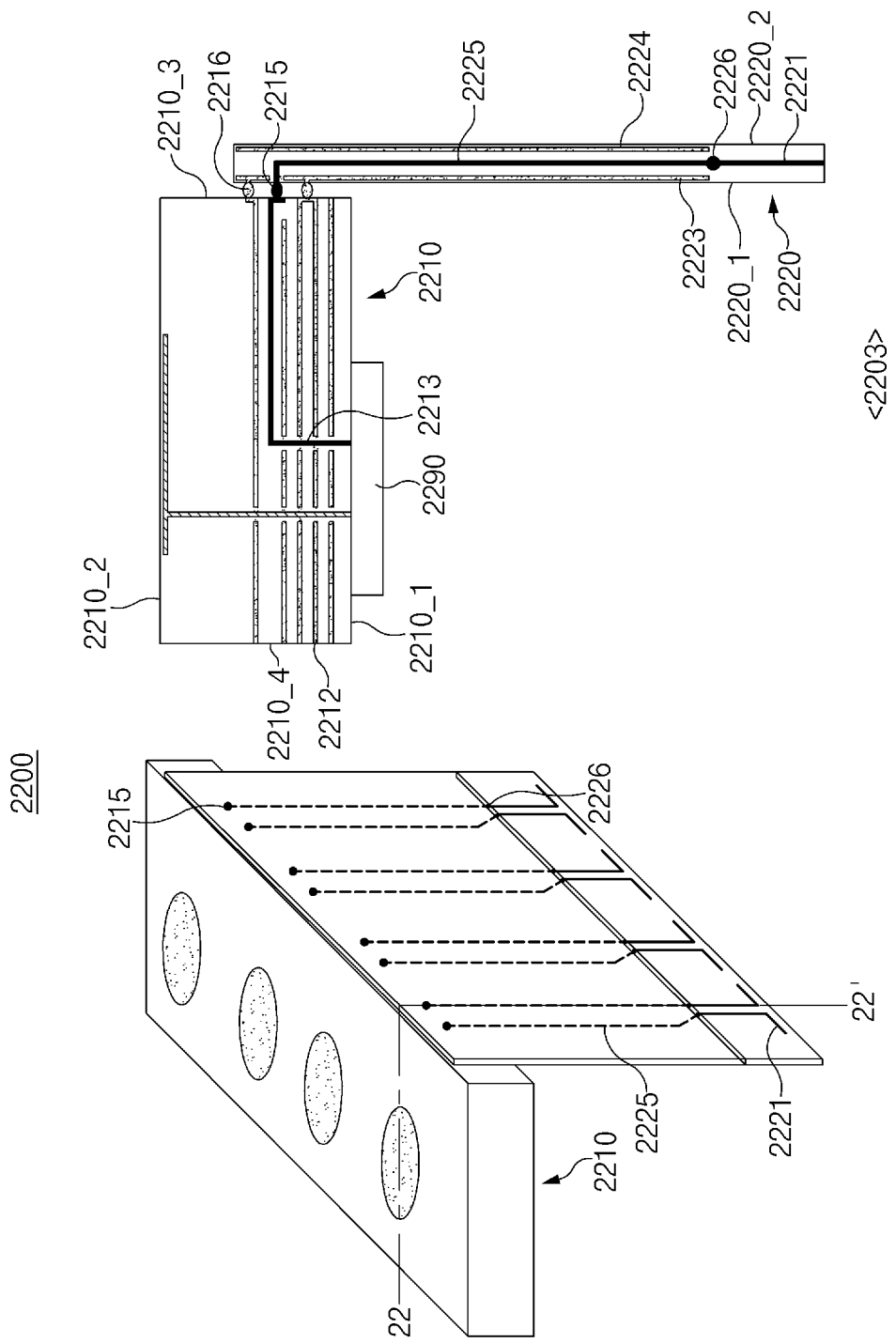
FIG. 22 illustrates an antenna module including a coupling structure of a first PCB and a second PCB according to an embodiment.

FIG. 22 illustrates an antenna module including a coupling structure of a first PCB and a second PCB according to an embodiment. In FIG. 22, reference numeral 2201 indicates a perspective view of the antenna module 2200, and reference numeral 2203 indicates a cross-sectional view of the antenna module 2200 taken along line 22-22'.

Referring to FIG. 22, an antenna module 2200 includes a first PCB 2210 and a second PCB 2220. The antenna module 2200 may be provided in a PCB design manner. At least one of components of FIG. 22 (e.g., the first PCB 2210 or the second PCB 2220) may be identical or similar to at least one of the components of FIG. 19 (e.g., the first PCB 1910 or the second PCB 1920), and thus, additional description will be omitted to avoid redundancy.

The first PCB 2210 may include a first surface 2210_1 and a second surface 2210_2 facing away from the first surface 2210_1. Also, the first PCB 2210 may include a third surface 2210_3 facing a direction different from those of the first surface 2210_1 and the second surface 2210_2. The second PCB 2220 may include a fourth surface 2220_1 and a fifth surface 2220_2 facing away from the fourth surface 2220_1.

At least a portion of the first PCB 2210 and at least a portion of the second PCB 2220 may be connected. For example, a portion of the third surface 2210_3 of the first PCB 2210 and a portion of the fourth surface 2220_1 of the second PCB 2220 may be coupled together.

A conductive line 2213 may be connected with a conductive line 2225 through a connection member 2215 (e.g., a solder ball). The conductive line 2225 may be connected with a feeding part 2226, and the feeding part 2226 may be connected with a conductive pattern 2221. Conductive layers 2223 and 2224 may be connected with at least one (e.g., a ground region) of conductive layers 2212 through a connection member 2216 (e.g., a solder ball). The conductive layers 2223 and 2224 may form an electrical shield associated with the conductive line 2225. Some of the connection members 2216 may not be connected with the ground region and may be formed for coupling of the first PCB 2210 and the second PCB 2220.

Figure 23:
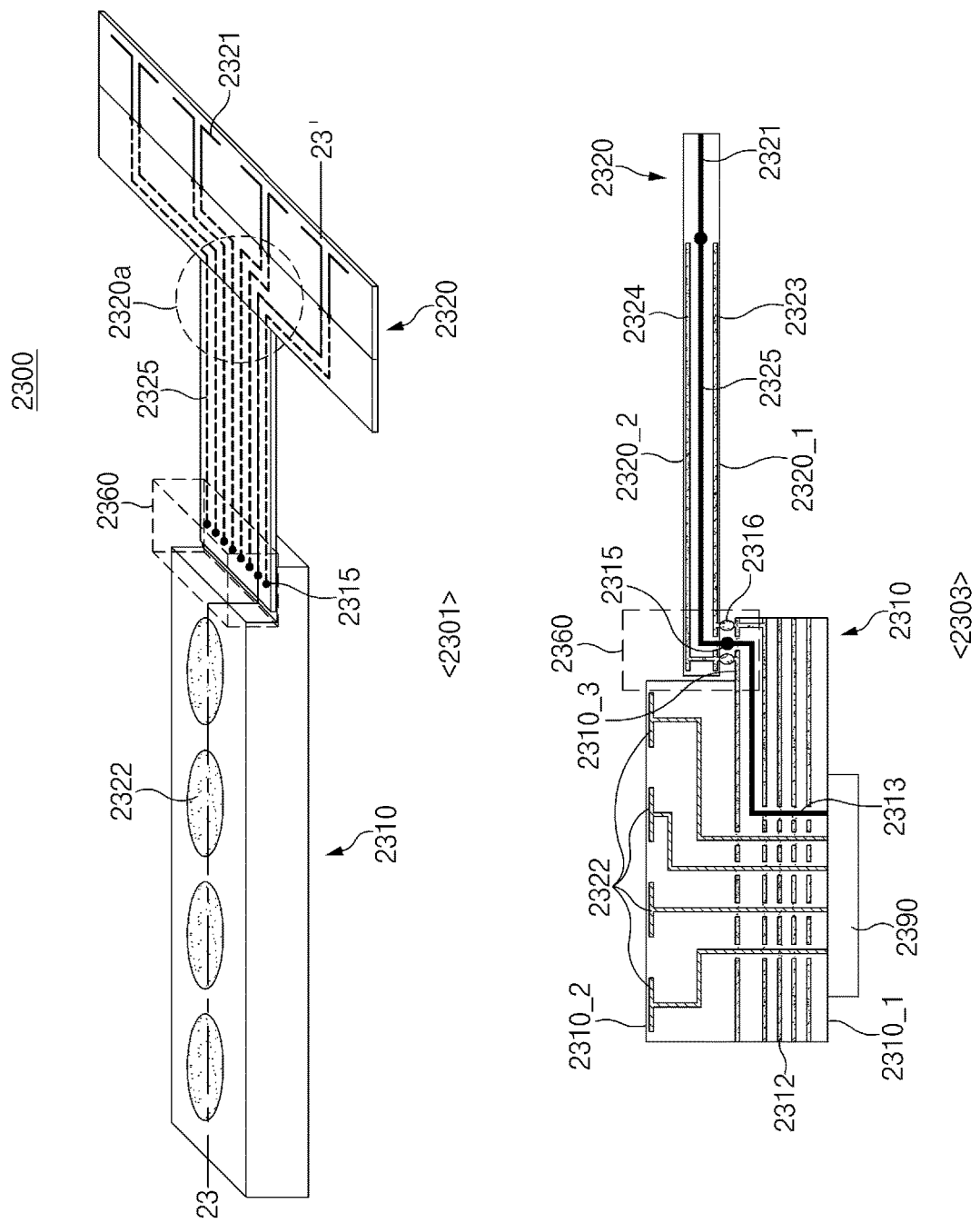
FIG. 23 illustrates an antenna module including a coupling structure of a first PCB and a second PCB according to an embodiment.

FIG. 23 illustrates an antenna module including a coupling structure of a first PCB and a second PCB according to an embodiment. In FIG. 23, reference numeral 2301 indicates a perspective view of the antenna module 2300, and reference numeral 2303 indicates a cross-sectional view of the antenna module 2300 taken along line 23-23'.

Referring to FIG. 23, an antenna module 2300 includes a first PCB 2310 and a second PCB 2320. The antenna module 2300 may be provided in a PCB design manner. At least one of components of FIG. 23 (e.g., the first PCB 2310 or the second PCB 2320) may be identical or similar to at least one of the components of FIG. 21 (e.g., the first PCB 2110 or the second PCB 2120), and thus, additional description will be omitted to avoid redundancy.

At least a portion of the first PCB 2310 and at least a portion of the second PCB 2320 may be connected. For example, the first PCB 2310 may include a first surface 2310_1 and a second surface 2310_2 facing away from the first surface 2310_1. The first PCB 2310 may include a step 2360 at a portion of the second surface 2310_2. The step 2360 may include a third surface 2310_3 facing away from the first surface 2310_1. The second PCB 2320 may include a fourth surface 2320_1 and a fifth surface 2320_2 facing away from the fourth surface 2320_1. A portion of the third surface 2310_3 of the first PCB 2310 and a portion of the fourth surface 2320_1 of the second PCB 2320 may be coupled together.

In a coupling portion, a conductive line 2325 may be connected with a conductive line 2313 through a connection member 2315 (e.g., a solder ball). Conductive layers 2323 and 2324 may be connected with at least one (e.g., a ground region) of conductive layers 2312 through a connection member 2316 (e.g., a solder ball). The conductive layers 2323 and 2324 may form an electrical shield associated with the conductive line 2325.

In the first PCB 2310, the step 2360 may be formed in an arrangement direction of a conductive pattern 2322. A conductive pattern 2321 of the second PCB 2320 may be disposed to protrude from the first PCB 2310 in the same direction as the arrangement direction of the conductive pattern 2322. The conductive pattern 2321 may be arranged in a direction different from the arrangement direction of the conductive pattern 2322.

The conductive line 2325 may be bent at a bent portion 2320a and may be connected with the conductive pattern 2321. The conductive pattern 2321 may be disposed at various locations through the bent portion 2320a regardless of a size of the third surface 2310_3.

Figure 24:
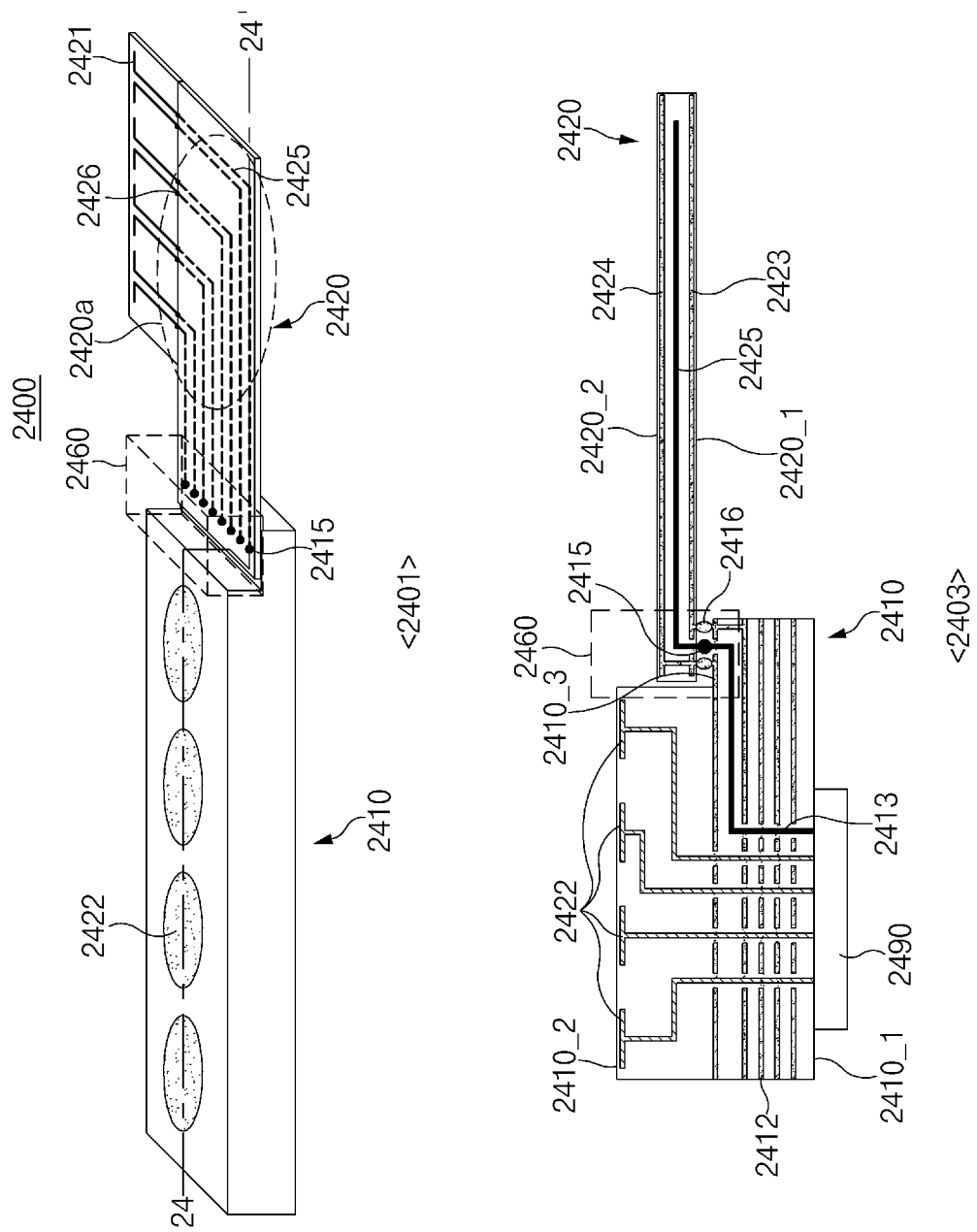
FIG. 24 illustrates an antenna module including a coupling structure of a first PCB and a second PCB according to an embodiment.

FIG. 24 illustrates an antenna module including a coupling structure of a first PCB and a second PCB according to an embodiment. In FIG. 24, reference numeral 2401 indicates a perspective view of the antenna module 2400, and reference numeral 2403 indicates a cross-sectional view of the antenna module 2400 taken along line 24-24'.

Referring to FIG. 24, an antenna module 2400 includes a first PCB 2410 and a second PCB 2420. The antenna module 2400 may be provided in a PCB design manner. At least one of components of FIG. 24 (e.g., the first PCB 2410 or the second PCB 2420) may be identical or similar to at least of the components of FIG. 23 one (e.g., the first PCB 2310 or the second PCB 2320), and thus, additional description will be omitted to avoid redundancy.

At least a portion of the first PCB 2410 and at least a portion of the second PCB 2420 may be connected. For example, the first PCB 2410 may include a first surface 2410_1 and a second surface 2410_2 facing away from the first surface 2410_1. The first PCB 2410 may include a step 2460 at a portion of the second surface 2410_2. The step 2460 may include a third surface 2410_3 facing away from the first surface 2410_1. The second PCB 2420 may include a fourth surface 2420_1 and a fifth surface 2420_2 facing away from the fourth surface 2420_1. A portion of the third surface 2410_3 of the first PCB 2410 and a portion of the fourth surface 2420_1 of the second PCB 2420 may be coupled together.

In a coupling portion, a conductive line 2425 may be connected with a conductive line 2413 through a connection member 2415 (e.g., a solder ball). Conductive layers 2423 and 2424 may be connected with at least one (e.g., a ground region) of conductive layers 2412 through a connection member 2416 (e.g., a solder ball). The conductive layers 2423 and 2424 may form an electrical shield associated with the conductive line 2425.

In the first PCB 2410, the step 2460 may be formed in an arrangement direction of a conductive pattern 2422. A conductive pattern 2421 of the second PCB 2420 may be disposed to protrude from the first PCB 2410 in the same direction as the arrangement direction of the conductive pattern 2422. The conductive pattern 2421 may be arranged in substantially the same direction as the arrangement direction of the conductive pattern 2422.

The conductive line 2425 may be bent at a bent portion 2420a and may be connected with the conductive pattern 2421. The conductive pattern 2421 may be disposed at various locations through the bent portion 2420a, regardless of a size of the third surface 2410_3.

Figure 25:
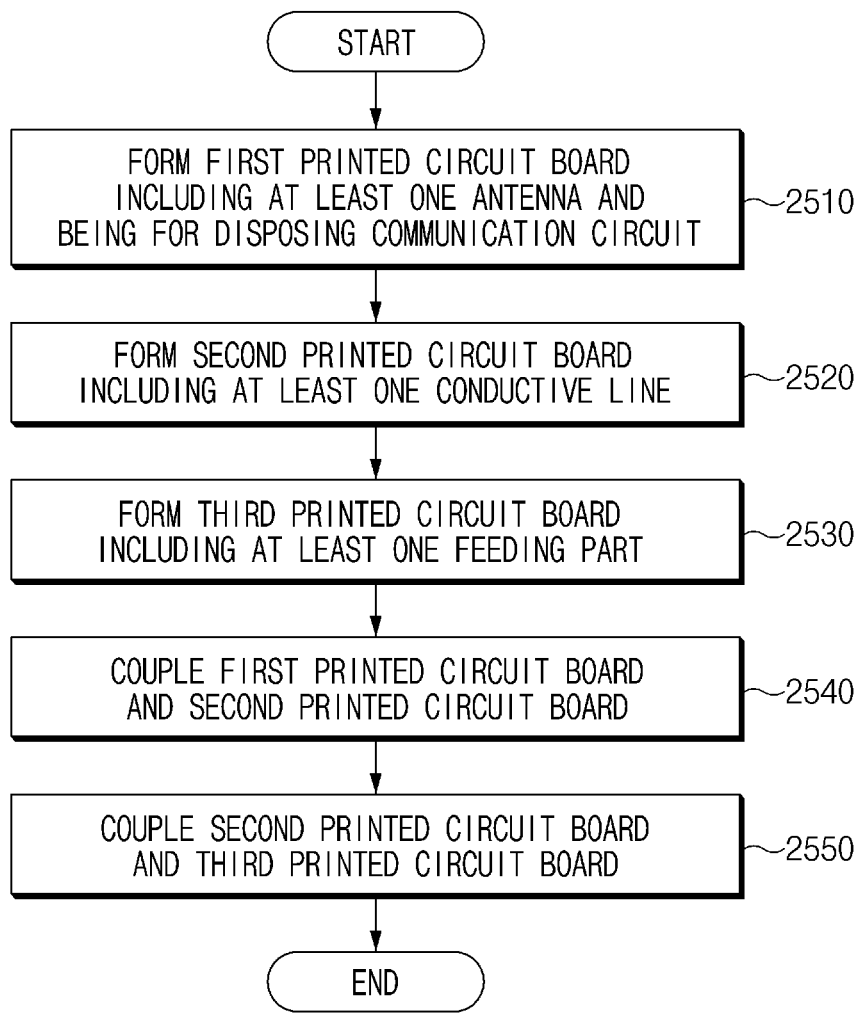
FIG. 25 is a flowchart illustrating a method of manufacturing an antenna module according to an embodiment.

FIG. 25 is a flowchart illustrating a method of manufacturing an antenna module according to an embodiment.

Referring to FIG. 25, in step 2510, a first PCB that includes at least one antenna and is for disposing a communication circuit is formed. The communication circuit may be disposed on one surface of the first PCB. The communication circuit may include an RFIC.

In step 2520, a second PCB including at least one conductive line is formed.

In step 2530, a third PCB including at least one feeding part is formed.

In step 2540, the first PCB and the second PCB are connected through a conductive material, such as solder. For example, the first PCB may include a first surface and a second surface facing an opposite direction of the first surface. The first PCB may include a step at a portion of the second surface. The step may include a third surface facing away from the first surface. The second PCB may include a fourth surface and a fifth surface facing an opposite direction of the fourth surface.

A portion of the third surface of the first PCB and a portion of the fourth surface of the second PCB may be coupled together. The conductive material, such as solder, may be disposed at an overlapping portion between the third surface and the fourth surface and may electrically connect the first PCB and the second PCB. A communication circuit may be disposed on the first surface of the first PCB.

In step 2550, the second PCB and the third PCB are connected through a conductive material, such as solder. For example, the third PCB may include a sixth surface and a seventh surface facing an opposite direction of the sixth surface.

A portion of the fifth surface of the second PCB and a portion of the sixth surface of the third PCB may be coupled together. The conductive material, such as solder, may be disposed at an overlapping portion between the fifth surface and the sixth surface and may electrically connect the second PCB and the third PCB.

Figure 26A:
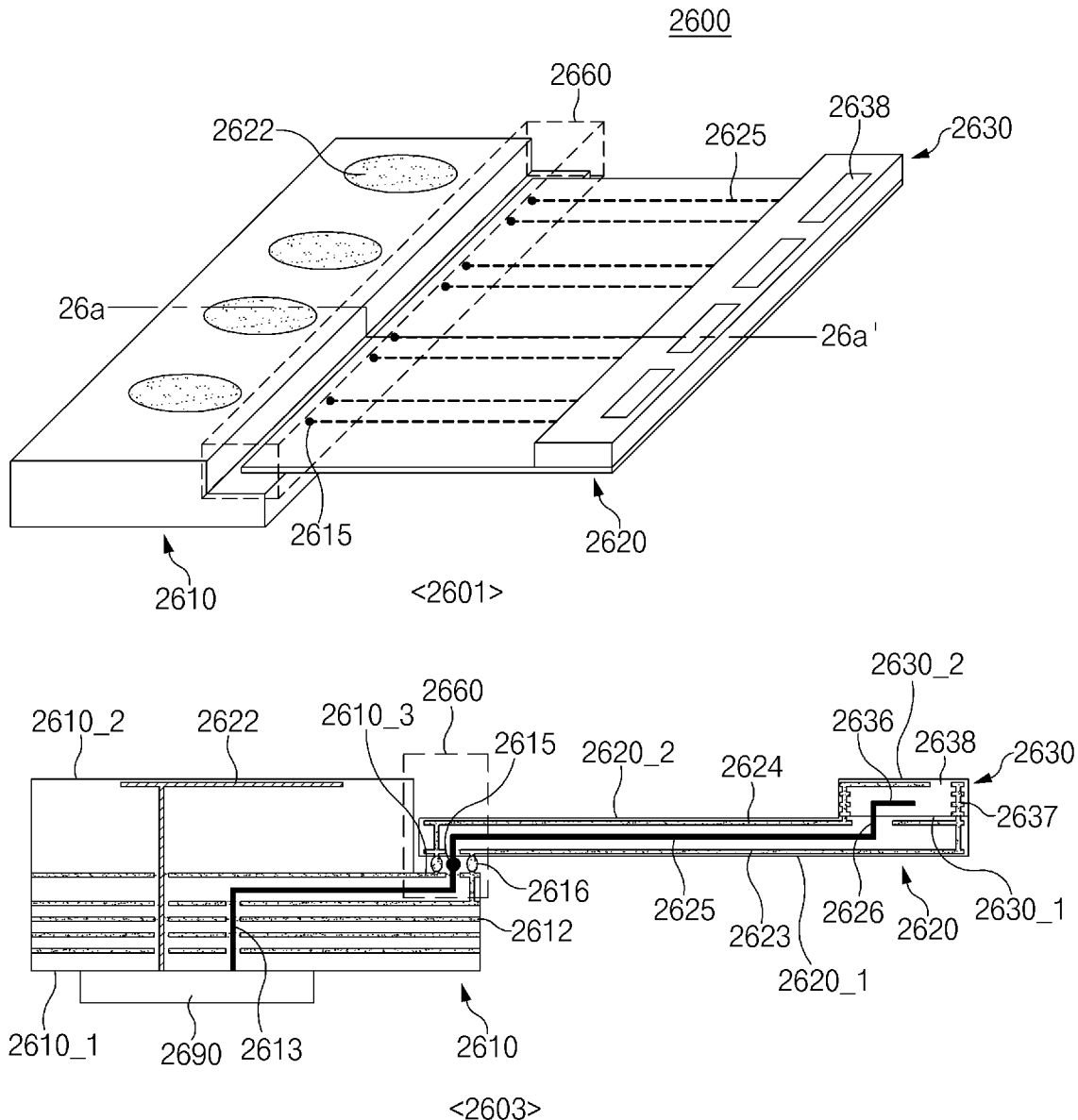
FIG. 26A illustrates an antenna module including a coupling structure of a first PCB, a second PCB, and a third PCB according to an embodiment.

FIG. 26A illustrates an antenna module including a coupling structure of a first PCB, a second PCB, and a third PCB according to an embodiment. In FIG. 26A, reference numeral 2601 indicates a perspective view of the antenna module 2600, and reference numeral 2603 indicates a cross-sectional view of the antenna module 2600 taken along line 26a-26a'.

Referring to FIG. 26A, an antenna module 2600 includes the first PCB 2610, the second PCB 2620, and the third PCB 2630. The antenna module 2600 may be provided in a PCB design manner. At least one of components of FIG. 26A (e.g., the first PCB 2610 or the second PCB 2620) may be identical or similar to at least one of the components of FIG. 21 (e.g., the first PCB 2110 or the second PCB 2120), and thus, additional description will be omitted to avoid redundancy.

At least a portion of the first PCB 2610 and at least a portion of the second PCB 2620 may be connected. For example, the first PCB 2610 may include the first surface 2610_1 and the second surface 2610_2 facing away from the first surface 2610_1. The first PCB 2610 may include a step 2660 at a portion of the second surface 2610_2. The step 2660 may include the third surface 2610_3 facing away from the first surface 2610_1. The second PCB 2620 may include the fourth surface 2620_1 and the fifth surface 2620_2 facing away from the fourth surface 2620_1. A portion of the third surface 2610_3 of the first PCB 2610 and a portion of the fourth surface 2620_1 of the second PCB 2620 may be coupled together.

In a coupling portion, a conductive line 2625 may be connected with a conductive line 2613 through the connection member 2615 (e.g., a solder ball). Conductive layers 2623 and 2624 may be connected with at least one (e.g., a ground region) of conductive layers 2612 through the connection member 2616 (e.g., a solder ball). The conductive layers 2623 and 2624 may form an electrical shield associated with the conductive line 2625.

At least a portion of the second PCB 2620 and at least a portion of the third PCB 2630 may be connected. For example, the third PCB 2630 may include the sixth surface 2630_1 and the seventh surface 2630_2 facing away from the sixth surface 2630_1. A portion of the fifth surface 2620_2 of the second PCB 2620 and a portion of the sixth surface 2630_1 of the third PCB 2630 may be coupled together.

The third PCB 2630 includes at least one feeding part 2636 and the slit 2638. For example, the feeding part 2636 may be connected with the conductive line 2625 through the connection member 2626. The conductive line 2625 may be connected with the conductive line 2613 through the connection member 2615 (e.g., a solder ball). The communication circuit 2690 may transmit a communication signal to the feeding part 2636 through the conductive line 2613.

The slit 2638 may be connected with a through hole formed in a side member of an electronic device. The slit 2638 and the through hole may be coupled together and may be included in a horn antenna. The communication circuit 2690 may transmit, through the feeding part 2636, a communication signal to the horn antenna including the slit 2638 and the through hole.

Figure 26B:
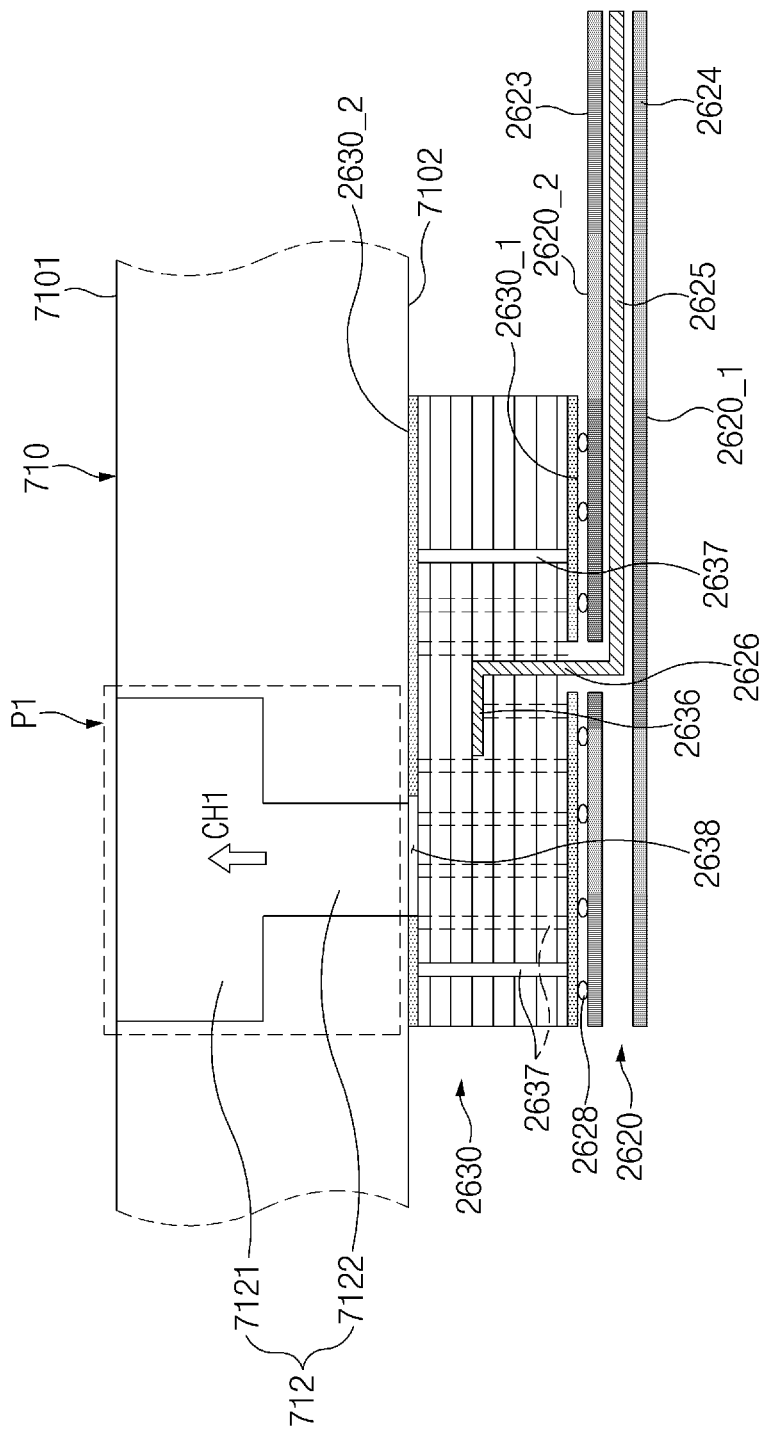
FIG. 26B illustrates a coupling portion of the feeding part and the side member in FIG. 26A, according to an embodiment.

FIG. 26B illustrates a coupling portion of the feeding part 2636 and a side member in FIG. 26A, according to an embodiment.

Referring to FIG. 26B, an electronic device includes a side member 710, at least a portion of which is formed of a conductive material. The second PCB 2620 of the antenna module 2600 may be disposed on the side member 710. The through hole 712 including a first opening 7121 and a second opening 7122 may be formed at a first portion P1 of the side member 710.

The side member 710 includes a first surface 7101 and a second surface 7102, which faces away from the first surface 7101. The second surface 7102 of the side member 710 and a seventh surface 2630-2 of the third PCB 2630 may be disposed in a face-to-face contact manner. In this case, the second opening 7122 of the through hole 712 of the side member 710 and the slit 2638 of the third PCB 2630 may face each other.

The slit 2638 may have substantially the same size and shape as the second opening 7122. The communication circuit 2690 may be configured to transmit and/or receive a signal having a frequency in a range from 3 GHz to 100 GHz through the conductive line 2625, the slit 2638 electrically sealed by a plurality of conductive vias 2637 of the third PCB 2630, and the through hole 712 of the side member 710 connected therewith.

The second PCB 2620 and the third PCB 2630 may be coupled through at least one connection member 2628. For example, some of the connection members 2628 may be connected with a ground region (e.g., some of the conductive layers 2623 and 2624). At least one dummy pattern that is coupled to the connection member 2628 may be disposed on the fifth surface 2620_2 of the second PCB 2620 and the sixth surface 2630_1 of the third PCB 2630. Some of the connection members 2628 may not be connected with any feeding part or ground region and may be used only for coupling of the second PCB 2620 and the third PCB 2630 (e.g., used as an adhesive member for adhesion of the second PCB 2620 to the third PCB 2630).

Figure 26C:
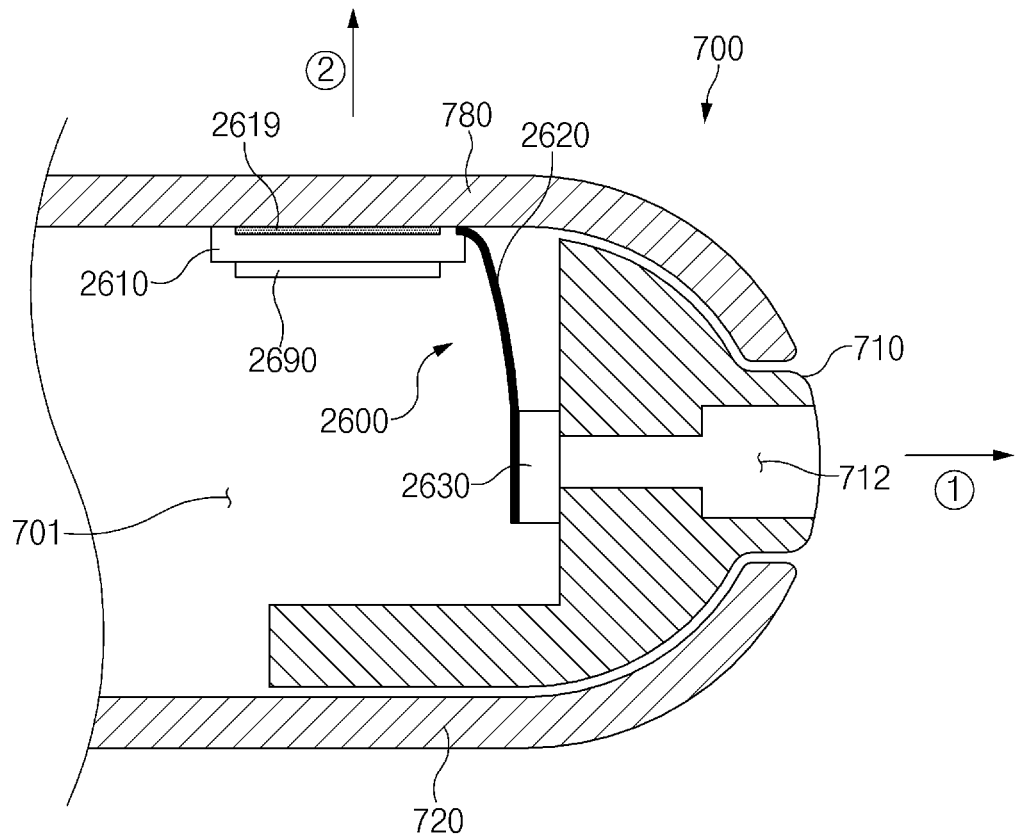
FIG. 26C illustrates the feeding part of FIG. 26A disposed in an electronic device, according to an embodiment.

FIG. 26C illustrates a feeding part of FIG. 26A is disposed in an electronic device, according to an embodiment.

Referring to FIG. 26C, the electronic device 700 includes the front plate 720 (or a first plate), the back plate 780 (or a second plate) facing away from the front plate 720, and the side member 710 surrounding a space 701 between the front plate 720 and the back plate 780. The side member 710 may include the through hole 712 as a portion of a horn waveguide structure.

The antenna module 2600 may include the third PCB 2630 disposed to be in contact with the side member 710, the first PCB 2610 disposed to be spaced from the third PCB 2630, and the second PCB 2620 connecting the first PCB 2610 and the third PCB 2630, in the inner space 701 of the electronic device 700. A slit may be formed on one surface of the third PCB 2630, and the slit may be in contact with the side member 710 to face the through hole 712. The first PCB 2610 may include the conductive pattern 2622 disposed on one surface thereof, and the communication circuit 2690 disposed on a surface thereof, which faces way from the one surface.

Through the second PCB 2620 implemented with an FPCB, the first PCB 2610 and the third PCB 2630 may be disposed in different directions. For example, the first PCB 2610 may be disposed in a direction parallel to the back plate 780. Accordingly, the antenna module 2600 may form a beam pattern in a lateral direction (i.e., direction ①) through the slit of the third PCB 2630 and the through hole 712 and/or may form a beam pattern in a direction (i.e., direction ②), which the back plate 780 faces, through the conductive pattern 2622.

Figure 27:
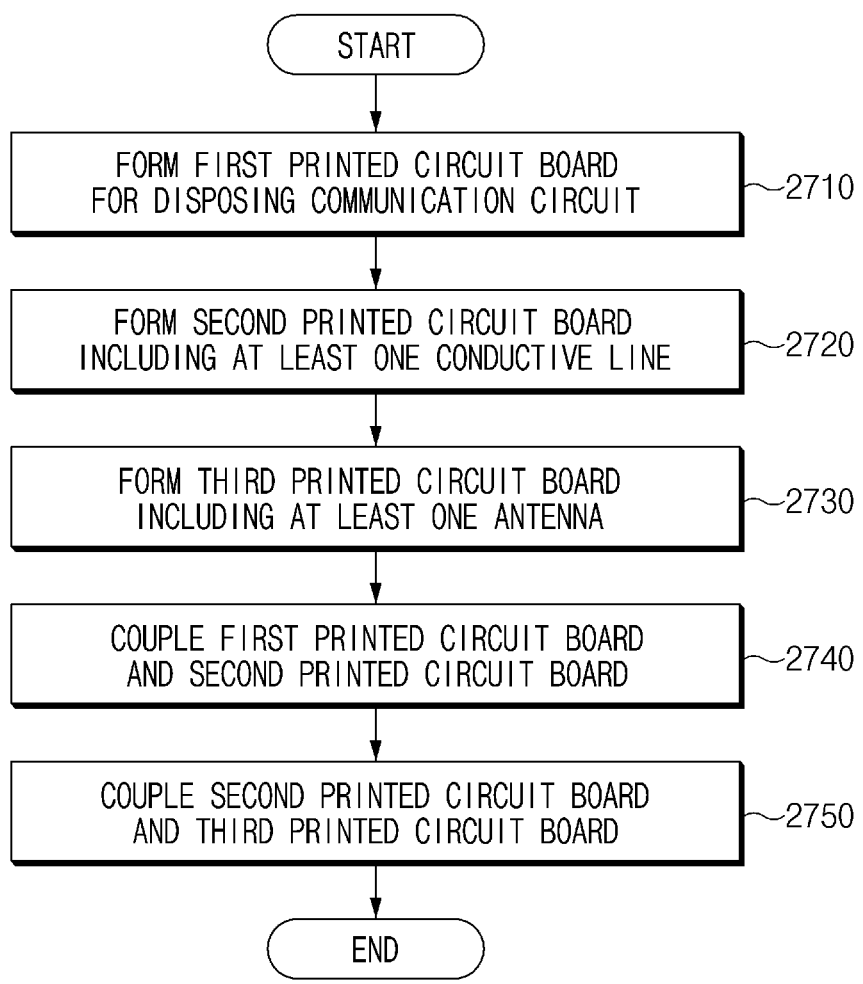
FIG. 27 is a flowchart illustrating a method of manufacturing an antenna module according to an embodiment.

FIG. 27 is a flowchart illustrating a method of manufacturing an antenna module according to an embodiment.

Referring to FIG. 27, in step 2710, a first PCB for disposing a communication circuit is formed. The communication circuit may be disposed on one surface of the first PCB. The communication circuit may include an RFIC.

In step 2720, a second PCB including at least one conductive line is formed.

In step 2730, a third PCB including at least one antenna is formed.

In step 2740, the first PCB and the second PCB are connected through a conductive material, such as solder. For example, the first PCB may include a first surface and a second surface, which faces away from the first surface. The second PCB may include a third surface and a fourth surface, which faces away from the third surface.

A portion of the second surface of the first PCB and a portion of the third surface of the second PCB may be coupled together. The conductive material, such as solder, may be disposed at an overlapping portion between the second surface and the third surface and may electrically connect the first PCB and the second PCB. A communication circuit may be disposed on the first surface of the first PCB.

In step 2750, the second PCB and the third PCB are connected through a conductive material, such as solder. For example, the third PCB may include a fifth surface and a sixth surface, which faces away from the fifth surface.

A portion of the fourth surface of the second PCB and a portion of the fifth surface of the third PCB may be coupled together. The conductive material may be disposed at an overlapping portion between the fourth surface and the fifth surface and may electrically connect the second PCB and the third PCB.

Figure 28A:
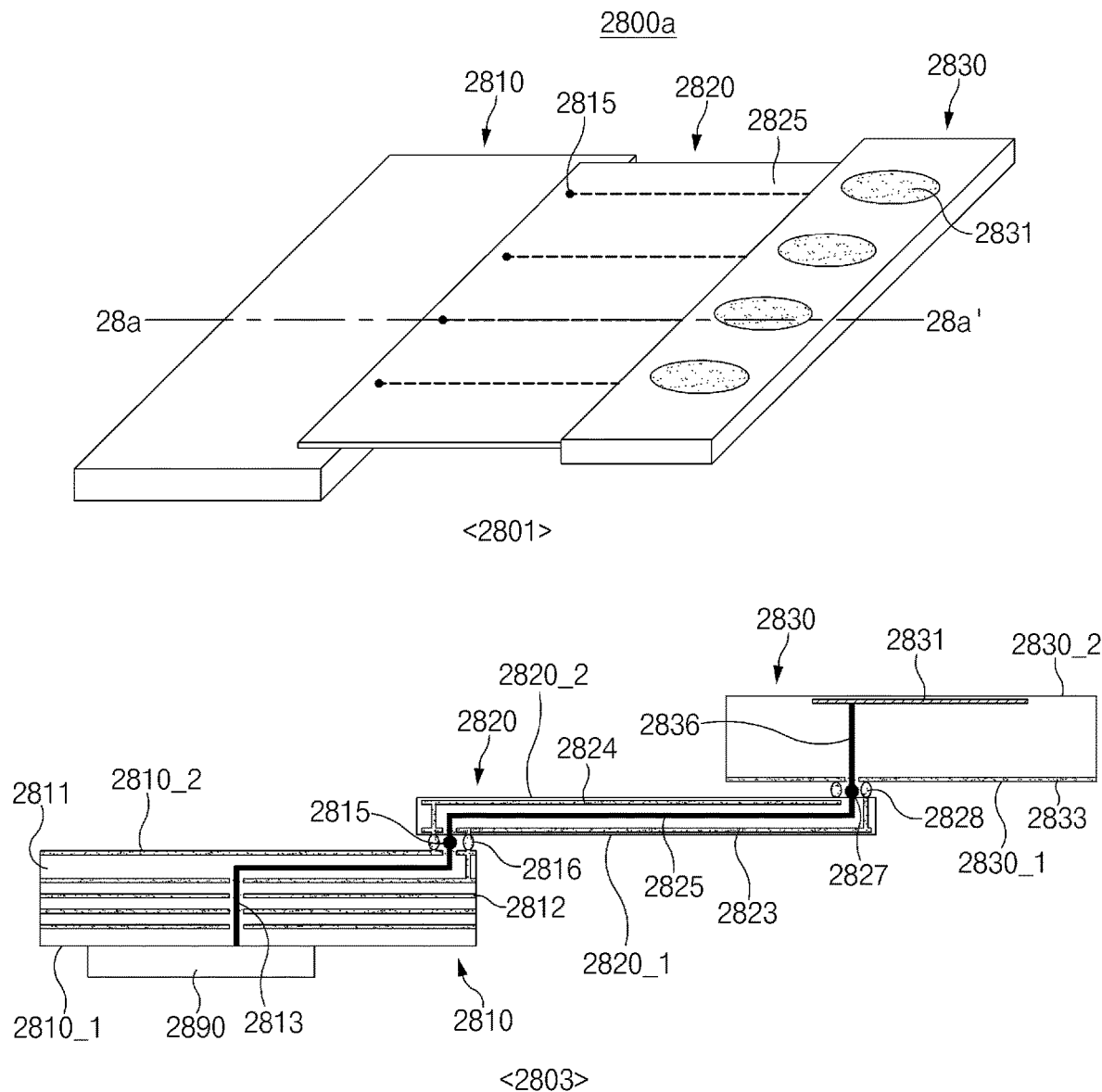
FIG. 28A illustrates an antenna module including a coupling structure of a first PCB, a second PCB, and a third PCB according to an embodiment.

FIG. 28A illustrates an antenna module including a coupling structure of a first PCB, a second PCB, and a third PCB according to an embodiment. In FIG. 28A, reference numeral 2801 indicates a perspective view of the antenna module 2800a, and reference numeral 2803 indicates a cross-sectional view of the antenna module 2800a taken along line 28a-28a''.

Referring to FIG. 28A, an antenna module 2800a includes a first PCB 2810, a second PCB 2820, and a third PCB 2830. The antenna module 2800a may be provided in a PCB design manner.

The first PCB 2810 (e.g., a rigid PCB) includes at least one insulating layer (or dielectric layer) 2811, at least one conductive layer 2812, and at least one conductive line 2813.

The insulating layer (or dielectric layer) 2811 and the conductive layer 2812 may be alternately stacked. For example, an operation in which a specific insulating layer (or dielectric layer) 2811 is formed, a conductive layer 2812 is formed on the specific insulating layer (or dielectric layer) 2811, and an insulating layer (or dielectric layer) 2811 is again formed on the conductive layer 2812 may be repeated a number of times. The number of insulating layers (or dielectric layers) 2811 and the number of conductive layers 2812 may be different.

The second PCB 2820 (e.g., an FPCB) may be formed of a material different from that of the first PCB 2810. The second PCB 2820 includes conductive layers 2823 and 2824 and at least one conductive line 2825.

The third PCB 2830 (e.g., a rigid PCB) may be formed of substantially the same material as the first PCB 2810. The third PCB 2830 includes at least one conductive line 2836 and at least one conductive pattern 2831 (e.g., a patch antenna).

At least a portion of the first PCB 2810 and at least a portion of the second PCB 2820 may be connected. For example, the first PCB 2810 may include the first surface 2810_1 and the second surface 2810_2 facing away from the first surface 2810_1. The second PCB 2820 may include the third surface 2820_1 and the fourth surface 2820_2 facing away from the third surface 2820_1. A portion of the second surface 2810_2 of the first PCB 2810 and a portion of the third surface 2820_1 of the second PCB 2820 may be coupled together.

In a coupling portion, the conductive line 2825 may be connected with the conductive line 2813 through a connection member 2815 (e.g., a solder ball). The conductive layers 2823 and 2824 may be connected with at least one (e.g., a ground region) of the conductive layers 2812 through the connection member 2816 (e.g., a solder ball). The conductive layers 2823 and 2824 may form an electrical shield associated with the conductive line 2825. Some of the connection members 2816 may not be connected with the ground region and may be formed for coupling of the first PCB 2810 and the second PCB 2820.

A coupling portion of the first PCB 2810 and the second PCB 2820 may be formed depending on the way to couple PCBs, e.g., described above with reference to FIGS. 10A to 10D.

At least a portion of the second PCB 2820 and at least a portion of the third PCB 2830 may be connected. For example, the third PCB 2830 may include the fifth surface 2830_1 and the sixth surface 2830_2 facing away from the fifth surface 2830_1. A portion of the fourth surface 2820_2 of the second PCB 2820 and a portion of the fifth surface 2830_1 of the third PCB 2830 may be coupled together.

In a coupling portion, a feeding part 2836 may be connected with the conductive line 2825 through a connection member 2827 (e.g., a solder ball). The second PCB 2820 and the third PCB 2830 may be coupled through at least one connection member 2828.

At least one dummy pattern that is coupled to the connection member 2828 may be disposed on the fourth surface 2820_2 of the second PCB 2820 and the fifth surface 2830_1 of the third PCB 2830. Some of the connection members 2828 may be connected with a ground region (e.g., some of the conductive layers 2812), or some of the connection members 2828 may not be connected with any feeding part or ground region and may be used only for coupling of the second PCB 2820 and the third PCB 2830 (e.g., used as an adhesive member for adhesion of the second PCB 2820 to the third PCB 2830).

The communication circuit 2890 may be disposed on the first surface 2810_1 of the first PCB 2810. The communication circuit 2890 may transmit a communication signal to the conductive pattern 2831 through the conductive lines 2813 and 2825 and the feeding part 2836.

Figure 28B:
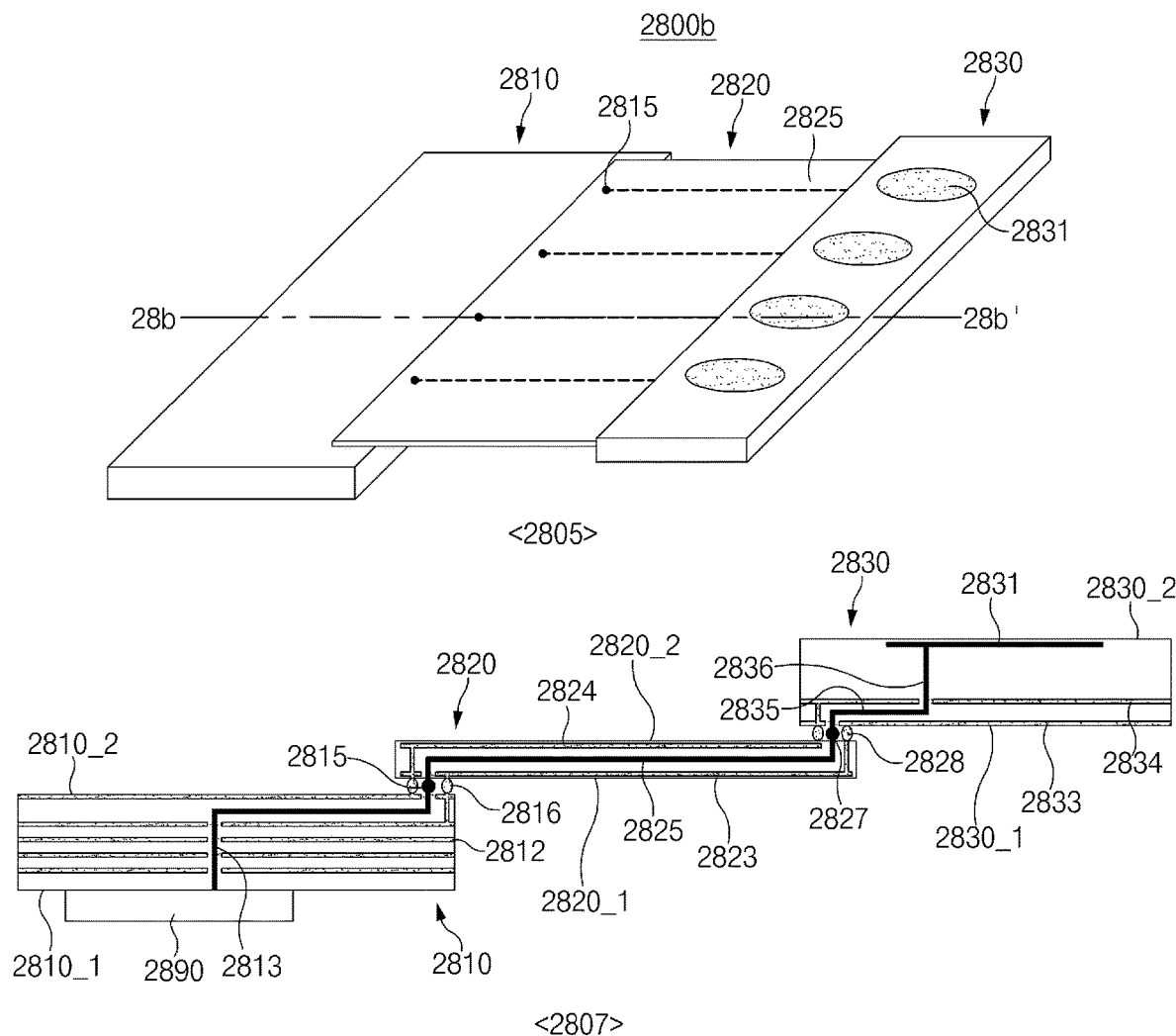
FIG. 28B illustrates an antenna module including a coupling structure of a first PCB, a second PCB, and a third PCB according to an embodiment.

FIG. 28B illustrates an antenna module including a coupling structure of a first PCB, a second PCB, and a third PCB according to an embodiment. In FIG. 28B, reference numeral 2805 indicates a perspective view of the antenna module 2800b, and reference numeral 2807 indicates a cross-sectional view of the antenna module 2800b taken along line 28b-28b'.

Referring to FIG. 28B, an antenna module 2800b includes the first PCB 2810, the second PCB 2820, and the third PCB 2830. The antenna module 2800b may be provided in a PCB design manner. At least one of components of FIG. 28B (e.g., the first PCB 2810 or the second PCB 2820) may be identical or similar to at least one of the components of FIG. 28A (e.g., the first PCB 2810 or the second PCB 2820), and thus, additional description will be omitted to avoid redundancy.

The third PCB 2830 (e.g., a rigid PCB) includes a conductive line 2835, at least one feeding part 2836, and at least one conductive pattern 2831 (e.g., a patch antenna). At least a portion of the second PCB 2820 and at least a portion of the third PCB 2830 may be connected. For example, the feeding part 2836 may be connected with the conductive line 2835 through the connection member 2827 (e.g., a solder ball). The second PCB 2820 and the third PCB 2830 may be coupled through at least one connection member 2828.

Some of the connection members 2828 may be connected with at least one conductive layer 2833 or 2834, or some of the connection members 2828 may be connected with a ground region (e.g., some of the conductive layers 2812). The conductive layers 2833 and 2834 may form an electrical shield associated with the conductive line 2835.

At least one dummy pattern that is coupled to some of the connection members 2828 may be disposed on the fourth surface 2820_2 of the second PCB 2820 and the fifth surface 2830_1 of the third PCB 2830. Some of the connection members 2828 may not be connected with any feeding part or ground region and may be used only for coupling of the second PCB 2820 and the third PCB 2830 (e.g., used as an adhesive member for adhesion of the second PCB 2820 to the third PCB 2830).

Figure 29A:
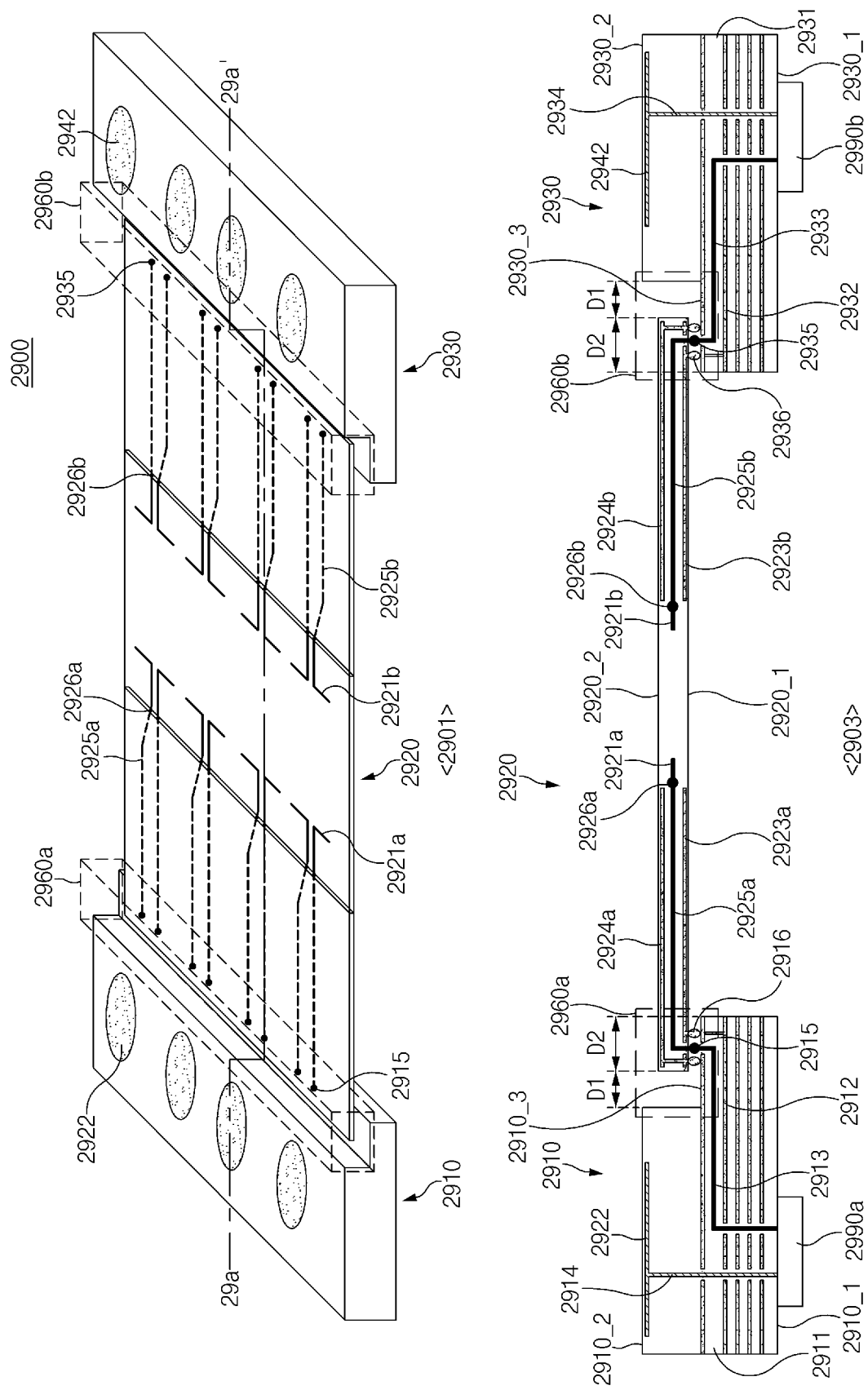
FIG. 29A illustrates an antenna module in which two rigid PCBs are connected through one FPCB, according to an embodiments.

FIG. 29A illustrates an antenna module in which two rigid PCBs are connected through one FPCB, according to an embodiment. In FIG. 29A, reference numeral 2901 indicates a perspective view of the antenna module 2900, and reference numeral 2903 indicates a cross-sectional view of the antenna module 2900 taken along line 29a-29a'.

Referring to FIG. 29A, an antenna module 2900 includes a first PCB 2910, a second PCB 2920, and a third PCB 2930. The antenna module 2900 may be provided in a PCB design manner.

The first PCB 2910 (e.g., a rigid PCB) includes at least one insulating layer (or dielectric layer) 2911, at least one conductive layer 2912, at least one conductive line 2913, at least one conductive line 2914, and at least one conductive pattern 2922 (e.g., a patch antenna). The conductive line 2913 or the conductive line 2914 may be disposed to penetrate some of the at least one insulating layer (or dielectric layer) 2911 and the at least one conductive layer 2912.

The insulating layer (or dielectric layer) 2911 and the conductive layer 2912 may be alternately stacked. For example, an operation in which a specific insulating layer (or dielectric layer) 2911 is formed, a conductive layer 2912 is formed on the specific insulating layer (or dielectric layer) 2911, and an insulating layer (or dielectric layer) 2911 is again formed on the conductive layer 2912 may be repeated a number of times. The number of insulating layers (or dielectric layers) 2911 and the number of conductive layers 2912 may be different.

The second PCB 2920 (e.g., an FPCB) may be formed of a material different from that of the first PCB 2910. The second PCB 2920 includes at least one conductive pattern 2921a (e.g., a dipole antenna), at least one feeding part 2926a, conductive layers 2923a or 2924a, and at least one conductive line 2925a. The second PCB 2920 may be disposed to protrude from the first PCB 2910.

At least a portion of the first PCB 2910 and at least a portion of the second PCB 2920 may be connected. For example, the first PCB 2910 may include a first surface 2910_1 and a second surface 2910_2 facing away from the first surface 2910_1. The first PCB 2910 may include a step 2960a at a portion of the second surface 2910_2. The step 2960a may include a third surface 2910_3 facing away from the first surface 2910_1. The second PCB 2920 may include a fourth surface 2920_1 and a fifth surface 2920_2 facing away from the fourth surface 2920_1. A portion of the third surface 2910_3 of the first PCB 2910 and a portion of the fourth surface 2920_1 of the second PCB 2920 may be coupled together.

In a coupling portion, the conductive line 2925a may be connected with the conductive line 2913 through a connection member 2915 (e.g., a solder ball). The conductive layers 2923a and 2924a may be connected with at least one (e.g., a ground region) of the conductive layers 2912 through a connection member 2916 (e.g., a solder ball). The conductive layers 2923a and 2924a may form an electrical shield associated with the conductive line 2925a. Some of the connection members 2916 may not be connected with the ground region and may be formed for coupling of the first PCB 2910 and the second PCB 2920.

A coupling portion of the first PCB 2910 and the second PCB 2920 may be disposed to have a specific distance. For example, the second PCB 2920 may be disposed to be spaced from one end of the second surface 2910_2 as much as a first distance D1 (e.g., about 1 mm) or more. The second PCB 2920 may be disposed to overlap the first PCB 2910 as much as a second distance D2 (e.g., about 1.2 mm or W1 of FIG. 10A) or more.

A communication circuit 2990a may be disposed on the first surface 2910_1 of the first PCB 2910. For example, the conductive pattern 2921a may be connected with the feeding part 2926a. The feeding part 2926a may be connected with the conductive line 2925a. The conductive line 2925a may be connected with the conductive line 2913 through the connection member 2915. The communication circuit 2990a may transmit/receive a communication signal through the conductive lines (or feeding line) 2913, 2915, 2925a, and 2921a (e.g., the transmission line 423). The conductive pattern 2922 may be connected with the conductive line 2914. The communication circuit 2990a may transmit/receive a communication signal through the conductive lines (or feeding line) 2914 and 2922.

The third PCB 2930 (e.g., a rigid PCB) may be formed of substantially the same material as the first PCB 2910. A structure of the third PCB 2930 may be identical or similar to the structure of the first PCB 2910. For example, the third PCB 2930 includes at least one insulating layer (or dielectric layer) 2931, at least one conductive layer 2932, a conductive line 2933, and at least one conductive pattern 2942. The conductive line 2933 or a conductive line 2934 may be disposed to penetrate some of the at least one insulating layer (or dielectric layer) 2931 and the at least one conductive layer 2932.

The insulating layer (or dielectric layer) 2931 and the conductive layer 2932 may be alternately stacked. For example, an operation in which a specific insulating layer (or dielectric layer) 2931 is formed, a conductive layer 2932 is formed on the specific insulating layer (or dielectric layer) 2931, and an insulating layer (or dielectric layer) 2931 is again formed on the conductive layer 2932 may be repeated a number of times. The number of insulating layers (or dielectric layers) 2931 and the number of conductive layers 2932 may be different.

At least a portion of the third PCB 2930 and at least a portion of the second PCB 2920 may be connected. For example, the third PCB 2930 may include a sixth surface 2930_1 and a seventh surface 2930_2 facing away from the sixth surface 2930_1. The third PCB 2930 may include a step 2960b at a portion of the seventh surface 2930_2. The step 2960b may include an eighth surface 2930_3 facing away from the sixth surface 2930_1. A portion of the eighth surface 2930_3 of the third PCB 2930 and a portion of the fourth surface 2920_1 of the second PCB 2920 may be coupled together.

In a coupling portion, a conductive line 2925b may be connected with the conductive line 2933 through a connection member 2935 (e.g., a solder ball). Conductive layers 2923b and 2924b may be connected with at least one (e.g., a ground region) of the conductive layers 2932 through a connection member 2936 (e.g., a solder ball). The conductive layers 2923b and 2924b may form an electrical shield associated with the conductive line 2925b. Some of the connection members 2936 may not be connected with the ground region and may be formed for coupling of the third PCB 2930 and the second PCB 2920.

A coupling portion of the third PCB 2930 and the second PCB 2920 may be disposed to have a specific distance. For example, the second PCB 2920 may be disposed to be spaced from one end of the seventh surface 2930_2 as much as the first distance D1 (e.g., about 1 mm) or more. The second PCB 2920 may be disposed to overlap the third PCB 2930 as much as the second distance D2 or more.

A communication circuit 2990b may be disposed on the sixth surface 2930_1 of the third PCB 2930. For example, a conductive pattern 2921b may be connected with a feeding part 2926b. The feeding part 2926b may be connected with the conductive line 2925b. The conductive line 2925b may be connected with the conductive line 2933 through the connection member 2935. The communication circuit 2990b may transmit/receive a communication signal through the conductive lines (or feeding line) 2933, 2935, 2925b, and 2921b. The conductive pattern 2942 may be connected with the conductive line 2934. The communication circuit 2990b may transmit/receive a communication signal through the conductive lines (or feeding line) 2934 and 2942.

The communication circuit 2990a and the communication circuit 2990b may transmit communication signals in the same or similar frequency bands, or the communication circuit 2990a may transmit a communication signal in a frequency band different from that of the communication circuit 2990b.

The first PCB 2910 or the third PCB 2930 may not include the conductive pattern 2922 or the conductive pattern 2942.

Figure 29B:
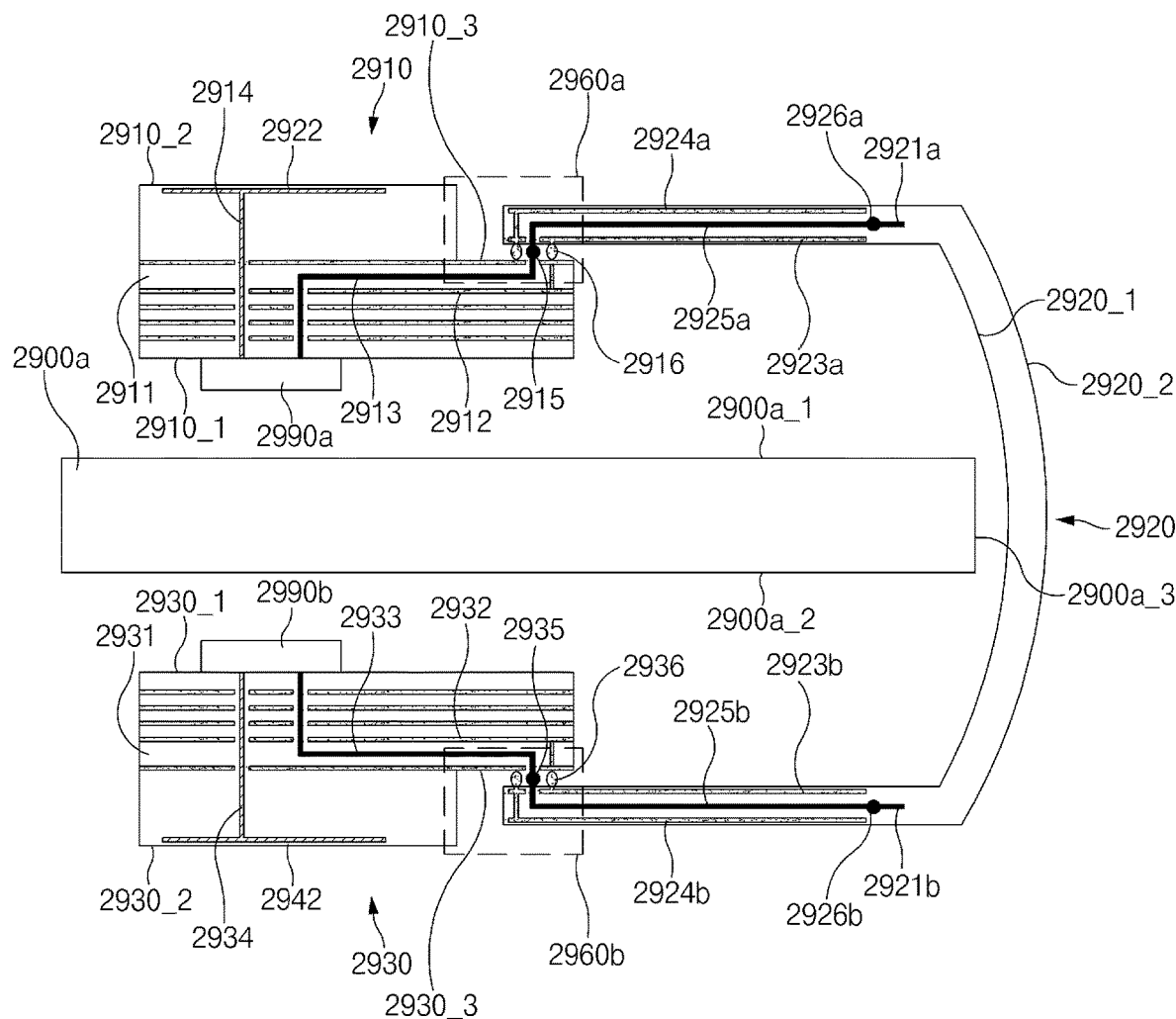
FIG. 29B illustrates the antenna module of FIG. 29A disposed within an electronic device, according to an embodiments.

FIG. 29B illustrates the antenna module of FIG. 29A is disposed within an electronic device, according to an embodiment.

Referring to FIG. 29B, an electronic part 2900a disposed in an electronic device includes a first surface 2900a_1 and a second surface 2900a_2 facing away from the first surface 2900a_1. The electronic part 2900a may include a third surface 2900a_3 that faces a direction different from those of the first surface 2900a_1 and the second surface 2900a_2.

The antenna module 2900 may be disposed to face three different surfaces. For example, the first surface 2910_1 of the first PCB 2910 may be disposed to face the first surface 2900a_1 of the electronic part 2900a. A portion of the fourth surface 2920_1 of the second PCB 2920 may be disposed to face the first surface 2900a_1 of the electronic part 2900a. The second PCB 2920 may be disposed to be bent at one end of the electronic part 2900a. A portion of the fourth surface 2920_1 of the second PCB 2920 may be disposed to face the third surface 2900a_3 of the electronic part 2900a. A portion of the fourth surface 2920_1 of the second PCB 2920 may be disposed to face the second surface 2900a_2 of the electronic part 2900a. The sixth surface 2930_1 of the third PCB 2930 may be disposed to face the second surface 2900a_2 of the electronic part 2900a. Accordingly, the conductive patterns 2921a, 2921b, 2922, and 2942 included in the antenna module 2900 may be disposed in various directions while avoiding the electronic part 2900a in a narrow space.

Conductive patterns included in the antenna module 2900 may be disposed to face different directions. For example, the conductive pattern 2922 included in the first PCB 2910 may be disposed to face a front plate, the conductive pattern 2921a or 2921b included in the second PCB 2920 may be disposed to face a side member, and the conductive pattern 2942 included in the third PCB 2930 may be disposed to face a back plate.

According to an embodiment, an electronic device may include a housing, a first plate that is positioned on a front surface of the housing, a second plate that is positioned on a back surface of the housing, and an antenna module that is disposed between the first plate and the second plate. The antenna module may include a first PCB, a second PCB that has a material different from that of the first PCB, at least a portion of the second PCB being coupled to one surface of the first PCB in an overlapping region, a first conductive line that is included in the first PCB, a second conductive that is included in the second PCB, a first conductive pattern that is disposed at the second PCB and is connected with the second conductive line, a first connection member that connects the first conductive line and the second conductive line, in the overlapping region, and a second connection member that couples the first PCB and the second PCB, in the overlapping region.

The electronic device may further include a wireless communication circuit that is disposed on an opposite surface of the first PCB and processes a signal in a specific frequency band, and the first conductive line may be connected with the wireless communication circuit.

The second PCB may include at least one additional conductive line disposed in the same layer as the second conductive line, and the additional conductive line may be connected with a ground region of the first PCB through the second connection member and may form an electrical shield associated with the second conductive line.

The second conductive line or the additional conductive line may be formed of a CPW.

The second PCB may include at least one conductor disposed in a conductive layer different from that of the second conductive line, and the conductor may be connected with a ground region of the first PCB through the second connection member and may form an electrical shield associated with the second conductive line.

The second conductive line may be implemented with a micro strip line or a strip line.

The second PCB may include a first conductive layer disposed under the second conductive line, a second conductive layer including the second conductive line, a third conductive layer disposed over the second conductive line, a first insulating layer disposed between the first conductive layer and the second conductive layer, and a second insulating layer disposed between the second conductive layer and the third conductive layer, and the first conductive layer or the third conductive layer may be connected with a ground region of the first PCB through the second connection member and may form an electrical shield associated with the second conductive line.

The second PCB may include a plurality of guide vias connecting the first conductive layer and the third conductive layer, and the plurality of guide vias may be arranged on opposite sides of the second conductive line with specific distances.

The first PCB may further include a first signal pad connected with the first conductive line, and at least one first guide pad disposed to surround a periphery of the first signal pad, the second PCB may further include a second signal pad connected with the second conductive line, and at least one second guide pad disposed to surround a periphery of the second signal pad, the first signal pad and the second signal pad may be coupled through the first connection member, and the first guide pad and the second guide pad may be coupled through the second connection member.

The first PCB may further include at least one first dummy pad disposed in the overlapping region with a specific distance, the second PCB may further include at least one second dummy pad disposed in the overlapping region with the specific distance, and the first dummy pad and the second dummy pad may be coupled through a third connection member.

The guide pad may be connected with a ground region of the first PCB, and the first dummy pad may not be connected with the ground region.

The first PCB may include a third conductive line connected with the wireless communication circuit, and a second conductive pattern connected with the third conductive line, and the second conductive pattern may constitute an antenna different in kind from that of the first conductive pattern.

The second conductive pattern may be disposed to face a first direction, and the first conductive pattern may be disposed to face a direction different from the first direction.

The second PCB may be disposed between an electronic part included in the electronic device and the second plate.

The first PCB may include a step, and the first connection member and the second connection member may be disposed at the step.

According to an embodiment, an electronic device may include a housing that includes a first plate, a second plate facing away from the first plate, and a side member surrounding a space between the first plate and the second plate, and an antenna module that is disposed within the housing. The antenna module may include a first PCB, a second PCB that has a material different from that of the first PCB, at least a portion of the second PCB being coupled to one surface of the first PCB in a first overlapping region, and a third PCB, at least a portion of which is coupled to the one surface of the first PCB in a second overlapping region. The first PCB may include a first conductive line connected with the second PCB, and a second conductive line connected with the third PCB. A first conductive pattern disposed at the second PCB may be connected with the first conductive line through a first connection member disposed in the first overlapping region, a second conductive pattern disposed at the third PCB may be connected with the second conductive line through a second connection member disposed in the second overlapping region. The first PCB and the second PCB may be coupled by at least one third connection member disposed to surround a periphery of the first connection member, and the first PCB and the third PCB may be coupled by at least one fourth connection member disposed in the second overlapping region.

The first PCB may further include at least one first dummy pad disposed in the first overlapping region with a specific distance, the second PCB may further include at least one second dummy pad disposed in the first overlapping region with the specific distance, and the first dummy pad and the second dummy pad may be coupled through a fifth connection member.

The third connection member may be connected with a ground region of the first PCB, and the fourth connection member or the fifth connection member may not be connected with the ground region.

The third PCB may be formed of the same material as the first PCB.

The third PCB may be formed of the same material as the second PCB.

It should be understood that various embodiments of the disclosure and terms used in the embodiments do not intend to limit technologies disclosed in the disclosure to the particular forms disclosed herein; rather, the disclosure should be construed to cover various modifications, equivalents, and/or alternatives of embodiments of the disclosure. With regard to description of drawings, similar components may be assigned with similar reference numerals.

As used herein, singular forms may include plural forms as well unless the context clearly indicates otherwise. In the disclosure disclosed herein, the expressions "A or B," "at least one of A or/and B," "A, B, or C" or "one or more of A, B, or/and C," and the like used herein may include any and all combinations of one or more of the associated listed items. The expressions "a first," "a second," "the first," or "the second," used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

According to the situation, the expression "adapted to or configured to" used herein may be interchangeably used as, for example, the expression "suitable for," "having the capacity to," "changed to," "made to," "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a CPU or an AP) which performs corresponding operations by executing one or more software programs which are stored in a memory device (e.g., the memory 130).

The term "module" used in this disclosure may include a unit composed of hardware, software and firmware and may be interchangeably used with the terms "unit," "logic," "logical block," "part" and "circuit." The "module" may be an integrated part or may be a minimum unit for performing one or more functions or a part thereof. The "module" may be implemented mechanically or electronically and may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in computer-readable storage media (e.g., the memory 130) in the form of a program module. The instruction, when executed by a processor (e.g., the processor 120), may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. Also, the one or more instructions may contain a code made by a compiler or a code executable by an interpreter.

Each component (e.g., the module or the program module) according to various embodiments may include at least one of the above components, and a portion of the above sub-components may be omitted, or additional other sub-components may be further included. Alternatively or additionally, some components (e.g., the module or the program module) may be integrated in one component and may perform the same or similar functions performed by each corresponding components prior to the integration. Operations performed by a module, a program module, or other components according to various embodiments of the disclosure may be executed sequentially, in parallel, repeatedly, or in a heuristic method. Also, at least some operations may be executed in different sequences, omitted, or other operations may be added.

According to the above-described embodiments of the disclosure, in an antenna module including a rigid PCB and an FPCB that are coupled, the antenna module may be disposed at a location where an antenna signal radiation characteristic is capable of being optimized, by disposing some antennas at the FPCB.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
   a housing:
   a first plate positioned on a front surface of the housing;
   a second plate positioned on a back surface of the housing; and
   an antenna module disposed between the first plate and the second plate,
   wherein the antenna module includes:
      a first printed circuit board (PCB);
      a second PCB having a material different from that of the first PCB, at least a portion of the second PCB being coupled to one surface of the first PCB in an overlapping region;
      a first conductive line included in the first PCB;
      a second conductive line included in the second PCB;
      a first conductive pattern disposed at the second PCB and connected with the second conductive line;
      a first connection member configured to connect the first conductive line and the second conductive line, in the overlapping region; and
      a second connection member configured to couple the first PCB and the second PCB, in the overlapping region,
   wherein the first PCB comprises a rigid PCB, and
   wherein the second PCB comprises a flexible PCB.

2. The electronic device of claim 1, wherein the antenna module further includes:
   a wireless communication circuit disposed on an opposite surface of the first PCB, and configured to process a signal in a specific frequency band, and
   wherein the first conductive line is connected with the wireless communication circuit.

3. The electronic device of claim 2, wherein the second PCB includes at least one additional conductive line disposed in a same layer as the second conductive line, and
   wherein the additional conductive line is connected with a ground region of the first PCB through the second connection member and forms an electrical shield associated with the second conductive line.

4. The electronic device of claim 2, wherein the second PCB includes at least one conductor disposed in a conductive layer different from that of the second conductive line, and
   wherein the conductor is connected with a ground region of the first PCB through the second connection member and forms an electrical shield associated with the second conductive line.

5. The electronic device of claim 2, wherein the second PCB includes:
- a first conductive layer disposed under the second conductive line;
- a second conductive layer including the second conductive line;
- a third conductive layer disposed over the second conductive line;
- a first insulating layer disposed between the first conductive layer and the second conductive layer; and
- a second insulating layer disposed between the second conductive layer and the third conductive layer, and
- wherein the first conductive layer or the third conductive layer is connected with a ground region of the first PCB through the second connection member and forms an electrical shield associated with the second conductive line.

6. The electronic device of claim 5, wherein the second PCB further includes a plurality of guide vias connecting the first conductive layer and the third conductive layer, and
- wherein the plurality of guide vias are arranged on opposite sides of the second conductive line with specific distances.

7. The electronic device of claim 2, wherein the first PCB includes:
- a third conductive line connected with the wireless communication circuit; and
- a second conductive pattern connected with the third conductive line, and
- wherein the second conductive pattern constitutes an antenna different in kind from that of the first conductive pattern.

8. The electronic device of claim 7, wherein the second conductive pattern is disposed to face a first direction, and
- wherein the first conductive pattern is disposed to face a direction different from the first direction.

9. The electronic device of claim 1, wherein the first PCB further includes:
- a first signal pad connected with the first conductive line; and
- at least one first guide pad disposed to surround a periphery of the first signal pad,
- wherein the second PCB further includes:
  - a second signal pad connected with the second conductive line; and
  - at least one second guide pad disposed to surround a periphery of the second signal pad,
- wherein the first signal pad and the second signal pad are coupled through the first connection member, and
- wherein the first guide pad and the second guide pad are coupled through the second connection member.

10. The electronic device of claim 9, wherein the first PCB further includes at least one first dummy pad disposed in the overlapping region,
- wherein the second PCB further includes at least one second dummy pad disposed in the overlapping region with the specific distance, and
- wherein the first dummy pad and the second dummy pad are coupled through a third connection member.

11. The electronic device of claim 10, wherein the first guide pad is connected with a ground region of the first PCB, and
- wherein the first dummy pad is not connected with the ground region.

12. An electronic device, comprising:
- a housing including a first plate, a second plate facing away from the first plate, and a side member surrounding a space between the first plate and the second plate; and
- an antenna module disposed within the housing,
- wherein the antenna module includes:
  - a first printed circuit board (PCB);
  - a second PCB having a material different from that of the first PCB, at least a portion of the second PCB being coupled to one surface of the first PCB in a first overlapping region; and
  - a third PCB, at least a portion of which is coupled to the one surface of the first PCB in a second overlapping region,
- wherein the first PCB includes:
  - a first conductive line connected with the second PCB; and
  - a second conductive line connected with the third PCB,
- wherein a first conductive pattern disposed at the second PCB is connected with the first conductive line through a first connection member disposed in the first overlapping region,
- wherein a second conductive pattern disposed at the third PCB is connected with the second conductive line through a second connection member disposed in the second overlapping region,
- wherein the first PCB and the second PCB are coupled by at least one third connection member disposed to surround a periphery of the first connection member,
- wherein the first PCB and the third PCB are coupled by at least one fourth connection member disposed in the second overlapping region,
- wherein the first PCB comprises a rigid PCB, and
- wherein the second PCB comprises a flexible PCB.

13. The electronic device of claim 12, wherein the first PCB further includes at least one first dummy pad disposed in the first overlapping region with a specific distance,
- wherein the second PCB further includes at least one second dummy pad disposed in the first overlapping region with the specific distance, and
- wherein the first dummy pad and the second dummy pad are coupled through a fifth connection member.

14. The electronic device of claim 13, wherein the third connection member is connected with a ground region of the first PCB, and
- wherein the fourth connection member or the fifth connection member is not connected with the ground region.

15. The electronic device of claim 12, wherein the third PCB is formed of the same material as the first PCB or the second PCB.

* * * * *